(12) United States Patent
Milman

(10) Patent No.: US 8,928,975 B2
(45) Date of Patent: Jan. 6, 2015

(54) COMPACT MAGNIFYING OPTICAL SYSTEM WITH WIDE FIELD OF VIEW

(75) Inventor: Uri Milman, Migdal Haemek (IL)

(73) Assignees: Uri Milman, Migdal Ha'emek (IL); Emanuel Safra, Timrat (IL); Jacob Kaufmann, Tel Aviv (IL); Yoel Arieli, Jerusalem (IL)

( * ) Notice: Subject to any disclaimer, the term of this patent is extended or adjusted under 35 U.S.C. 154(b) by 0 days.

(21) Appl. No.: 13/697,362

(22) PCT Filed: May 12, 2011

(86) PCT No.: PCT/IB2011/052091
§ 371 (c)(1),
(2), (4) Date: Nov. 11, 2012

(87) PCT Pub. No.: WO2011/141887
PCT Pub. Date: Nov. 17, 2011

(65) Prior Publication Data
US 2013/0279002 A1 Oct. 24, 2013

Related U.S. Application Data

(63) Continuation-in-part of application No. PCT/IB2010/052135, filed on May 13, 2010.

(60) Provisional application No. 61/408,675, filed on Nov. 1, 2010.

(51) Int. Cl.
*G02B 23/00* (2006.01)
*G02B 9/12* (2006.01)
*G02B 17/08* (2006.01)
*G02B 27/00* (2006.01)
*G06F 17/50* (2006.01)

(52) U.S. Cl.
CPC .............. *G02B 9/12* (2013.01); *G02B 17/0808* (2013.01); *G02B 23/00* (2013.01); *G02B 27/0012* (2013.01); *G06F 17/50* (2013.01)
USPC ........................... 359/407; 359/399; 359/362

(58) Field of Classification Search
CPC ............ G02B 23/18; G02B 7/06; G02B 7/04; G02B 7/09; G02B 7/12; G02B 9/12; G02B 9/14
USPC .................................................. 359/400–435
See application file for complete search history.

(56) References Cited

U.S. PATENT DOCUMENTS 1,395,822 A 11/1921 Hastings
1,934,863 A 11/1933 Kuhl
(Continued)

*Primary Examiner* — Ricky Mack
*Assistant Examiner* — William Alexander
(74) *Attorney, Agent, or Firm* — Mark M. Friedman

(57) ABSTRACT

An optical device includes an objective, an eyepiece and a power corrector, each of which includes one or more lenses, and each of which has a respective focal length. The input focal length of the device is defined jointly by the focal lengths of the objective and the power corrector. The magnification of the device is the ratio of the input focal length to the eyepiece focal length. The combined aberration of the eyepiece and the power corrector is less than the characteristic aberration of the eyepiece. The objective, the eyepiece and the power corrector together define an apparent field of view of at least 75 degrees and an exit pupil. The eyepiece lens diameter(s) is/are no greater than twelve times the pupil diameter and three times the eyepiece focal length.

22 Claims, 46 Drawing Sheets

(56) References Cited

U.S. PATENT DOCUMENTS

| | | |
|---|---|---|
| 4,215,924 A | 8/1980 | Matsumoto |
| 5,576,888 A * | 11/1996 | Betensky ............... 359/676 |
| 5,598,296 A | 1/1997 | Imaizumi |
| 6,249,380 B1 | 6/2001 | Yano |
| 2001/0006431 A1 * | 7/2001 | Sugawara ............... 359/415 |
| 2001/0055161 A1 | 12/2001 | Ishii et al. |
| 2002/0176175 A1 | 11/2002 | Kamo |
| 2003/0210472 A1 * | 11/2003 | Morooka et al. ............ 359/692 |
| 2005/0068616 A1 | 3/2005 | Hosoya |
| 2007/0035825 A1 * | 2/2007 | Jojiki ............... 359/407 |
| 2007/0159685 A1 | 7/2007 | Wagner et al. |
| 2009/0201585 A1 * | 8/2009 | Yasui ............... 359/558 |

* cited by examiner

| Magnification | Field of view[deg.] | Apparent F.O.V.[deg.] | Pupil Diameter | Eye-relief | Vignetting Average |
|---|---|---|---|---|---|
| X7 | 12 | 84 | 7 mm | 14 | 0.9 |

| magnification | F.O.V. current | F.O.V. With the new concept |
|---|---|---|
| X7 | 7° | 14° |
| X8 | 6.5° | 12.5° |
| X10 | 5.5° | 12° |
| X15 | 4° | 6° |
| X20 | 3° | 5.3° |

| Comment | Surf | Type | Radius | Thickness | Glass | Diameter |
|---|---|---|---|---|---|---|
| 7X Magnification | OBJ | STANDARD | Infinity | Infinity | | 0 |
| Eyepiece Pupil | STO | STANDARD | Infinity | 12 | | 5 |
| lens 1 | 2 | STANDARD | -17.49 | 8 | N-LASF46A | 24 |
| lens 1 | 3 | STANDARD | -17.84 | 3.799968 | | 31.6 |
| lens 2 | 4 | STANDARD | -63.83 | 5.3 | N-LAF34 | 42 |
| lens 2 | 5 | STANDARD | -32.78 | 0.800004 | | 43 |
| lens 3 | 6 | STANDARD | 72.7 | 6 | N-LASF43 | 49 |
| lens 3 | 7 | STANDARD | -315.9 | 0.8 | | 49 |
| lens 4 | 8 | STANDARD | 35.9 | 7.9 | N-LASF46A | 47.2 |
| lens 4 | 9 | STANDARD | 155.72 | 3.8 | | 46 |
| lens 5 | 10 | STANDARD | -218.6003 | 6 | N-SF57 | 44 |
| lens 5 | 11 | STANDARD | 42.25 | 5.9 | | 38 |
| inter. image | 12 | STANDARD | Infinity | 22.12 | | 37.68164 |
| Mirror 1 | 13 | TILTSURF | - | 19 | | 36.35334 |
| Lens 6 | 14 | STANDARD | 21.94 | 8 | N-SF57 | 35 |
| Lens 6 | 15 | STANDARD | 26.35 | 8.5 | | 32 |
| Lens 7 | 16 | STANDARD | -69.84 | 2.5 | N-KF9 | 35 |
| Lens 7 | 17 | STANDARD | 21.76 | 16 | | 30 |
| Lens 8 | 18 | STANDARD | 125.9103 | 8 | N-SSK8 | 35 |
| Lens 8 | 19 | STANDARD | -40.3 | 17 | | 35 |
| Mirror 2 | 20 | TILTSURF | - | 30 | | 32.40775 |
| Mirror 3 | 21 | TILTSURF | - | 38 | | 32.40428 |
| Mirror 4 | 22 | TILTSURF | - | 24 | | 35.15667 |
| Lens 9 | 23 | STANDARD | -209.1 | 3.4 | N-LASF46A | 37 |
| Lens 9 | 24 | STANDARD | 105.685 | 6.4 | N-BK10 | 37 |
| Lens 9 | 25 | STANDARD | -47.8 | 50 | | 37 |
| to object | IMA | STANDARD | Infinity | | | 49.14016 |

Fig. 21

| Comment | Surf | Type | Radius | Thickness | Glass | Diameter |
|---|---|---|---|---|---|---|
| magnification x8 | OBJ | STANDARD | Infinity | Infinity | | 0 |
| Pupil eyepiece | STO | STANDARD | Infinity | 18.5 | | 4.2 |
| lens 1 | 2 | STANDARD | -69.99992 | 5.785818 | N-LASF43 | 35 |
| lens 1 | 3 | STANDARD | -25.49499 | 0.1995359 | | 36.4 |
| lens 2 | 4 | STANDARD | 76.25588 | 7.501258 | N-LAK9 | 44 |
| lens 2 | 5 | STANDARD | -77.09756 | 0.2052875 | | 44 |
| lens 3 | 6 | STANDARD | 31.89236 | 8.463713 | N-SF1 | 42 |
| lens 3 | 7 | STANDARD | 164.8132 | 5.471324 | | 39 |
| lens 4 | 8 | STANDARD | -54.13793 | 2.999905 | N-BASF2 | 38.2 |
| lens 4 | 9 | STANDARD | 554.7627 | 3.5 | | 35.4 |
| inter. image | 10 | STANDARD | Infinity | 8.887695 | | 35.82009 |
| lens 5 | 11 | STANDARD | 17.49813 | 9.501238 | N-SF57 | 30 |
| lens 5 | 12 | STANDARD | 13.83401 | 13.2094 | | 22 |
| lens 6 | 13 | STANDARD | -11.59396 | 2.499336 | N-LAF7 | 21.88 |
| lens 6 | 14 | STANDARD | -9889.526 | 4.382996 | | 30 |
| lens 7 | 15 | STANDARD | -31.02002 | 5.024676 | N-SF5 | 26.6 |
| lens 7 | 16 | STANDARD | -21.31064 | 0.6995849 | | 30 |
| lens 8 | 17 | STANDARD | -117.6768 | 9.499823 | N-BASF64 | 36 |
| lens 8 | 18 | STANDARD | -24.92232 | 32 | | 36 |
| mirror 1 | 19 | TILTSURF | - | 26 | | 34.09067 |
| mirror 2 | 20 | TILTSURF | - | 30 | | 30.24286 |
| mirror 3 | 21 | TILTSURF | - | 32 | | 30.52115 |
| mirror 4 | 22 | TILTSURF | - | 20 | | 34.23078 |
| lens 9 | 23 | STANDARD | -341.8023 | 3.249738 | N-SF6 | 36 |
| lens 10 | 24 | STANDARD | 133.352 | 5.307852 | N-BAK2 | 36 |
| lens 10 | 25 | STANDARD | -71.59938 | 10 | | 36 |
| to object | IMA | STANDARD | Infinity | | | 40.67179 |

Fig. 25

| Comment | Surf | Type | Radius | Thickness | Glass | Diameter |
|---|---|---|---|---|---|---|
| X8 Compact | OBJ | STANDARD | Infinity | Infinity | | 0 |
| Pupil eyepiece | STO | STANDARD | Infinity | 9.25 | | 2.1 |
| lens 1 | 2 | STANDARD | -34.99996 | 2.892909 | N-LASF43 | 17.5 |
| lens 1 | 3 | STANDARD | -12.74749 | 0.099768 | | 18.2 |
| lens 2 | 4 | STANDARD | 38.12794 | 3.750629 | N-LAK9 | 22 |
| lens 2 | 5 | STANDARD | -38.54878 | 0.1026437 | | 22 |
| lens 3 | 6 | STANDARD | 15.94616 | 4.231857 | N-SF1 | 21 |
| lens 3 | 7 | STANDARD | 82.40658 | 2.735662 | | 19.5 |
| lens 4 | 8 | STANDARD | -27.06896 | 1.499953 | N-BASF2 | 19.1 |
| lens 4 | 9 | STANDARD | 277.3813 | 1.75 | | 17.7 |
| inter. image | 10 | STANDARD | Infinity | 4.443847 | | 17.91005 |
| lens 5 | 11 | STANDARD | 8.749067 | 4.750619 | N-SF57 | 15 |
| lens 5 | 12 | STANDARD | 6.917004 | 6.604702 | | 11 |
| lens 6 | 13 | STANDARD | -5.796981 | 1.249668 | N-LAF7 | 10.94 |
| lens 6 | 14 | STANDARD | -4944.763 | 2.191498 | | 15 |
| lens 7 | 15 | STANDARD | -15.51001 | 2.512338 | N-SF5 | 13.3 |
| lens 7 | 16 | STANDARD | -10.65532 | 0.3497924 | | 15 |
| lens 8 | 17 | STANDARD | -58.83839 | 4.749911 | N-BASF64 | 18 |
| lens 8 | 18 | STANDARD | -12.46116 | 16 | | 18 |
| mirror 1 | 19 | TILTSURF | - | 13 | | 17.04534 |
| mirror 2 | 20 | TILTSURF | - | 15 | | 15.12143 |
| mirror 3 | 21 | TILTSURF | - | 16 | | 15.26057 |
| mirror 4 | 22 | TILTSURF | - | 10 | | 17.11539 |
| lens 9 | 23 | STANDARD | -170.9012 | 1.624869 | N-SF6 | 18 |
| lens 10 | 24 | STANDARD | 66.67602 | 2.653926 | N-BAK2 | 18 |

Fig. 29

| Comment | Surf | Type | Radius | Thickness | Glass | Diameter |
|---|---|---|---|---|---|---|
| Common eyepiece X7 | OBJ | STANDARD | Infinity | Infinity | | 0 |
| pupil eyepiece | STO | STANDARD | Infinity | 12 | | 5 |
| lens 1 | 2 | STANDARD | -17.49 | 8 | N-LASF46A | 24.04729 |
| lens 1 | 3 | STANDARD | -17.84 | 3.799968 | | 31.58459 |
| lens 2 | 4 | STANDARD | -63.83 | 5.3 | N-LAF34 | 41.66557 |
| lens 2 | 5 | STANDARD | -32.78 | 0.8000039 | | 42.90733 |
| lens 3 | 6 | STANDARD | 72.7 | 6 | N-LASF43 | 48.99769 |
| lens 3 | 7 | STANDARD | -315.9 | 0.8 | | 48.9494 |
| lens 4 | 8 | STANDARD | 35.9 | 7.9 | N-LASF46A | 47.09996 |
| lens 4 | 9 | STANDARD | 155.72 | 3.8 | | 45.89606 |
| lens 5 | 10 | STANDARD | -218.6003 | 6 | N-SF57 | 44.1637 |
| lens 5 | 11 | STANDARD | 42.25 | 5.9 | | 38.11309 |
| inter. image | 12 | STANDARD | Infinity | 22.12 | | 37.68164 |
| mirror 1 | 13 | TILTSURF | - | 19 | | 36.35334 |
| lens 6 | 14 | STANDARD | 22.23003 | 7.9 | N-LASF46A | 36.42589 |
| lens 6 | 15 | STANDARD | 25.12251 | 7.8 | | 31.79547 |
| lens 7 | 16 | STANDARD | -88.93181 | 2.5 | N-LAK7 | 30.69576 |
| lens 7 | 17 | STANDARD | 24.79942 | 16.4095 | | 28.92944 |
| lens 8 | 18 | STANDARD | 198.0765 | 8 | N-LAF2 | 35.49002 |
| lens 8 | 19 | STANDARD | -42.26996 | 17 | | 36.25359 |
| mirror 2 | 20 | TILTSURF | - | 30 | | 33.98776 |
| mirror 3 | 21 | TILTSURF | - | 38 | | 33.99006 |
| mirror 4 | 22 | TILTSURF | - | 24 | | 34.96936 |
| lens 9 | 23 | STANDARD | -202.6644 | 3.398695 | N-SF57 | 35.54788 |
| lens 9 | 24 | STANDARD | 156.3287 | 1.543228 | | 36.16762 |
| lens 10 | 25 | STANDARD | 333.5311 | 5.064828 | N-BK10 | 36.62095 |
| lens 10 | 26 | STANDARD | -49.74047 | 50 | | 36.9756 |
| to object | IMA | STANDARD | Infinity | | | 45.27184 |

Fig. 34

| Comment | Surf | Type | Radius | Thickness | Glass | Diameter |
|---|---|---|---|---|---|---|
| Common Eyepiece X8 | OBJ | STANDARD | Infinity | Infinity | | 0 |
| Eyepiece Pupil | STO | STANDARD | Infinity | 12 | | 5 |
| lens 1 | 2 | STANDARD | -17.49 | 8 | N-LASF46A | 24.04729 |
| lens 1 | 3 | STANDARD | -17.84 | 3.799968 | | 31.58459 |
| lens 2 | 4 | STANDARD | -63.83 | 5.3 | N-LAF34 | 41.68557 |
| lens 2 | 5 | STANDARD | -32.78 | 0.8000C39 | | 42.90733 |
| lens 3 | 6 | STANDARD | 72.7 | 6 | N-LASF43 | 48.99769 |
| lens 3 | 7 | STANDARD | -315.9 | 0.8 | | 48.9494 |
| lens 4 | 8 | STANDARD | 35.9 | 7.9 | N-LASF46A | 47.09996 |
| lens 4 | 9 | STANDARD | 155.72 | 3.8 | | 45.89606 |
| lens 5 | 10 | STANDARD | -218.69 | 6 | N-SF57 | 44.16306 |
| lens 5 | 11 | STANDARD | 42.25 | 5.9 | | 38.11226 |
| inter. image | 12 | STANDARD | Infinity | 22.12 | | 37.68056 |
| mirror 1 | 13 | TILTSURF | - | 19 | | 36.34914 |
| lens 6 | 14 | STANDARD | 21.85355 | 6.412072 | N-SF57HT | 36.42243 |
| lens 6 | 15 | STANDARD | 30.14593 | 13.60981 | | 33.85373 |
| lens 7 | 16 | STANDARD | -47.28345 | 2.489752 | N-KF9 | 28.02327 |
| lens 7 | 17 | STANDARD | 20.87821 | 15.09032 | | 25.80178 |
| lens 8 | 18 | STANDARD | 92.23856 | 5.020522 | N-SSK8 | 30.88824 |
| lens 8 | 19 | STANDARD | -46.16648 | 17 | | 31.28409 |
| mirror 2 | 20 | TILTSURF | - | 33 | | 32.39698 |
| mirror 3 | 21 | TILTSURF | - | 35 | | 34.42698 |
| mirror 4 | 22 | TILTSURF | - | 24 | | 39.53417 |
| lens 9 | 23 | STANDARD | -330.9696 | 6.979405 | N-LASF46A | 40.18024 |
| lens 9 | 24 | STANDARD | 112.1145 | 8.000233 | N-BK10 | 41.54519 |
| lens 10 | 25 | STANDARD | -53.3 | 50 | | 42.24418 |
| to object | IMA | STANDARD | Infinity | | | 52.94595 |

Fig. 35

| Comment | Surf | Type | Radius | Thickness | Glass | Diameter |
|---|---|---|---|---|---|---|
| X17 magnification | OBJ | STANDARD | Infinity | Infinity | | 0 |
| Eyepiece Pupil | STO | STANDARD | Infinity | 15.97163 | | 5 |
| lens 1 | 2 | STANDARD | -21.39624 | 6.258029 | N-LASF46A | 28.84475 |
| lens 1 | 3 | STANDARD | -17.69916 | 0.6607713 | | 32.57786 |
| lens 2 | 4 | STANDARD | 114.5475 | 6.428438 | N-LAF33 | 42.86415 |
| lens 2 | 5 | STANDARD | -64.10129 | 0.6444476 | | 43.17672 |
| lens 3 | 6 | STANDARD | 31.36319 | 7.512504 | N-LASF44 | 42.89797 |
| lens 3 | 7 | STANDARD | 143.5296 | 3.986189 | | 42.02151 |
| lens 4 | 8 | STANDARD | -126.357 | 4.11472 | N-LASF44 | 40.83678 |
| lens 4 | 9 | STANDARD | 1159.856 | 3.456518 | | 38.49129 |
| lens 5 | 10 | STANDARD | -73.21081 | 2.719656 | N-BAF51 | 37.71815 |
| lens 5 | 11 | STANDARD | 123.2404 | 4.873913 | | 36.4607 |
| Inter. Image | 12 | STANDARD | Infinity | 49.56522 | | 35.91818 |
| Lens 6 | 13 | STANDARD | 31.99374 | 8.263998 | N-LAK14 | 39.19861 |
| Lens 6 | 14 | STANDARD | 27.99307 | 0.1993706 | | 35.14971 |
| Lens 7 | 15 | STANDARD | 26.13982 | 8.260244 | N-SF57HT | 35.222 |
| Lens 7 | 16 | STANDARD | 53.5142 | 2.442682 | | 32.31599 |
| Lens 8 | 17 | STANDARD | 85.06079 | 6.40217 | N-FK5 | 31.24914 |
| Lens 8 | 18 | STANDARD | 17.89322 | 184.2641 | | 25.53256 |
| Lens 9 | 19 | STANDARD | -230.687 | 12.72371 | N-PSK53A | 87.52638 |
| Lens 9 | 20 | STANDARD | -101.0204 | 16.52247 | | 89.98031 |
| Lens 10 | 21 | STANDARD | -780.9581 | 16.2475 | N-KZFS8 | 90.48093 |
| Lens 10 | 22 | STANDARD | 153.4261 | 15.0558 | N-FK5 | 91.91344 |
| Lens 11 | 23 | STANDARD | -162.5675 | 24.78261 | | 92.2168 |
| to object | IMA | STANDARD | Infinity | | | 89.50582 |

Fig. 38

| Comment | Surf | Type | Radius | Thickness | Glass | Diameter |
|---|---|---|---|---|---|---|
| X20 magnification | OBJ | STANDARD | Infinity | Infinity | | 0 |
| Eyepiece Pupil | STO | STANDARD | Infinity | 19.47368 | | 5 |
| lens 1 | 2 | STANDARD | -69.99977 | 6.3 | N-LASF43 | 38.84792 |
| lens 1 | 3 | STANDARD | -25.69131 | 0.2631579 | | 39.58798 |
| lens 2 | 4 | STANDARD | 76.43554 | 6.317306 | N-LAK9 | 46.18407 |
| lens 2 | 5 | STANDARD | -114.6506 | 0.3680581 | | 46.24418 |
| lens 3 | 6 | STANDARD | 31.64273 | 9.47477 | N-SF1 | 44.51799 |
| lens 3 | 7 | STANDARD | 114.0475 | 5.755275 | | 42.117 |
| lens 4 | 8 | STANDARD | -64.74886 | 3.157895 | N-BASF2 | 40.98961 |
| lens 4 | 9 | STANDARD | 94.09958 | 3.684211 | | 38.58145 |
| inter. image | 10 | STANDARD | Infinity | 11.1973 | | 38.11794 |
| Lens 5 | 11 | STANDARD | 19.47963 | 10.00214 | N-SF57 | 35.67574 |
| Lens 5 | 12 | STANDARD | 15.72202 | 16.53995 | | 27.32982 |
| Lens 6 | 13 | STANDARD | -15.01225 | 10 | N-LAF7 | 25.59902 |
| Lens 6 | 14 | STANDARD | -21.58698 | 5.756257 | | 32.73266 |
| Lens 7 | 15 | STANDARD | -16.95766 | 10.00043 | N-SF5 | 32.69716 |
| Lens 7 | 16 | STANDARD | -22.94634 | 9.933326 | | 42.26821 |
| Lens 8 | 17 | STANDARD | -77.15857 | 9.999994 | N-BASF64 | 46.09259 |
| Lens 8 | 18 | STANDARD | -51.2625 | 24 | | 48.84602 |
| | 19 | COORDBRK | - | 0 | | - |
| mirror 1 | 20 | STANDARD | Infinity | 0 | MIRROR | 49.09982 |
| | 21 | COORDBRK | - | -56.26316 | | - |
| | 22 | COORDBRK | - | 0 | | - |
| mirror 2 | 23 | STANDARD | Infinity | 0 | MIRROR | 59.68948 |
| | 24 | COORDBRK | - | 61.78947 | | - |
| | 25 | COORDBRK | - | 0 | | - |
| mirror 3 | 26 | STANDARD | Infinity | 0 | MIRROR | 73.44858 |
| | 27 | COORDBRK | - | -61.26316 | | - |
| | 28 | COORDBRK | - | 0 | | - |
| mirror 4 | 29 | STANDARD | Infinity | 275 | MIRROR | 87.09048 |
| | 30 | COORDBRK | - | 0 | | - |
| Lens 9 | 31 | STANDARD | 4316.482 | 15.21568 | N-SF6 | 99.35349 |
| Lens 9 | 32 | STANDARD | 398.5771 | 9.78448 | N-BAK2 | 101.5127 |
| Lens 10 | 33 | STANDARD | -273.0787 | 10.52632 | | 101.9055 |
| to object | IMA | STANDARD | Infinity | | | 101.1654 |

Fig. 41

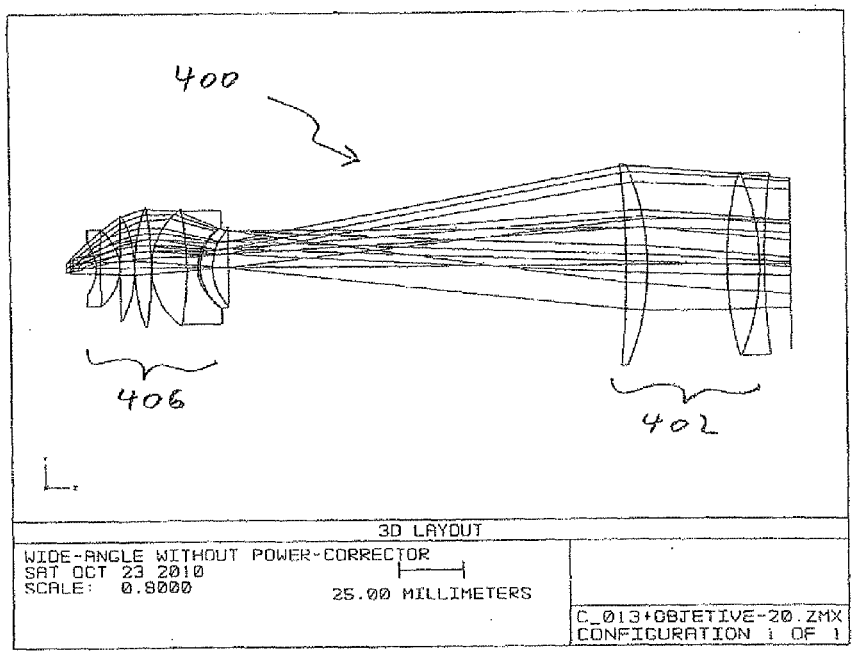

Fig. 43

| Surf | Comment | Type | Radius | Thickness | Glass | Diameter |
|---|---|---|---|---|---|---|
| OBJ | | STANDARD | Infinity | Infinity | | 0 |
| STO | Exit pupil | STANDARD | Infinity | 11.22352 | | 4.2 |
| 2 | Eyepiece lens 1 | STANDARD | -15.9638 | 1.471002 | SF12 | 20.16894 |
| 3 | Eyepiece lens 2 | STANDARD | 343.0037 | 7.166386 | SK16 | 28.65183 |
| 4 | Eyepiece lens 2 | STANDARD | -18.3646 | 0.1 | | 29.18207 |
| 5 | Eyepiece lens 3 | STANDARD | 1020.46 | 5.542679 | SK16 | 39.27781 |
| 6 | Eyepiece lens 3 | STANDARD | -42.42625 | 0.1 | | 39.78866 |
| 7 | Eyepiece lens 4 | STANDARD | 65.24167 | 6.441244 | SK16 | 44.99595 |
| 8 | Eyepiece lens 6 | STANDARD | -125.3955 | 0.08242904 | | 45.03692 |
| 9 | Eyepiece lens 5 | STANDARD | 27.17794 | 13.26808 | SK16 | 43.59262 |
| 10 | Eyepiece lens 6 | STANDARD | -118.7091 | 4.314647 | SF12 | 42.57508 |
| 11 | Eyepiece lens 6 | STANDARD | 17.23902 | 0.8302175 | | 30.22803 |
| 12 | Eyepiece lens 7 | STANDARD | 17.74849 | 4.768924 | SF12 | 30.44236 |
| 13 | Eyepiece lens 7 | STANDARD | 20.49193 | 5.827407 | | 28.59791 |
| 14 | Intermediate image | STANDARD | Infinity | 151.5005 | | 28.59794 |
| 15 | Objective lens 8 | STANDARD | -323.258 | 7.926562 | N-LASF31A | 74.83004 |
| 16 | Objective lens 8 | STANDARD | -96.83467 | 30.21642 | | 75.60162 |
| 17 | Objective lens 9 | STANDARD | 123.8577 | 12.32034 | N-K5 | 68.80706 |
| 18 | Objective lens 10 | STANDARD | -89.16053 | 1.912899 | P-SF8 | 68.52388 |
| 19 | Objective lens 10 | STANDARD | 252.4839 | 10 | | 66.56563 |
| IMA | to object | STANDARD | Infinity | | | 64.54548 |

Fig. 44

| Surf | Comment | Type | Radius | Thickness | Glass | Diameter |
|---|---|---|---|---|---|---|
| OBJ | | STANDARD | Infinity | Infinity | | 0 |
| STO | Exit Pupil | STANDARD | Infinity | 18.5 | | 4.2 |
| 2 | Eyepiece lens 1 | STANDARD | 69.99975 | 5.807029 | N-LASF43 | 33 |
| 3 | Eyepiece lens 1 | STANDARD | -25.44476 | 0.2402004 | | 35 |
| 4 | Eyepiece lens 2 | STANDARD | 79.79214 | 6.887695 | N-LAK9 | 43 |
| 5 | Eyepiece lens 2 | STANDARD | -79.79214 | 0.2499943 | | 43 |
| 6 | Eyepiece lens 3 | STANDARD | 27.59204 | 7.534562 | N-SF1 | 42.09881 |
| 7 | Eyepiece lens 3 | STANDARD | 65.36421 | 7.185632 | | 40.5138 |
| 8 | Eyepiece lens 4 | STANDARD | -81.64127 | 3 | N-BASF2 | 38.04538 |
| 9 | Eyepiece lens 4 | STANDARD | 81.64127 | 3.5 | | 35.50076 |
| 10 | intermediate image | STANDARD | Infinity | 11.72949 | | 34.88509 |
| 11 | PC lens 5 | STANDARD | 17.6026 | 9.235033 | N-SF57 | 29 |
| 12 | PC lens 5 | STANDARD | 13.83732 | 13.52949 | | 23 |
| 13 | PC lens 6 | STANDARD | -12.99517 | 2.48984 | N-LAF7 | 22.616 |
| 14 | PC lens 6 | STANDARD | -91.26436 | 5.492719 | | 29 |
| 15 | PC lens 7 | STANDARD | -23.0725 | 4.277042 | N-SF5 | 26 |
| 16 | PC lens 7 | STANDARD | -18.97247 | 0.6944073 | | 29 |
| 17 | PC lens 8 | STANDARD | -457.7323 | 7.284854 | N-BASF64 | 35.774 |
| 18 | PC lens 8 | STANDARD | -30.42477 | 143 | | 36.67637 |
| 19 | Objective lens 9 | STANDARD | -381.2483 | 4.796475 | N-SF6 | 38.49232 |
| 20 | Objective lens 10 | STANDARD | 133.6307 | 8.012712 | N-BAK2 | 39.79242 |
| 21 | Objective lens 10 | STANDARD | -75.35432 | 10 | | 41.15424 |
| IMA | To object | STANDARD | Infinity | | | 41.97317 |

Fig. 50

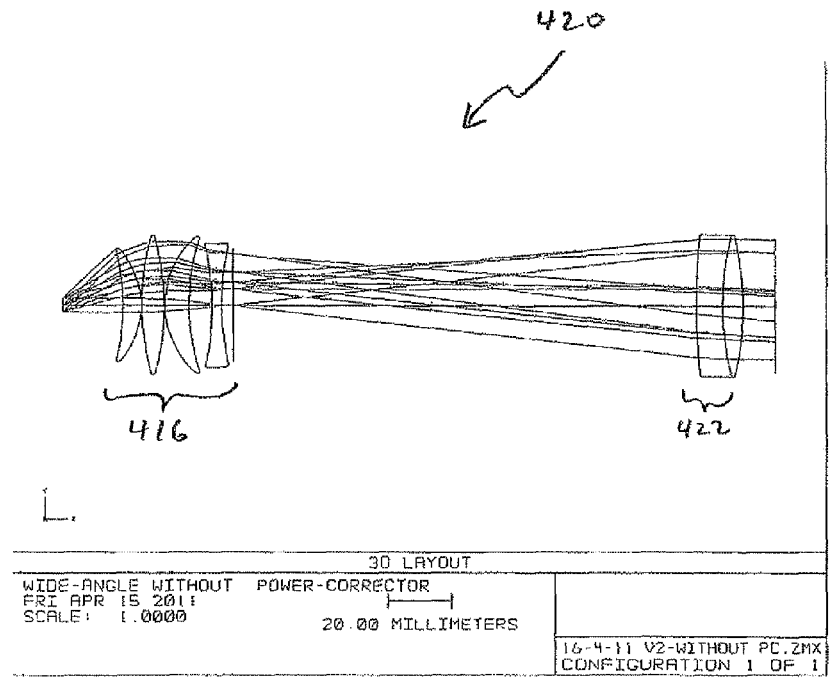

FIGURE 55

| Surf | Comment | Type | Radius | Thickness | Glass | Diameter |
|---|---|---|---|---|---|---|
| OBJ | | STANDARD | Infinity | Infinity | | 0 |
| STO | Exit Pupil | STANDARD | Infinity | 18.5 | | 4.2 |
| 2 | Eyepiece lens 1 | STANDARD | -69.99975 | 5.807029 | N-LASF43 | 33 |
| 3 | Eyepiece lens 1 | STANDARD | -25.44476 | 0.2402004 | | 35 |
| 4 | Eyepiece lens 2 | STANDARD | 79.79214 | 6.887695 | N-LAK9 | 43 |
| 5 | Eyepiece lens 2 | STANDARD | -79.79214 | 0.2499943 | | 43 |
| 6 | Eyepiece lens 3 | STANDARD | 27.59204 | 7.534562 | N-SF1 | 42.09881 |
| 7 | Eyepiece lens 3 | STANDARD | 65.36421 | 7.185632 | | 40.5138 |
| 8 | Eyepiece lens 4 | STANDARD | -81.64127 | 3 | N-BASF2 | 38.04538 |
| 9 | Eyepiece lens 4 | STANDARD | 81.64127 | 3.5 | | 35.50076 |
| 10 | intermediate image | STANDARD | Infinity | 145.0201 | | 34.88509 |
| 11 | Objective lens 9 | STANDARD | 224.8931 | 7.999845 | N-SF6 | 44 |
| 12 | Objective lens 10 | STANDARD | 88.00843 | 6.360998 | N-BAK2 | 44 |
| 13 | Objective lens 10 | STANDARD | -88.87561 | 10 | | 44 |
| IMA | To object | STANDARD | Infinity | | | 41.65484 |

FIGURE 56

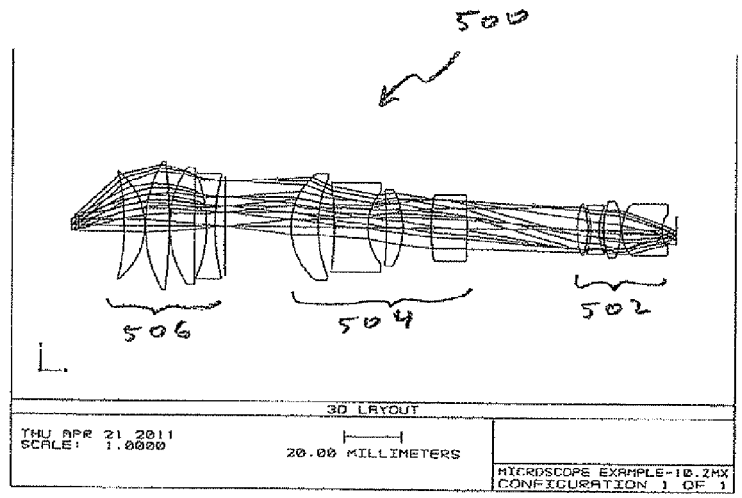

FIGURE 61

| Surf | Comment | Type | Radius | Thickness | Glass | Diameter |
|---|---|---|---|---|---|---|
| OBJ | | STANDARD | Infinity | Infinity | | 0 |
| STO | Exit pupil | STANDARD | Infinity | 18.5 | | 4.2 |
| 2 | Eyepiece lens 1 | STANDARD | -72.968 | 7.085184 | N-LAF34 | 36.78147 |
| 3 | Eyepiece lens 1 | STANDARD | -23.7476 | 0.2499828 | | 37.90851 |
| 4 | Eyepiece lens 2 | STANDARD | 43.96926 | 8.368522 | N-LAK12 | 44.51907 |
| 5 | Eyepiece lens 2 | STANDARD | -186.066 | 0.250477 | | 44.20993 |
| 6 | Eyepiece lens 3 | STANDARD | 36.31142 | 8.883345 | N-LAF35 | 40.83127 |
| 7 | Eyepiece lens 3 | STANDARD | -5748.8 | 4.124581 | | 38.27651 |
| 8 | Eyepiece lens 4 | STANDARD | -48.0506 | 2.999996 | N-SF57 | 36.77054 |
| 9 | Eyepiece lens 4 | STANDARD | 71.65768 | 3.5 | | 34.69118 |
| 10 | inter. image | STANDARD | Infinity | 22.96816 | | 34.56296 |
| 11 | Power-corrector lens 5 | STANDARD | 23.7984 | 9.594824 | N-SF57 | 37.03321 |
| 12 | Power-corrector lens 5 | STANDARD | 40.49773 | 5.85126 | | 32.89225 |
| 13 | Power-corrector lens 6 | STANDARD | -117.212 | 11.82444 | N-SSK5 | 31.32079 |
| 14 | Power-corrector lens 6 | STANDARD | 20.40551 | 6.542407 | | 25.30627 |
| 15 | Power-corrector lens 7 | STANDARD | -126.426 | 5.600701 | N-LAK8 | 25.98849 |
| 16 | Power-corrector lens 7 | STANDARD | -28.1194 | 10.02324 | | 26.81372 |
| 17 | Power-corrector lens 8 | STANDARD | 70.01434 | 12.51398 | N-LAK8 | 23.11669 |
| 18 | Power-corrector lens 8 | STANDARD | -575.083 | 38.82339 | | 21.97399 |
| 19 | Objective lens 9 | STANDARD | 25.47357 | 3.702222 | N-LAK14 | 18.02666 |
| 20 | Objective lens 9 | STANDARD | -31.407 | 1.17353 | | 17.57453 |
| 21 | Objective lens 10 | STANDARD | -24.5515 | 2.999997 | N-SF14 | 16.50132 |
| 22 | Objective lens 10 | STANDARD | 18.6354 | 1.489947 | | 17.23698 |
| 23 | Objective lens 11 | STANDARD | 26.47378 | 6.065445 | N-LAF2 | 18.77145 |
| 24 | Objective lens 11 | STANDARD | -28.735 | 0.4999917 | | 19.65869 |
| 25 | Objective lens 12 | STANDARD | 14.15015 | 14.06887 | N-PSK53A | 19.6012 |
| 26 | Objective lens 12 | STANDARD | 8.640828 | 5.058045 | | 10 |
| IMA | Object plane | STANDARD | Infinity | | | 10.05961 |

FIGURE 62

COMPACT MAGNIFYING OPTICAL SYSTEM WITH WIDE FIELD OF VIEW

FIELD OF THE INVENTION

The present invention relates to compact Keplerian afocal optical systems with very wide fields of view. More particularly the invention relates to compact, lightweight visual observation optical systems, such as monoculars and binoculars, which may be worn by the user and that have very wide fields of view without decreasing the exit pupil.

BACKGROUND

Binoculars (also known as field glasses), are two identical telescopes mounted side-by-side and aligned to allow the viewer to use both eyes when viewing distant objects. Most of them are sized to be held using both hands. Because of the slightly different viewpoints of each of the viewer's eyes, the binocular gives the users a three-dimensional image.

The Keplerian telescope structure was introduced in 1661 and is based on a positive objective lens, an intermediate image and another positive lens that is the eyepiece. In order to erect the image, two right angle prisms are used. These prisms are mounted between the objective lens and the eyepiece. This structure is the most popular in visual systems. Another popular structure is the Galilean telescope which is more compact. A Galilean telescope consists of a positive objective lens and a negative eyepiece lens with no intermediate image. A Galilean telescope has limited field of view and magnification.

Large field of view enables fast scan of the scene, visualization of more details and visualization of dynamic events simultaneously. Thus, a small field of view is an acute limiting parameter in visual observation optical systems and particularly in binoculars. In general, the two most important features of an optical system are the field of view and the magnification and unfortunately there is a trade of between these two features. In a certain optical system, the product of these two features is constant. For a certain magnification, enlarging the field of view results is a massive and heavy system.

The modern binocular design was presented by Abbe in 1849. Each monocular consists of two major parts, an objective lens and eyepiece. The prisms for image erection, that are mounted between the objective lens and the eyepiece, are the most responsible for the weight of the binocular. This feature results in binoculars that are wide, with objective lenses that are well separated but offset from the eyepieces. Porro prism designs have the added benefit of folding the optical path so that the physical length of the binoculars is less than the focal length of the objective and wider spacing of the objectives gives a better sensation of depth. Other designs use mirrors in different configurations in order to decrease the bulk and the weight. In some designs, part of the objective lens is located in between the folding mirrors in order to decrease the binocular length.

Binoculars are usually designed for the specific application for which they are intended according to certain optical parameters:

Magnification—The ratio of the focal length of the objective to the focal length of the eyepiece gives the linear magnifying power of binoculars. A larger magnification leads to a smaller field of view.

Objective diameter—The diameter of the objective lens which determines the amount of light that is gathered to form an image.

Field of view—The field of view of a binocular determines the width of the scene that can be seen at 1,000 m, or the angular value of the scene that can be viewed.

Exit pupil—The exit pupil is the image of the aperture stop as imaged by the eyepiece. Actually, the exit pupil is the objective diameter divided by the magnifying power. For the brightest image, the exit pupil should equal the diameter of the fully dilated iris of the human eye—about 7 mm. However, a larger exit pupil makes alignment of the eye easier and avoids dark vignetting intruding from the edges.

Eye relief—The distance between the exit pupil and the vertex of the eyepiece in the image space is the eye relief. Eye relief determines the distance that the observer must position his/her eye behind the eyepiece in order to see an unvignetted image. The longer the focal length of the eyepiece, the greater is the eye relief. Eye relief is particularly important for eyeglass wearers since the eye of an eyeglass wearer is typically further from the eye piece.

Well-collimated binoculars should produce a single circular, apparently three-dimensional image, with no visible indication that one is actually viewing two distinct images from slightly different viewpoints.

In a regular optical design each of the objective lens and the eyepiece consists of several lenses, some with positive optical power and some with negative optical power. This customary optical design eliminates the curvature of field and corrects the aberrations. The entrance pupil and aperture stop of the optical system are in general identical and are located in the aperture of the objective lens. If the aperture stop is located inside the objective lens or between the objective lens and the intermediate image plane, the eye relief increases but the diameter of the lenses in the front group of the objective lens increases, too. Therefore, the aperture stop is located in an optimal position such that on one hand the eye relief is long enough and the diameter of the exit pupil is suitable, and on the other hand the diameter of the front group of the objective lens is not too large.

There are several optical designs for an eyepiece with a large field of view. In general, an eyepiece with a large field of view consists of two groups of lenses. The negative group is located before the intermediate image and its major role is to correct the distortion and the astigmatism. The positive group is the main part of the eyepiece and is responsible for the positive power of the eyepiece. Both groups correct together the field curvature. In FIG. 1 and FIG. 2, the Nagler and Dilworth eyepieces are illustrated. In the Figures can be seen the large angles of the incoming rays in the eyepiece due to the large field of view. The rays enter to the positive group lenses of the eyepiece with large ascending angles and exit the positive group lenses of the eyepiece with large descending angles. As a result of these large angles the geometrical dimensions of the eyepiece are large, on the order of 60-100 mm.

Therefore, embodiments of the present invention provide an optical design of a binocular with very large field of view without harming other optical parameters, such as exit—pupil Diameter, eye relief, magnification and brightness.

Embodiments of the present invention also provide an optical design of such a binocular which is also compact, lightweight and may be worn by the user.

SUMMARY AND OVERVIEW

As explained above, a magnifying optical system, such as a Keplerian telescope, typically comprises an objective, comprising a group of one or more lenses, and an eyepiece, also comprising one or more lenses. Embodiments of the present invention improve on this basic design by adding a third, intermediate group of one or more lenses, referred to herein as a power corrector.

In some embodiments of the present invention, the structure and functionality of the power corrector can be described by the following claims, some of which are presented in informal language:

1. An optical instrument, such as a telescope or a microscope, having an optical axis and comprising:

an objective having a first focal length, which is positive, and comprising a first group of one or more first lenses;

an eyepiece having a second focal length, which is positive, and comprising a second group of one or more second lenses having a characteristic aberration; and a power corrector having a third focal length and comprising a third group of one or more third lenses located on the optical axis between the objective and the eyepiece, wherein the optical instrument has an input focal length defined jointly by the first and third focal lengths and a magnification equal to a ratio of the input focal length to the second focal length, and wherein the eyepiece and the power corrector together have a combined aberration that is less than the characteristic aberration of the eyepiece.

The power corrector may have positive, negative, or neutral optical power. Proper design of an optical system incorporating a power correctors, using methods that are described hereinbelow, can yield a wider field of view, more compact design, and/or better optical performance than comparable systems without a power corrector. Various designs incorporating power correctors and exemplifying these advantageous properties are shown in the attached drawings and are described hereinbelow.

Telescopes and binoculars commonly comprise an image erector, made up of several reflecting surfaces. In some embodiments of the present invention, one or more of the elements of the power corrector are interleaved between the reflecting surfaces of the image erector. This sort of interleaving enhances the design flexibility and can be used to reduce the overall size of the optical system.

The use of a power corrector affords enhanced flexibility in determining the location and size of the entrance pupil and particularly of the exit pupil for a given location and diameter of the aperture stop. Alternatively or additionally, the power corrector affords enhanced flexibility in choosing the focal length of the objective.

The use of a power corrector makes it possible to substantially enlarge the field of view of the telescope while maintaining a relatively small eyepiece diameter (which makes it possible to use a pair of such telescopes as binoculars).

The use of a power corrector enhances the ability of the optical designer to reduce and control each of the optical aberrations of the telescope.

Telescopes incorporating a power corrector are typically substantially more compact and have lower manufacturing cost than systems designed for comparable performance without a power corrector.

Other aspects and embodiments of the present invention are covered by the claims that follow at the end of this specification or may be covered by additional claims.

According to one aspect of the present invention there is provided an optical system with very large field of view for a certain magnification without harming other optical parameters, such as exit—pupil diameter, eye relief and geometrical dimensions.

According to another aspect of the present invention there is provided an optical system which is also light weight and compact.

Embodiments of the present invention introduce a new point of view on the Keplerian structure in that it combines the different optical elements of the system to achieve compactness and large field of view.

According to an embodiments of the present invention the aperture stop and the entrance pupil are split.

According to an embodiment of the present invention the aperture stop is located closer to the eyepiece in order to extend the eye relief and the exit pupil diameter.

According to an embodiment of the present invention the aperture stop is located in front of the objective lens or even outside of the optical system.

According to one embodiment of the present invention the folding optical elements consist of prisms.

According to one embodiment of the present invention the folding prisms are replaced by mirrors in order to decrease the bulk and the weight of each monocular.

According to one embodiment of the present invention some of the folding prisms are replaced by mirrors in order to decrease the bulk and the weight of each monocular.

According to one embodiment of the present invention the objective lens is design as a telephoto structure in order to achieve compactness.

According to one embodiment of the present invention the objective lens is split into several groups of lenses that are placed in between the folding mirrors and/or prisms in order to increase the compactness of the optical system.

According to one embodiment of the present invention the negative group of lenses of the objective lens and the negative group of lenses of the eyepiece are unified.

According to another embodiment of the present invention an additional intermediate group of lenses is inserted in between the objective lens and the eyepiece.

According to another embodiment of the present invention the additional intermediate group of lenses consists of at least one lens.

According to another embodiment of the present invention the additional intermediate group of lenses acts as a power corrector.

According to another embodiment of the present invention the power corrector serves as an aberrations corrector of the optical system.

According to another embodiment of the present invention the power corrector has positive optical power.

According to another embodiment of the present invention the power corrector has negative optical power.

According to another embodiment of the present invention the power corrector has zero optical power.

According to one embodiment of the present invention the power corrector is split into several groups of lenses that are placed in between the folding mirrors and/or prisms in order to increase the compactness of the optical system.

According to one embodiment of the present invention the folding mirrors and/or prisms are placed in between the said objective lens and the power corrector in order to increase the compactness of the optical system.

According to one embodiment of the present invention the folding mirrors and/or prisms are placed in between the power corrector and the eyepiece lens in order to increase the compactness of the optical system.

According to one embodiment of the present invention the folding mirrors and/or prisms are placed in between the power corrector and the eyepiece lens in order to increase the compactness of the optical system.

According to one embodiment of the present invention the several split groups of lenses of the objective lens are movable in order to realize a Zoom magnifying system.

According to another embodiment of the present invention the several split groups of lenses of the power corrector are movable in order to realize a Zoom magnifying system.

According to one embodiment of the present invention the additional intermediate group of lenses is actually one of the lenses of a user's glasses.

According to one embodiment of the present invention both lenses of a user's glasses serve as the additional intermediate lens for two different optical systems, each of which consists of an objective lens, an intermediate lens and an eyepiece.

According to one embodiment of the present invention the eyepiece is attached to the said intermediate lens closer to the user's eye.

According to one embodiment of the present invention the objective lens is attached to the intermediate lens farther from the user's eye.

According to one embodiment of the present invention the user's glasses serve as a holder for the objective lens, intermediate lens and eyepiece.

In accordance with one embodiment of the present invention a reticle is placed in the intermediate image plane.

In accordance with one embodiment of the present invention a LCD display is placed in the intermediate image plane.

In accordance with one embodiment of the present invention a CCD camera is placed in the intermediate image plane.

In accordance with one embodiment of the present invention an optical element is placed in the intermediate image plane.

In accordance with one embodiment of the present invention an optical imaging system is placed in the intermediate image plane.

In accordance with one embodiment of the present invention an auxiliary real image is imaged in the intermediate image plane. This auxiliary real image enables providing instructions or data to the user.

According to an embodiment of the present invention there is provided an optical device, having an optical axis and including: an objective having a first focal length, which is positive, and including a first group of one or more first lenses; an eyepiece having a second focal length, which is positive, and including a second group of one or more second lenses having a characteristic aberration; and a power corrector having a third focal length and including a third group of one or more third lenses located on the optical axis between the objective and the eyepiece, wherein the optical device has an input focal length defined jointly by the first and third focal lengths and a magnification equal to a ratio of the input focal length to the second focal length, and wherein the eyepiece and the power corrector together have a combined aberration that is less than the characteristic aberration of the eyepiece.

One basic optical device of the present invention includes an objective, an eyepiece and a power corrector. The objective has a positive focal length and includes a first group of one or more first lenses. The eyepiece has a positive focal length and includes a second group of one or more second lenses. The eyepiece has a characteristic aberration. The power corrector has a positive, negative or neutral focal length and includes a third group of one or more third lenses located on the optical axis of the optical device between the objective and the eyepiece. The optical device has an input focal length defined jointly by the focal lengths of the objective and the power corrector. The optical device also has a magnification equal to the ratio of the input focal length to the focal length of the eyepiece. The eyepiece and the power corrector together have a combined aberration that is less than the characteristic aberration of the eyepiece.

Preferably, as in telescope 410 of FIG. 49 below, the combined aberration of the eyepiece and the power corrector includes a combined distortion of at most 5.1% over the entire field of view of the optical device. This combined distortion is less than the characteristic distortion of the eyepiece.

Preferably, as in telescope 410 of FIG. 49 below, the combined aberration of the eyepiece and the power corrector yields a spatial resolution at the optical device's exit pupil that is finer than two arcminutes on the optical axis and finer than six arcminutes at the edge of the exit pupil.

In some embodiments, the power corrector has positive optical power. In some of these embodiments, the objective and the eyepiece have respective positive optical powers. (Optical power is the reciprocal of the focal length. In most of the preferred embodiments described below, all the focal lengths are positive, hence all the optical powers are positive.) In some of the embodiments in which the objective and the eyepiece have positive optical powers, the power corrector focal length is less than the eyepiece focal length.

In some embodiments, such as the embodiment of FIG. 9 below, the power corrector has negative optical power. In other embodiments, the power corrector has neutral optical power.

In some embodiments, such as the embodiments of FIGS. 20, 31 and 32 below, the optical device includes an image erector and at least one lens of the power corrector is located on the optical device's optical axis between two reflective surfaces, such as mirrors, of the image erector.

Some embodiments, as illustrated in FIGS. 5-9 below, include an aperture stop between the objective and the eyepiece.

In some embodiments, as in FIG. 4 below, the objective lenses are arranged in a telephoto structure.

In some embodiments the objective lenses and/or the eyepiece lenses and/or the power corrector lenses are moveable so as to zoom the magnification of the telescope. In some of these embodiments the magnification is zoomed by varying the spacing between the lenses of the power corrector.

The apparent field of view defined by the objective, the eyepiece and the power corrector preferably is at least 75 degrees, and most preferably is at least 85 degrees. For example, the telescope of FIG. 49 below has an apparent field of view of 86 degrees.

Preferably, in the embodiments whose apparent fields of view are at least 75 degrees, the objective, the eyepiece and the power corrector together define an exit pupil of a given pupil diameter, and, as in the telescope of FIG. 49 below, all the lenses of the eyepiece have respective lens diameters no greater than twelve times the pupil diameter. Most preferably, as in the telescope of FIG. 49 below, the eyepiece has an eye relief defined by the location of the exit pupil and the respective lens diameters of the eyepiece lenses are no greater than four times the eye relief.

Preferably, as in the telescope of FIG. 49 below, in the embodiments whose apparent fields of view are at least 75 degrees, the respective diameters of the eyepiece lenses all are no greater than three times the focal length of the eyepiece.

According to an embodiment of the present invention there is provided an optical device, having an optical axis and including: an objective having a first focal length, which is positive, and including a first group of one or more first lenses; an eyepiece having a second focal length, which is positive, and including a second group of one or more second lenses; and a power corrector having a third focal length and including a third group of one or more third lenses located on the optical axis between the objective and the eyepiece, wherein the objective, eyepiece and power corrector together define an apparent field of view of at least 75° and an exit pupil of a given pupil diameter, and wherein the second lenses all have respective lens diameters that are no greater than twelve times the pupil diameter.

Another basic optical device of the present invention includes an objective, an eyepiece and a power corrector. The objective has a positive focal length and includes a first group of one or more first lenses. The eyepiece has a positive focal length and includes a second group of one or more second lenses. The power corrector has a positive, negative or neutral focal length and includes a third group of one or more third lenses located on the optical axis of the optical device between the objective and the eyepiece. The objective, the eyepiece and the power corrector together define an apparent field of view of at least 75 degrees and an exit pupil of a given pupil diameter. The respective diameters of the eyepiece lenses all are no greater than twelve times the exit pupil diameter.

Preferably, as in telescope 410 of FIG. 49 below, the apparent field of view of the optical device is at least 85 degrees.

Preferably, as in telescope 410 of FIG. 49 below, the pupil diameter exceeds 4 mm and the respective lens diameter of each of the eyepiece lenses are no greater than 50 mm.

Preferably, as in telescope 410 of FIG. 49 below, the respective lens diameter of each of the eyepiece lenses is no greater than three times the eyepiece focal length.

Preferably, as in telescope 410 of FIG. 49 below, the eyepiece has an eye relief defined by the location of the exit pupil, and the respective lens diameter of each of the eyepiece lenses is no greater than four times the eye relief.

Preferably, the objective, the eyepiece and the power corrector all have respective positive optical powers. Most preferably, the focal length of the power corrector is less than the focal length of the eyepiece.

According to an embodiment of the present invention there is provided an optical device, having an optical axis and including: an objective having a first focal length, which is positive, and including a first group of one or more first lenses; an eyepiece having a second focal length, which is positive, and including a second group of one or more second lenses; and a power corrector having a third focal length and including a third group of one or more third lenses located on the optical axis between the objective and the eyepiece, wherein the objective, eyepiece and power corrector together define an apparent field of view of at least 75°, and wherein the second lenses all have respective lens diameters that are no greater than three times the second focal length. Another basic optical device of the present invention includes an objective, an eyepiece and a power corrector. The objective has a positive focal length and includes a first group of one or more first lenses. The eyepiece has a positive focal length and includes a second group of one or more second lenses. The power corrector has a positive, negative or neutral focal length and includes a third group of one or more third lenses located on the optical axis of the optical device between the objective and the eyepiece. The objective, the eyepiece and the power corrector together define an apparent field of view of at least 75 degrees and an exit pupil of a given pupil diameter. The respective diameters of the eyepiece lenses all are no greater than three times the eyepiece focal length.

Preferably, as in telescope 410 of FIG. 49 below, the apparent field of view of the optical device is at least 85 degrees.

Preferably, as in telescope 410 of FIG. 49 below, the eyepiece focal length is at least 18 mm and the respective lens diameter of each of the eyepiece lenses are no greater than 50 mm.

Preferably, the objective, the eyepiece and the power corrector together define an exit pupil. The eyepiece has an eye relief defined by a location of the exit pupil. The respective diameter of each eyepiece lens is no greater than four times the eye relief.

Preferably, the objective, the eyepiece and the power corrector all have respective positive optical powers. Most preferably, the focal length of the power corrector is less than the focal length of the eyepiece.

According to an embodiment of the present invention there is provided a method of designing an optical system, including: (a) selecting, for an objective element group of the optical system, a positive number of objective optical elements; (b) defining an objective element group focal length of the objective element group; (c) selecting, for an eyepiece element group of the optical system, a positive number of eyepiece optical elements; (d) defining an eyepiece element group focal length of the eyepiece element group; (e) selecting, for a power corrector element group to be interposed in an optical path from the objective element group to the eyepiece element group, a positive number of power corrector optical elements; (f) defining a power corrector element group focal length of the power corrector element group; (g) defining a plurality of system requirements for the optical system; and (h) jointly optimizing respective values of a set of free parameters, of the optical elements, that includes at least one respective free parameter of at least one objective optical element, at least one respective free parameter of at least one eyepiece element, and at least one respective free parameter of at least one power corrector optical element, to satisfy the system requirements.

The basic method of some embodiments of the present invention for designing an optical system comprises designing an optical system that includes an objective element group, an eyepiece element group and a power corrector element group that is interposed in the optical path from the objective element group to the eyepiece element group. In the basic form of the method, the number of optical elements of each of the three element groups is selected in advance. Of course, these numbers are positive numbers (integers greater than zero). The respective focal lengths of the three element groups also are defined in advance. A plurality of system requirements are defined for the system. Respective values of one or more free parameters of one or more optical elements of each of the element group are optimized jointly. In other words, the set of free parameters whose values are optimized includes at least one free parameter of at least one optical element of the objective element group, at least one free parameter of at least one optical element of the eyepiece element group, and at least one free parameter of at least one optical element of the power corrector element group. The respective focal lengths of the three element groups, being defined in advance, are constraints on the optimization.

Typically, the optical elements are transmissive optical elements, such as lenses and/or diffractive optical elements.

The system requirements include one or more of the following: magnification, apparent field of view, real field of view, entrance pupil diameter, entrance pupil location, exit pupil diameter, exit pupil location, aperture stop diameter, aperture stop location, eye relief, spectral range, resolution, maximum allowed curvature of field, maximum allowed distortion, maximum allowed monochromatic aberration, maximum allowed chromatic aberration, close focus distance, maximum allowed system optical path length, maximum allowed system volume and maximum allowed system weight.

In many embodiments, the close focal distance is infinite. In other words, the optical systems of these embodiments are afocal.

Typically, the optical elements whose free parameter values are optimized are lenses. For each such lens, the one or more free parameters whose values are optimized include the diameter of the lens, the thickness of the lens, the radii of curvature of the surfaces of the lens and/or the index of refraction of the lens. If an element group includes more than one lens, then the set of free parameters includes respective separations between pairs of consecutive lenses of the element group.

In embodiments such as Keplerian embodiments, the focal lengths of both the objective element group and the eyepiece element group are positive. In embodiments such as Galilean embodiments, the focal length of the objective element group is positive and the focal length of the eyepiece element group is negative.

If the optimization fails to produce values of the free parameters that satisfy the system requirements, the number of optical elements in one or more of the optical element groups are changed and the joint optimization is repeated. Usually, optical elements are added, but if one of the system requirements that is not satisfied is the maximum allowed volume or the maximum allowed weight then optical elements may be removed.

Embodiments of the invention also include optical systems designed according to the methods described herein for designing optical systems.

According to an embodiment of the present invention there is provided an optical system including an eyepiece, the optical system having an exit pupil diameter greater than about 4 millimeters and an apparent field of view greater than about 85 degrees, wherein no optical component of the eyepiece has a dimension transverse to an optical path of the optical system that is greater than about 50 millimeters.

According to another embodiment of the present invention there is provided an optical system including an eyepiece, the optical system having an apparent field of view greater than about 85 degrees, wherein the eyepiece has a focal length greater than about 18 millimeters and wherein no optical component of the eyepiece has a dimension transverse to an optical path of the optical system that is greater than about 50 millimeters.

In a disclosed embodiment, an optical system (e.g., telescope or microscope) includes an eyepiece, none of whose optical components have a dimension transverse to the optical path of the optical system that is greater than about 50 millimeters. Despite this restriction on the transverse dimensions of the optical components of the eyepiece (e.g., all the eyepiece lenses in tables 1 and 2 below have semi-diameters less than 25 millimeters), the apparent field of view can be between 85 degrees and 120 degrees, the exit pupil diameter can be between 4 millimeter and 16 millimeters, and the eyepiece focal length can be between 7 millimeters and 50 millimeters (preferably between 18 millimeters and 42 millimeters).

According to an embodiment of the present invention there is provided an optical system including an objective, an eyepiece and a power corrector. The objective focuses an image of a scene on an intermediate image plane as an intermediate image. The eyepiece magnifies the intermediate image. The power corrector modifies the focal length of the objective while correcting one or more aberrations of the eyepiece. The objective, the eyepiece and the power corrector each has its own respective pre-defined focal length.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. In case of conflict, the patent specification, including definitions, will control. In addition, the materials, methods, and examples are illustrative only and not intended to be limiting.

BRIEF DESCRIPTION OF THE DRAWINGS

Embodiments of the invention are herein described, by way of example only, with reference to the accompanying drawings. With specific reference now to the drawings in detail, it is stressed that the particulars shown are by way of example and for purposes of illustrative discussion of the embodiments of the present invention only, and are presented in the cause of providing what is believed to be the most useful and readily understood description of the principles and conceptual aspects of the invention. In this regard, no attempt is made to show structural details of the embodiments in more detail than is necessary for a fundamental understanding of the invention, the description taken with the drawings making apparent to those skilled in the art how the several forms of the invention may be embodied in practice.

In the drawings:

FIGS. 20-22 illustrate a monocular/binocular of the present invention with 7× magnification.

FIGS. 23-26 illustrate a monocular/binocular of the present invention with 8× magnification.

FIGS. 27-30 illustrate a monocular/binocular of the present invention that is similar to the monocular/binocular of FIGS. 23-26 but scaled down by a factor of two.

FIGS. 31-36B illustrate a monocular/binocular design of the present invention with either 7× magnification or 8× magnification.

FIGS. 37-39 illustrate a monocular/binocular of the present invention with 17× magnification.

FIGS. 40-42 illustrate a monocular/binocular of the present invention with 20× magnification.

FIGS. 43-48 illustrate a telescope of the prior art.

FIGS. 49-54 illustrate the improved performance bestowed by the power corrector of the present invention on a telescope of the present invention that has the same magnification, apparent field of view, eyepiece focal length, exit pupil diameter, number of lenses and total length as the telescope of FIGS. 43-48.

FIGS. 55-60 illustrate a telescope of the prior art for defining the characteristic aberration of the eyepiece of the telescope of FIGS. 49-54.

FIGS. 61-63 illustrate a microscope of the present invention.

DESCRIPTION OF THE EMBODIMENTS

Embodiments of the present invention provide an optical system and method which enables very wide fields of view. More particularly some embodiments relate to a compact, light weight binocular which may be worn by the user that has a very wide field of view without decreasing the exit pupil and the eye relief.

Before explaining at least one embodiment of the invention in detail, it is to be understood that the invention is not limited in its application to the details set forth in the following description or exemplified by the Examples. The invention is capable of other embodiments or of being practiced or carried out in various ways. Also, it is to be understood that the phraseology and terminology employed herein is for the purpose of description and should not be regarded as limiting.

As described above, an eyepiece with large field of view consists of two groups of lenses, the positive group which is responsible for the positive power of the eyepiece and the negative group which corrects the distortion, the astigmatism and the field curvature.

Figure 1:
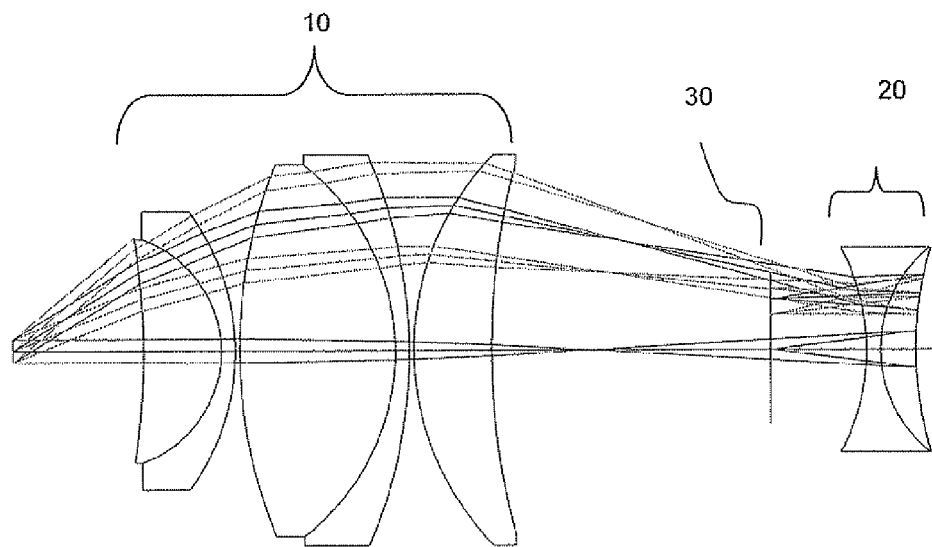
FIG. 1 illustrates the optical design of Nagler eyepiece.

Referring to the Figures, the optical design of the Nagler eyepiece is shown in FIG. 1. In this design, 10 is the positive group of lenses, and 20 is the negative group of lenses. Due to the large field of view there are large angles of the incoming rays in the eyepiece. The rays enter to the positive group lenses of the eyepiece with large ascending angles and exit the positive group lenses of the eyepiece with large descending angles. 30 is the image plane of the eyepiece. As a result of these large angles the geometrical dimensions of the eyepiece are large.

Figure 2:
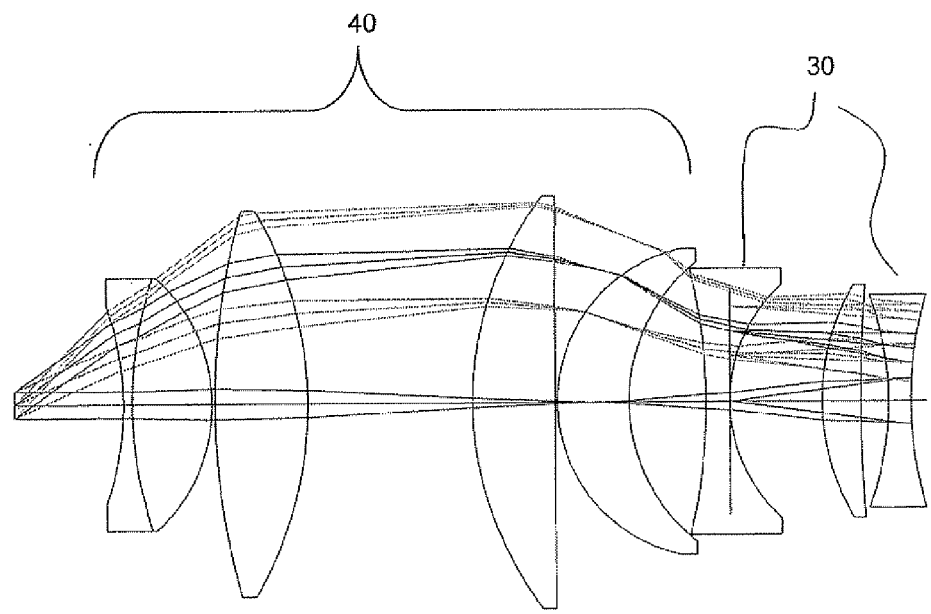
FIG. 2 illustrates the optical design of Dilworth eyepiece.

In FIG. 2 the Dilworth eyepiece design is illustrated. In this popular design, 40 is the positive group of lenses, and 30 is the negative group of lenses. This design is a very recent design with excellent corrections but it is a bit bulky. The image formed within the lens seems to be very close to the air-glass surface of the fourth element from the objective.

Figure 3:
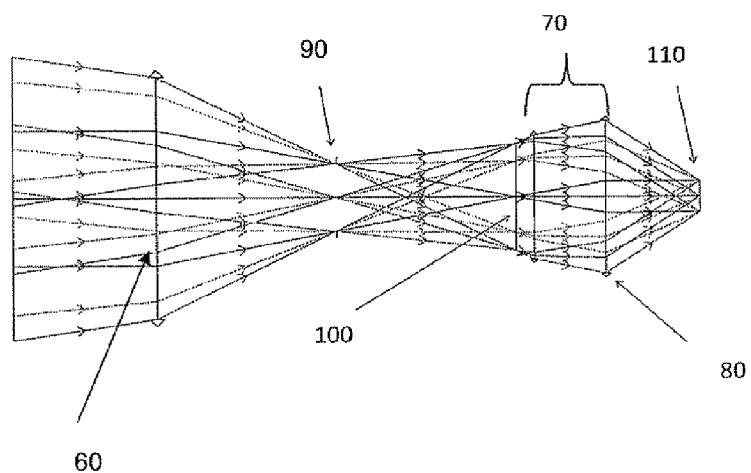
FIG. 3 illustrates the optical design of an optical system in which the aperture stop is located closer to the eyepiece in order to extend the eye relief and the exit pupil diameter.

FIG. 3 illustrates a general optical design of a Keplerian configuration according to an embodiment of the present invention. In this design, 60 is the objective lens and 70 is the eyepiece. In general optical design the aperture stop is located in the objective lens. The aperture stop 90 is separated from the objective lens 60 and located closer to the eyepiece 70. The dimension and location of the exit pupil are determined by the dimension and location of the aperture stop. Accordingly, in this design the exit pupil's diameter 110 and the eye relief are extended. 100 is the image plane of the eyepiece. Locating the aperture stop 90 too close to the image plane of the eyepiece 100 enlarges the objective lens diameter. Therefore a better design locates the aperture stop 90 at an optimal distance such that the aperture stop and the eye relief are enlarged without enlarging the objective lens diameter.

Figure 4:
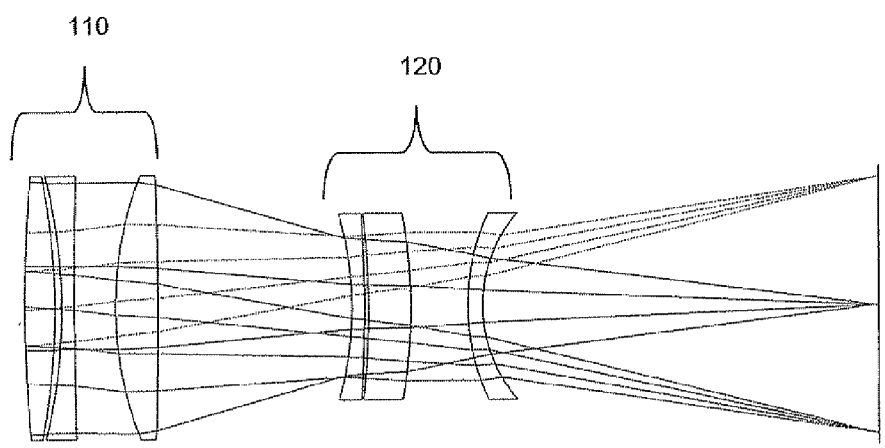
FIG. 4 illustrates the optical design of the objective lens in a telephoto structure.

FIG. 4 illustrates the optical design of the objective lens in a telephoto structure that consists of positive group of lenses 110 and 120. Designing of the objective lens in a telephoto structure enables separating the different groups of lenses of the objective and placing them in between the folding mirrors as is shown in the next figures, thus, in this configuration the system's physical length becomes shorter. Another advantage is that the beam of rays from the positive group of lenses converge toward the intermediate image with shallower slopes which helps the aberrations correction.

Figure 5:
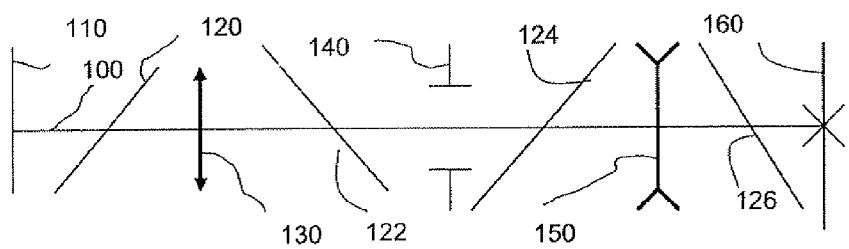
FIG. 5 illustrates an optical system in which the different groups of lenses of the objective lens are placed in-between the folding mirrors.

FIG. 5 illustrates an optical system in which the different groups of lenses of the objective lens are placed in between the folding mirrors. In this design, the objective lens is designed in a telephoto structure in which aperture stop 140 is behind the positive group of lenses 130 and behind aperture stop 140 the negative group of lenses 150 is located before the last folding mirror. In FIG. 5, 100 is the optical axis, 110 is the entrance window of the optical system, 120-126 are the folding mirrors and 160 is the intermediate image.

Figure 6:
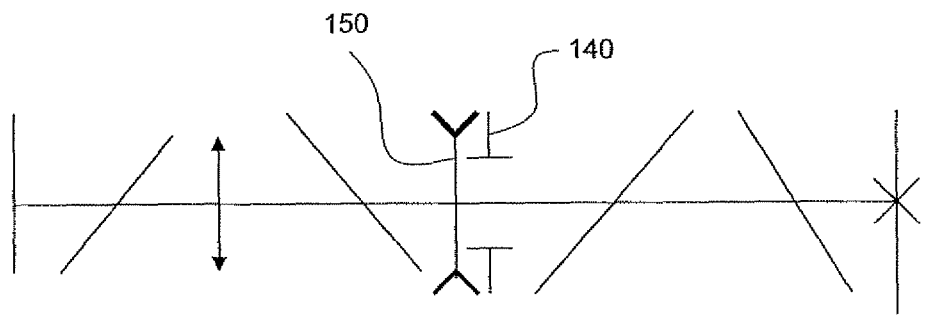
FIG. 6 illustrates another optical system in which the different groups of lenses of the objective lens are placed in-between the folding mirrors.

FIG. 6 illustrates another optical system in which the different groups of lenses of the objective lens are placed in-between the folding mirrors and the aperture stop 140 is located right behind the negative group 150.

Figure 7:
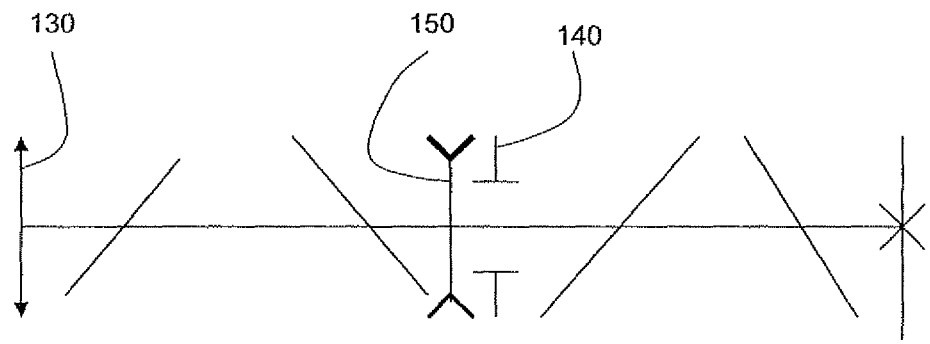
FIG. 7 illustrates another optical system in which the different groups of lenses of the objective lens are placed in-between the folding mirrors.

FIG. 7 illustrates another optical system in which the different groups of lenses of the objective lens are placed in-between the folding mirrors and the front positive group of lenses 130 is the entrance window.

Figure 8:
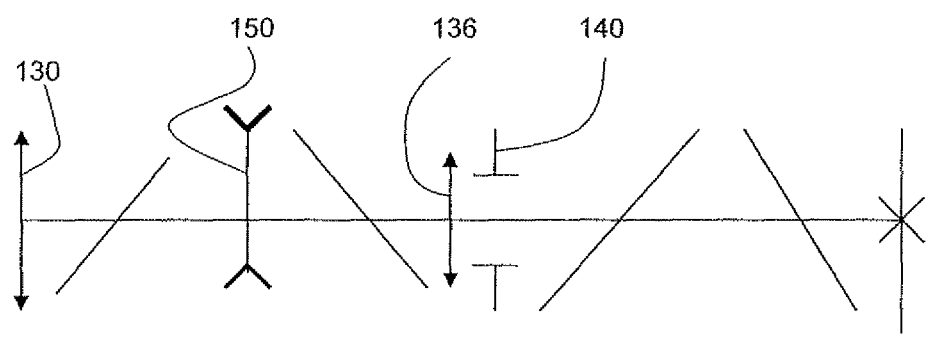
FIG. 8 illustrates another optical system in which the different groups of lenses of the objective lens are placed in-between the folding mirrors.

FIG. 8 illustrates another optical system in which the different groups of lenses of the objective lens are placed in-between the folding mirrors and wherein the positive group is split into two positive groups 130 and 136 in order to compact the overall optical system.

Figure 9:
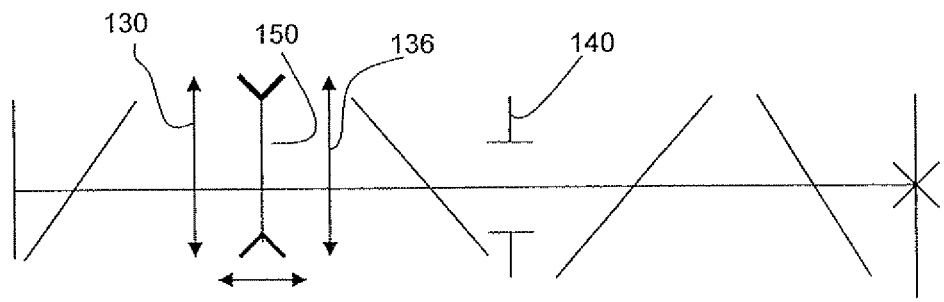
FIG. 9 illustrates another optical system in which the different groups of lenses of the objective lens are placed in-between the folding mirrors.

FIG. 9 illustrates another optical system in which the different groups of lenses of the objective lens are placed in between the folding mirrors. In this embodiment the objective lens acts as a Zoom lens. The negative group of lenses 150 is placed between two groups of lenses 130 and 136 which have positive optical power. The negative group of lenses 150 is moveable. The negative group of lenses 150 is moved to achieve different magnifications.

Figure 10:
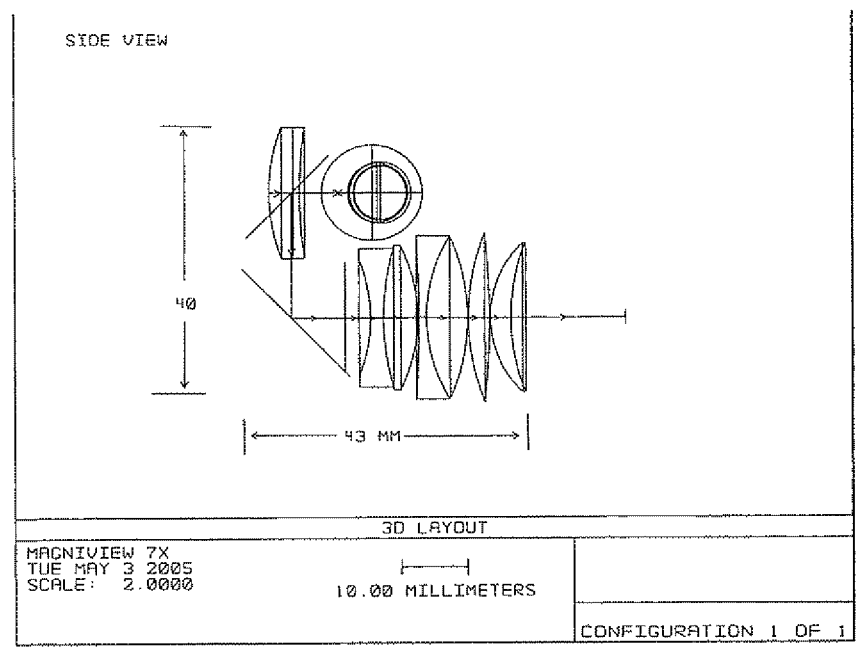
FIG. 10 illustrates in side view an optical system in which the different groups of lenses of the objective lens are placed in between the folding mirrors.

FIG. 10 illustrates in side view an optical system in which the different groups of lenses of the objective lens are placed in between the folding mirrors.

Figure 11:
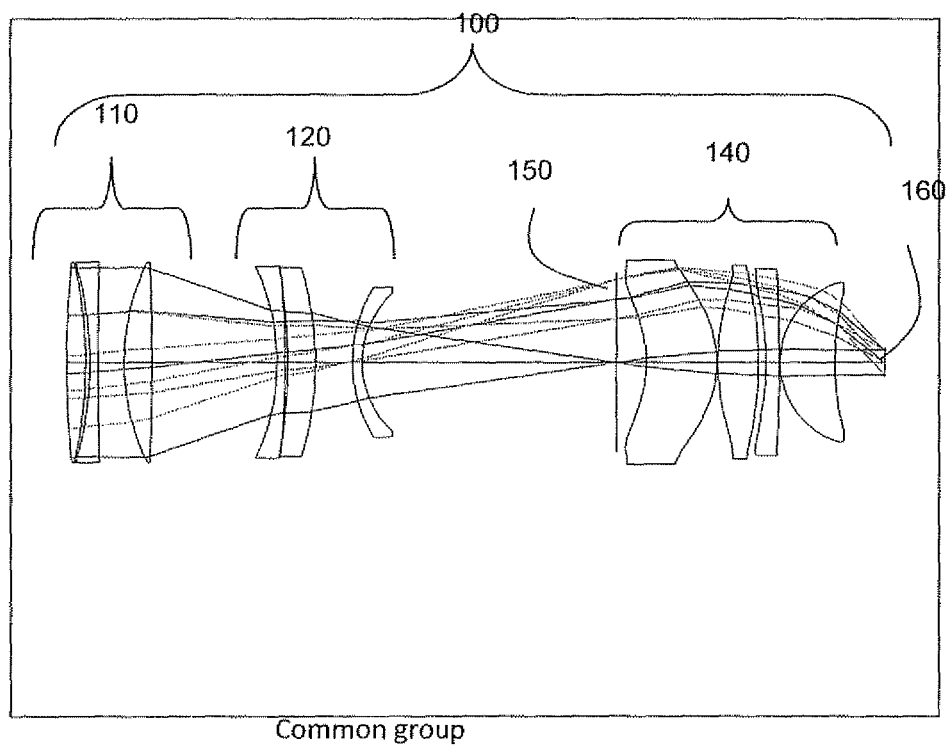
FIG. 11 illustrates an unfolded optical design in which the negative group of the lenses of the objective lens and the negative group of the lenses of the eyepiece are common.

FIG. 11 illustrates an unfolded optical design in which the negative group of the lenses of the objective lens and the negative group of the lenses of the eyepiece are common. In this embodiment the optical system 100 consists of three groups of lenses 110, 120 and 140. The overall optical power of the group of lenses 110 is positive, the overall optical power of the group of lenses 120 negative and the overall optical power of the group of lenses 140 is positive. The groups of lenses 110 and 120 focuses the optical energy onto the focal plane 150. The group of lenses 140 converts the optical energy on focal plane 150 to light beams with a very large field of view on the exit pupil 160. A field of view as great as 100 degrees can be achieved. The high bending of the rays causes aberrations. These aberrations are corrected by the negative group of lenses 120. In this design the negative group of lenses 120 corrects the aberrations of the second optical system 140 too, thus acting as a joint negative group of lenses for both groups of lenses 100 and 140. Other advantages attained by combining the negative group of lenses of the objective lens and the negative group of lenses of the eyepiece are shortening the overall length of the optical system and decreasing the eyepiece diameter.

Figures 12, 12A:
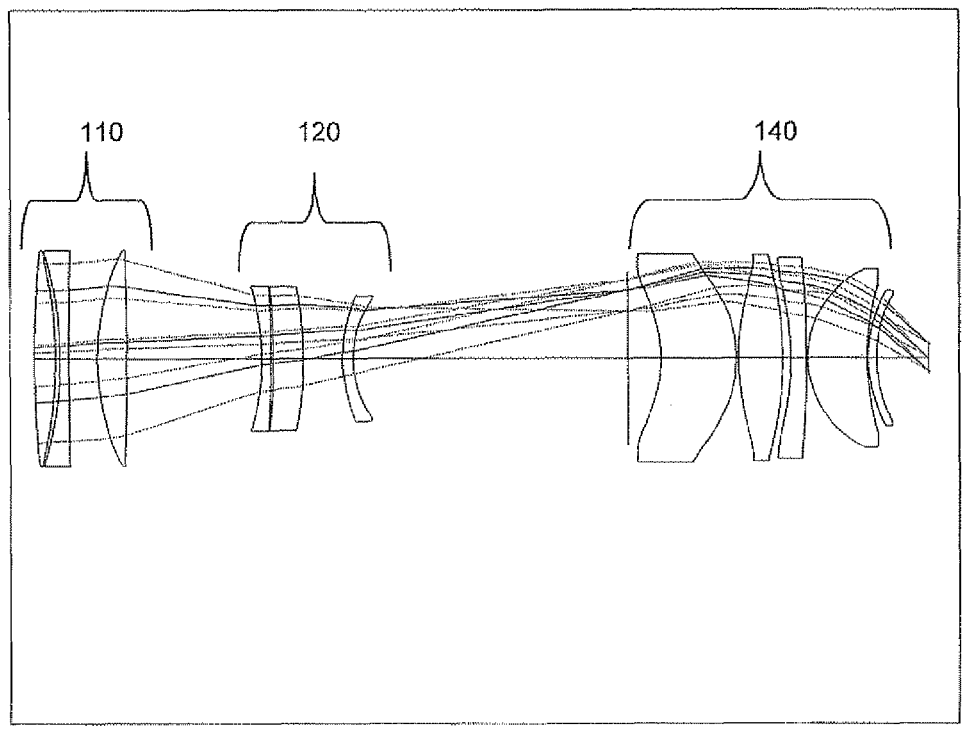
FIG. 12 illustrates an unfolded optical design in which the negative group of the lenses of the objective lens and the negative group of the lenses of the eyepiece are common.
FIG. 12a is a table of the optical parameters of the optical system design that is shown in FIG. 12.

FIG. 12 illustrates an unfolded optical design in which the negative group of the lenses 120 of the objective lens 110 and the negative group of the lenses of the eyepiece 140 are common.

FIG. 12a is a table with the optical parameters of the optical system design that is shown in FIG. 12. From the table it can be seen that the apparent field of view is as large as 84 deg for ×7 magnification, 7 mm pupil diameter and 14 mm eye relief. It should be noted that an apparent field of view as large as 110 deg can be achieved for reasonable magnification, pupil diameter and eye relief.

Figure 13:
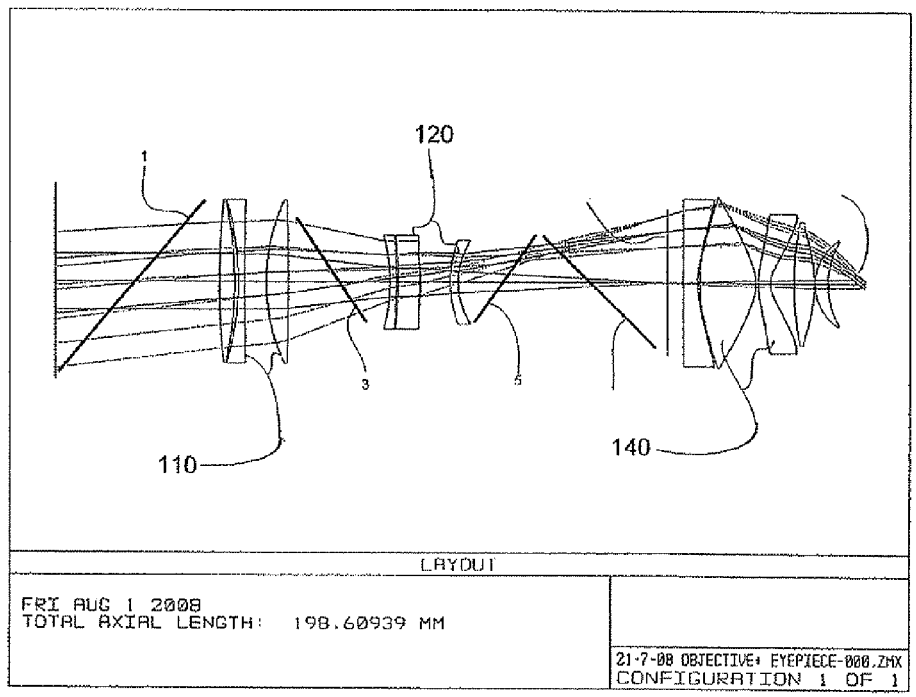
FIG. 13 illustrates an unfolded optical design in which the negative group of the lenses of the objective lens and the negative group of the lenses of the eyepiece are common.

FIG. 13 illustrates an unfolded optical design in which the common negative group of the lenses 120 of the objective lens 110 and the group of the lenses of the eyepiece 140 are placed in-between the folding mirrors 1, 3 and 5.

Figure 14:
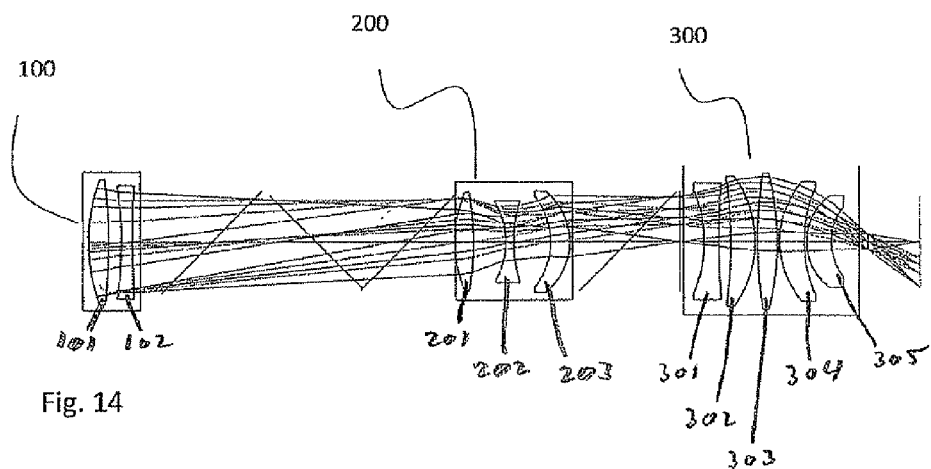
FIG. 14 illustrates an unfolded optical design of an embodiment of the present invention in which a power corrector is added in-between the folding mirrors between the objective lens and the eyepiece.

FIG. 14 illustrates an unfolded optical design of an embodiment of the present invention in which a power corrector 200 is added in-between one pair of folding mirrors between the objective lens 100 and the eyepiece 300. The power corrector can be added in-between any pair of the folding mirrors between the objective lens and the eyepiece. The power corrector is a group of optical elements that includes at least one lens or other optical element that is located between the objective lens and the intermediate image close to the eyepiece. In general in this space in a Keplerian visual system an inverting system is located. Thus, the power corrector may include optical elements that also invert the image. In prior art afocal Keplerian optical systems the Entrance-Pupil and Aperture Stop are identical and are located in the entrance of the optical system. The exit pupil is the image of the aperture stop in the image space which is imaged by the eyepiece. The size and location of the exit pupil are determined by the focal length of the optical system and by the size and location of the aperture stop relative to the eyepiece. The power corrector enables controlling the locations and the sizes of the various pupils of the optical system since the aperture stop in the image space is imaged by the eyepiece and the power corrector. Among the functions of the power corrector are: a. to correct the large optical aberrations of the eyepiece, such as coma, due to the very wide field of view. b. to share optical power with the objective lens. Thus, the optical power of the power corrector can be positive, negative or zero. c. to determine the diameters and locations of the apertures and pupils, thus the power corrector can provide additional degrees of freedom in the optical design, d. to determine the flatness and the quality of the intermediate image. The various optical elements of the power corrector can be lenses of different kinds, such as spherical, aspherical, GRIN lenses, diffractive optical elements in any combination. The optical elements of the power corrector can be made of all kinds of materials such as glass or plastic with different refractive indices.

If necessary, various optical elements such as filters, polarizers and reticles can be placed in the power corrector.

It also should be noted that in the optical design several intermediate images and several power correctors can be designed in the optical system.

Table 1 shows the optical properties of the lenses of FIG. 14. All lengths are in millimeters.

TABLE 1

| Abbe Number | Index of refraction | Radii of curvature | separation | thickness | Semi-diameter | lens |
|---|---|---|---|---|---|---|
| 67.0 | 1.50 | −55.4498113 |  | 6.5781035 | 20.1500029 | 101 |
|  |  | 174.2171606 |  |  |  |  |
| 23.8 | 1.85 | 120.2388654 | 4.2245890 | 3.4977697 | 18.0531991 | 102 |
|  |  | −333.384529 |  |  |  |  |
| 49.6 | 1.77 | −39.9203891 |  | 6.0006776 | 16.3780641 | 201 |
|  |  | 102.4792493 |  |  |  |  |
| 63.5 | 1.62 | 25.7641207 | 10.6565895 | 2.6861376 | 14.2680131 | 202 |
|  |  | −43.9451514 |  |  |  |  |
| 23.8 | 1.85 | 23.9361834 | 12.0039222 | 6.3883713 | 17.5305596 | 203 |
|  |  | 20.7736817 |  |  |  |  |
| 23.8 | 1.85 | 43.2127129 |  | 4.7077746 | 22.0452133 | 301 |
|  |  | −212.560253 |  |  |  |  |
| 31.3 | 1.90 | 152.9396299 | 3.8363365 | 8.0235249 | 22.9324402 | 302 |
|  |  | 35.3894506 |  |  |  |  |
| 40.8 | 1.88 | −131.448924 | 0.7998706 | 6.4371102 | 24.6933305 | 303 |
|  |  | 93.8391608 |  |  |  |  |
| 49.6 | 1.77 | −29.3245590 | 0.7997530 | 7.9986730 | 20.9885448 | 304 |
|  |  | −41.8487050 |  |  |  |  |
| 31.3 | 1.90 | −18.1824895 | .7941041 | 8.0001987 | 15.8960880 | 305 |
|  |  | −0.7941041 |  |  |  |  |

Figures 15, 15A:
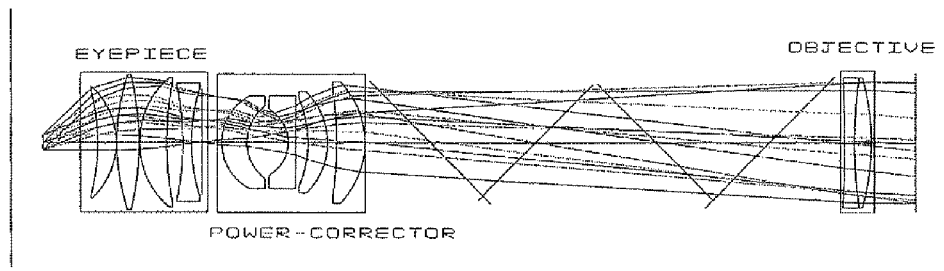
FIG. 15 illustrates an unfolded optical design of an embodiment of the present invention in which a power corrector is added between the objective lens and the eyepiece close to the eyepiece.

FIG. 15 illustrates an unfolded optical design of an embodiment of the present invention in which a power corrector is added between the objective lens and the eyepiece close to the eyepiece. The power corrector's lens group can be separated to several subgroups in which each subgroup can be place in-between any pair of the folding mirrors or prisms. This configuration provides a very large apparent FOV of more then 85 degrees in the eyepiece.

In FIG. 15a, reproduced in the table below, there is provided a comparison of apparent FOV between common binoculars and the invented design for several magnifications:

| F.O.V. With the new concept | F.O.V. current | magnification |
|---|---|---|
| 14° | 7° | X7 |
| 12.5° | 6.5° | X8 |
| 12° | 5.5° | X10 |
| 6° | 4° | X15 |
| 5.3° | 3° | X20 |

Applications of embodiments of the present invention include: microscope, field microscope, stereo microscope, macroscope, endoscope, alignment telescope.

Figure 16:
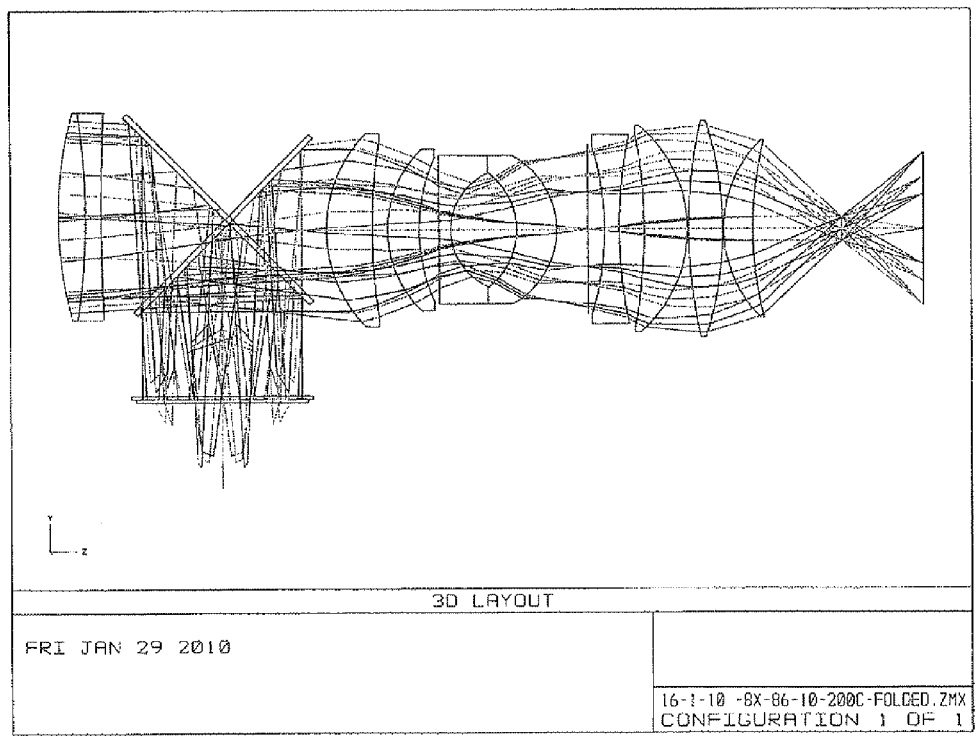
FIG. 16 illustrates a folded optical design of an embodiment of the present invention in which a power corrector is added between the objective lens and the eyepiece close to the eyepiece.

FIG. 16 illustrates a folded optical design of an embodiment of the present invention wherein a power corrector is added between the objective lens and the eyepiece close to the eyepiece.

Figure 17:
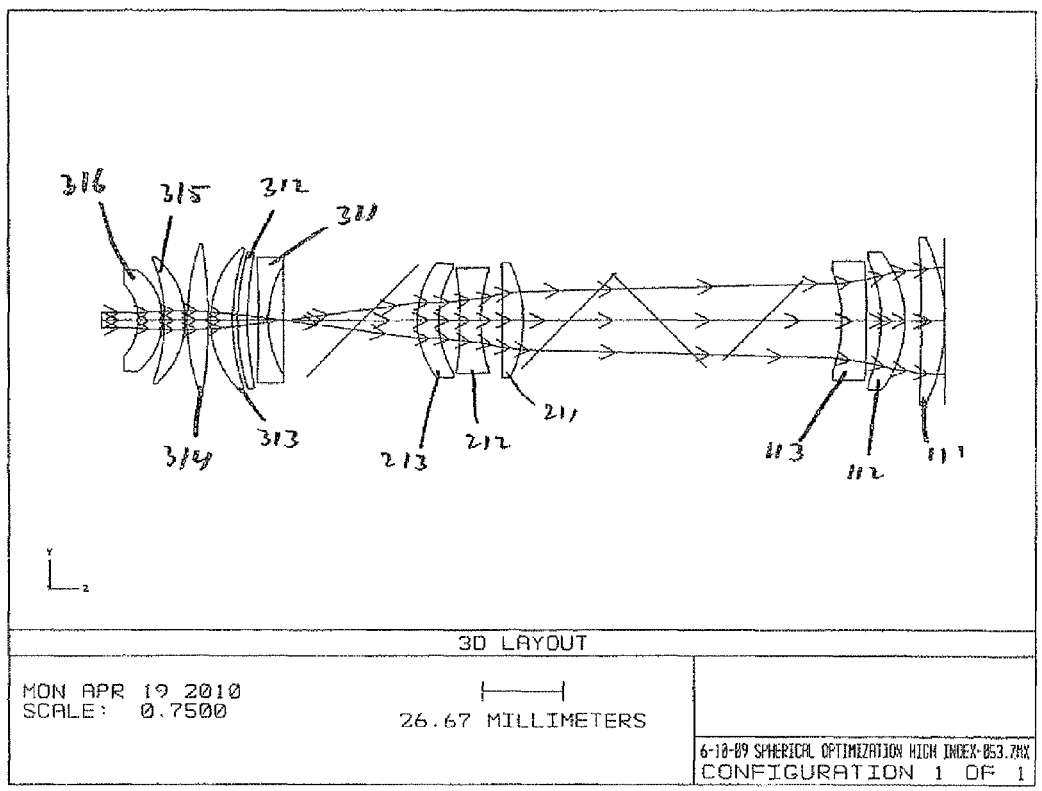
FIG. 17 illustrates an unfolded optical design of an embodiment of the present invention in which a power corrector is added between the objective lens.

FIG. 17 illustrates an explicit optical design of an embodiment of the present invention wherein a power corrector is added between the objective lens and the eyepiece. Table 2 shows the optical properties of the lenses of FIG. 17. All lengths are in millimeters.

Figure 18:
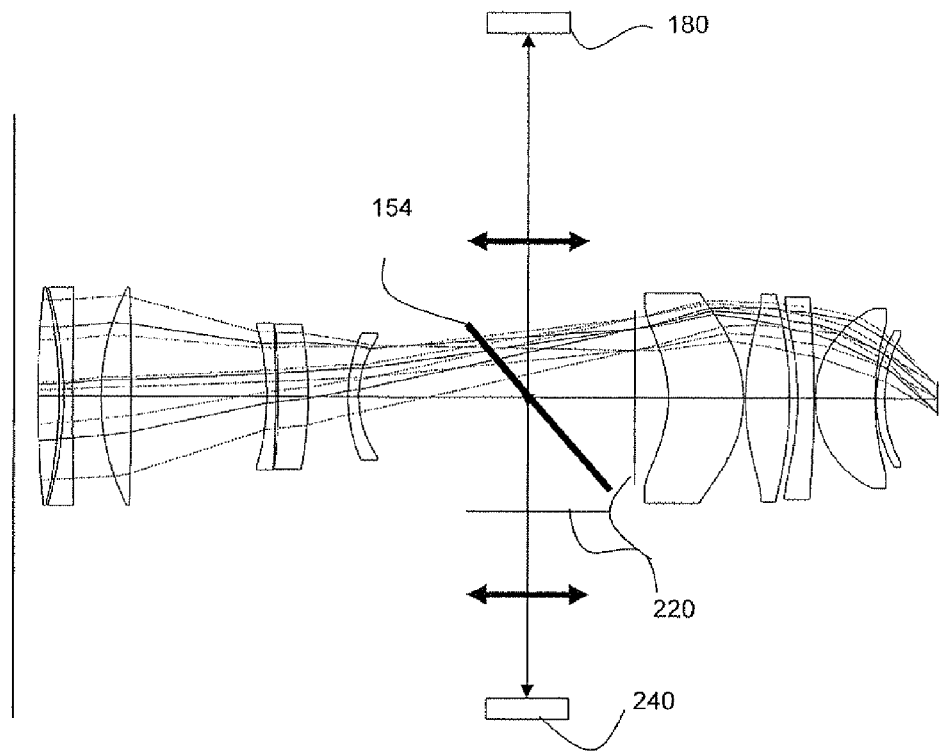
FIG. 18 illustrates an unfolded optical design of an embodiment of the present invention in which a beam splitter is placed inside the system to couple optically the optical system to other optical systems.

FIG. 18 illustrates an unfolded optical design of an embodiment of the present invention in which a beam splitter 154 is placed inside the system. In this configuration, a real image is formed on two separate intermediate image planes 220. Thus, the scene that is viewed by the viewer can be imaged on an imaging device 240 and transmitted to other viewers. Conversely, any auxiliary real image can be imaged on the two intermediate image planes 220 of the system by an imaging system 180. This auxiliary real image can be used to provide data or instructions to the viewer. Since this auxiliary real image is imaged on the two intermediate image planes 220 of the system, this auxiliary real image can also be imaged on an imaging device 240 and transmitted to other viewers. It is to be understood that any optical device known in the art can be placed inside the system in order to transmit the scene that is viewed by the viewer to other viewers and conversely, any imaging system known in the art can be used to image a real image in the intermediate image plane of the system to provide data or instructions to the viewer. It is also to be understood that this configuration can be utilized in any imaging optical systems known in the art, for any application. It can be utilized when both optical systems 180 and 240 are presented or when only one of them is presented.

Figure 19:
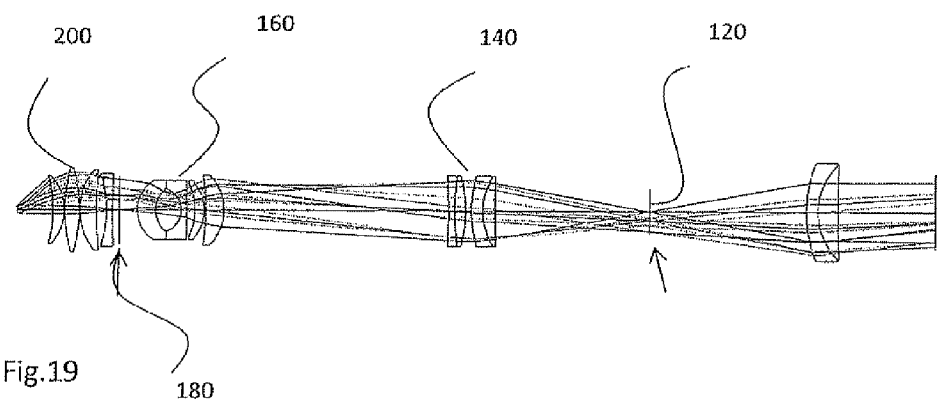
FIG. 19 illustrates an embodiment of the present invention that enables visualization outside the visible spectrum with a wide field of view.

FIG. 19. illustrates an embodiment of the present invention that enables visualization of objects with a non-visible spectrum with large FOV by converting the non-visible spectrum into a visible spectrum. This configuration is realized by incorporating an optical device such as a thermal camera or a light intensifier in the first intermediate image plane 120. A relay 140 transfer the visible image in the first intermediate plane 120 to a second intermediate image plane 180 and this image is imaged by the eyepiece 200. The power corrector

TABLE 2

| Abbe Number | Index of refraction | Radii of curvature | separation | thickness | Semi-diameter | lens |
|---|---|---|---|---|---|---|
| 64.8 | 1.52 | −65.0410203 | | 7.6592387 | 27.4277571 | 111 |
| | | −523.819380 | | | | |
| 56.0 | 1.57 | −36.5617481 | 5.3892812 | 8.0017593 | 22.6073137 | 112 |
| | | −51.6289230 | | | | |
| 23.8 | 1.85 | −330.036272 | 4.7147552 | 7.9908638 | 19.5727740 | 113 |
| | | −45.4689022 | | | | |
| 40.8 | 1.88 | −41.9752087 | | 7.0002947 | 18.8181707 | 211 |
| | | −999.332960 | | | | |
| 64.2 | 1.52 | 56.2862774 | 7.0000082 | 6.9971012 | 17.1967368 | 212 |
| | | −109.496941 | | | | |
| 25.7 | 1.78 | 33.4947694 | 7.0429857 | 7.0141253 | 18.6996903 | 213 |
| | | 31.4220682 | | | | |
| 23.8 | 1.85 | 34.9929011 | | 3.1905322 | 20.5765711 | 311 |
| | | −455.572833 | | | | |
| 23.8 | 1.85 | 106.1386697 | 3.6189674 | 3.2221085 | 22.4001670 | 312 |
| | | 77.2207996 | | | | |
| 40.8 | 1.88 | 68.2975888 | 1.6773162 | 7.2449578 | 23.7483264 | 313 |
| | | 32.3655191 | | | | |
| 49.6 | 1.77 | −168.314391 | 0.7997421 | 6.8382329 | 24.9195544 | 314 |
| | | 75.9474172 | | | | |
| 35.0 | 1.80 | −27.0765197 | 0.7687312 | 6.8303099 | 20.9808211 | 315 |
| | | −53.0600934 | | | | |
| 40.8 | 1.88 | −21.0815007 | 0.8002871 | 8.0267396 | 16.6620691 | 316 |
| | | −17.4719018 | | | | |

In FIG. 17, lenses 111, 112 and 113 are the lenses of the objective, lenses 211, 212 and 213 are the lenses of the power corrector and lenses 311, 312, 313, 314, 315 and 316 are the lenses of the eyepiece.

It should be noted that the designs of Tables 1 and 2 are given only as illustrations and the concept described in the present patent application is not limited to these specific designs.

160 serves the relay in this optical system in the same way as it serves the objective lens in the optical systems described above that lack relays. Thus the power corrector may have optical power and corrects the eyepiece's aberrations. The optical device converts the non-visible spectrum image into a visible spectrum image. This optical layout is suitable for night vision. The optical device can be any imaging device or even a non-optical imaging device such as a polarization transformer, a wavelength transformer, a frequency transformer or an ultrasound device. Possible applications for such optical system include: thermal infrared binoculars/goggles, visual thermal imaging systems, thermal long range binoculars, compact thermal viewer, fusion thermal imager, night vision system, night vision scope, night vision goggle, thermal weapon sight, and thermal-eye system, which is a robust infrared camera that is applicable for a wide variety of FLIR technology applications such as security, surveillance and condition monitoring.

FIGS. 20-42 illustrate further embodiments of the present invention. The design principles of these embodiments can be used to produce telescopes of up to at least 70x optical power. Telescopes of these sorts may be designed for zoom operation as well, with various magnifications ranges, by movement of the eyepiece and the power corrector.

In FIGS. 20, 23, 24, 27, 28, 31-33, 37 and 40, rays pass from left to right, and this also is the order of the optical surfaces in FIGS. 21, 25, 29, 34, 35, 38 and 41.

The lenses in these embodiments are simple spherical optical lenses, made from Schott glasses (as specified in FIGS. 21, 25, 29, 34, 35, 38 and 41). This feature underlines the inherent simplicity and manufacturability of such designs. Alternatively, in other embodiments of the present invention, optical systems with power correctors may includes aspherical and/or diffractive elements as appropriate to meet design goals.

Figure 20:
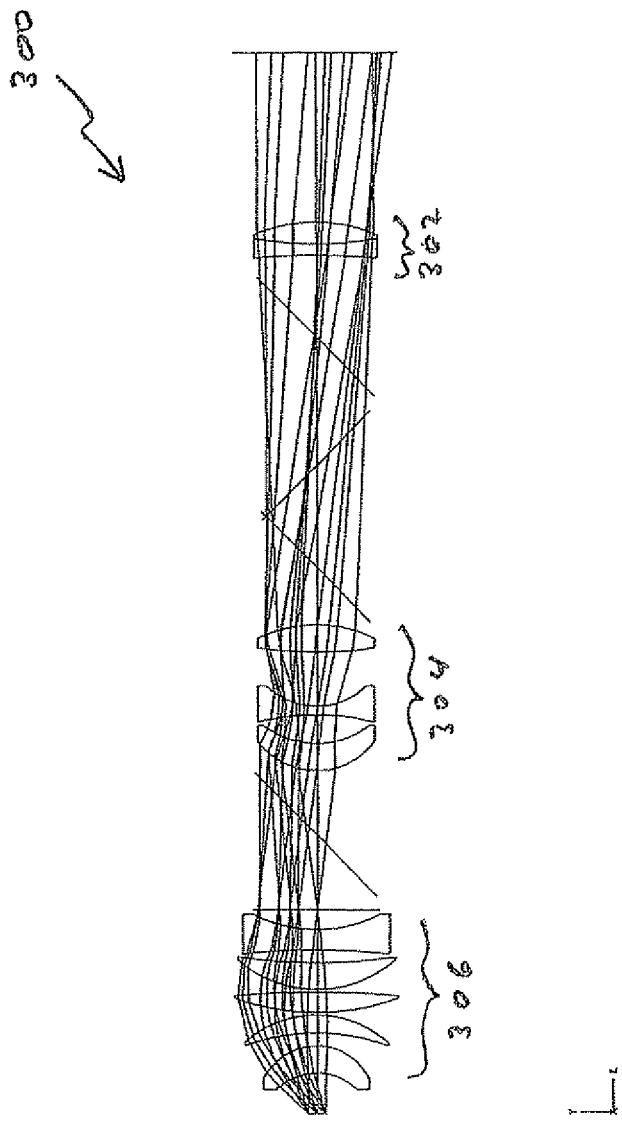
Figure 22:
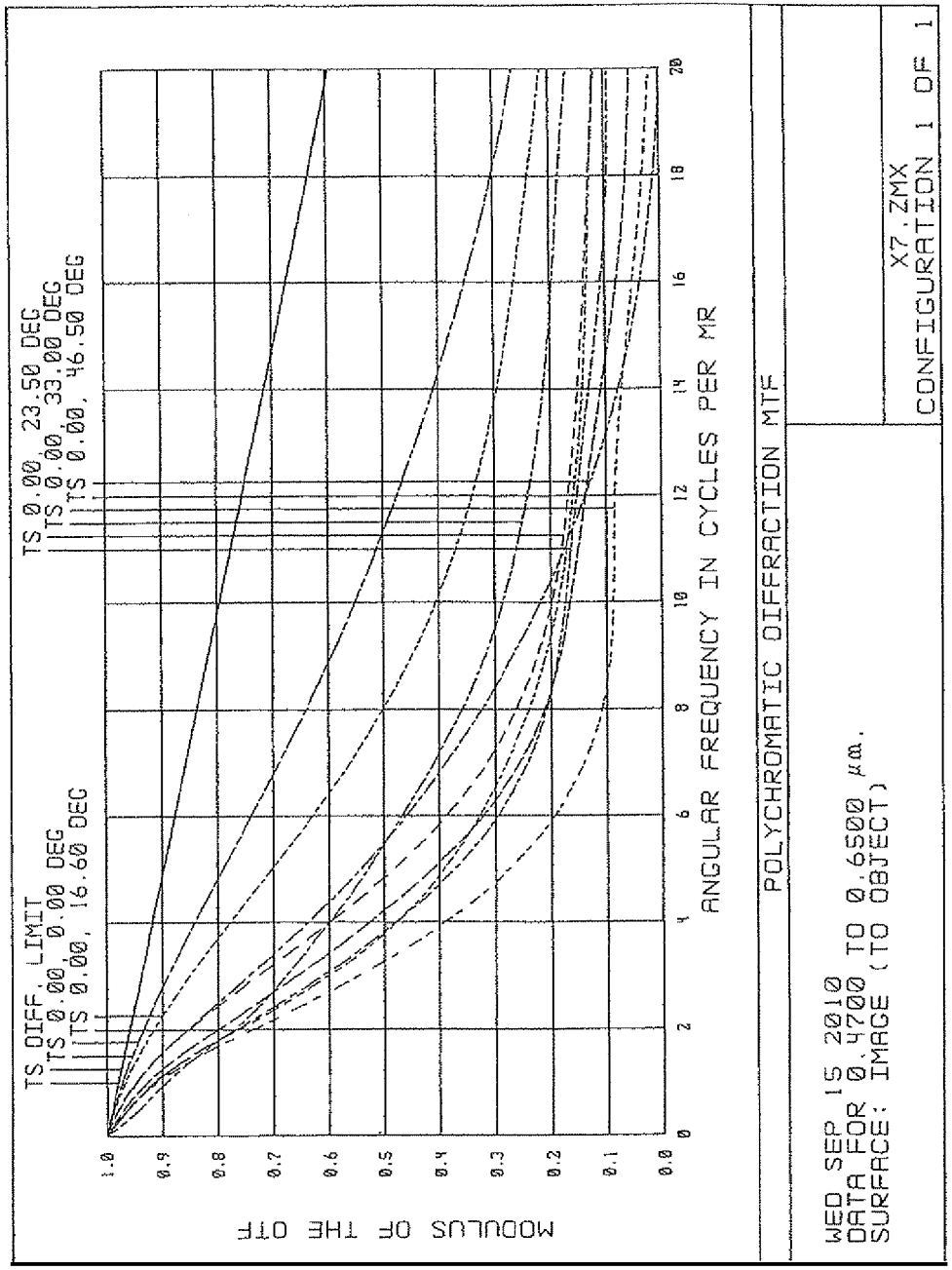

FIGS. 20-22 illustrate a monocular/binocular 300 with 7× magnification. FIG. 20 is an unfolded ray tracing diagram that shows the placement of objective lens group 302, power corrector lens group 304 and eyepiece lens group 306 within monocular/binocular 300. FIG. 21 is a table of optical properties of the lenses of monocular/binocular 300. FIG. 22 shows modular transfer functions of monocular/binocular 300.

Figure 23:
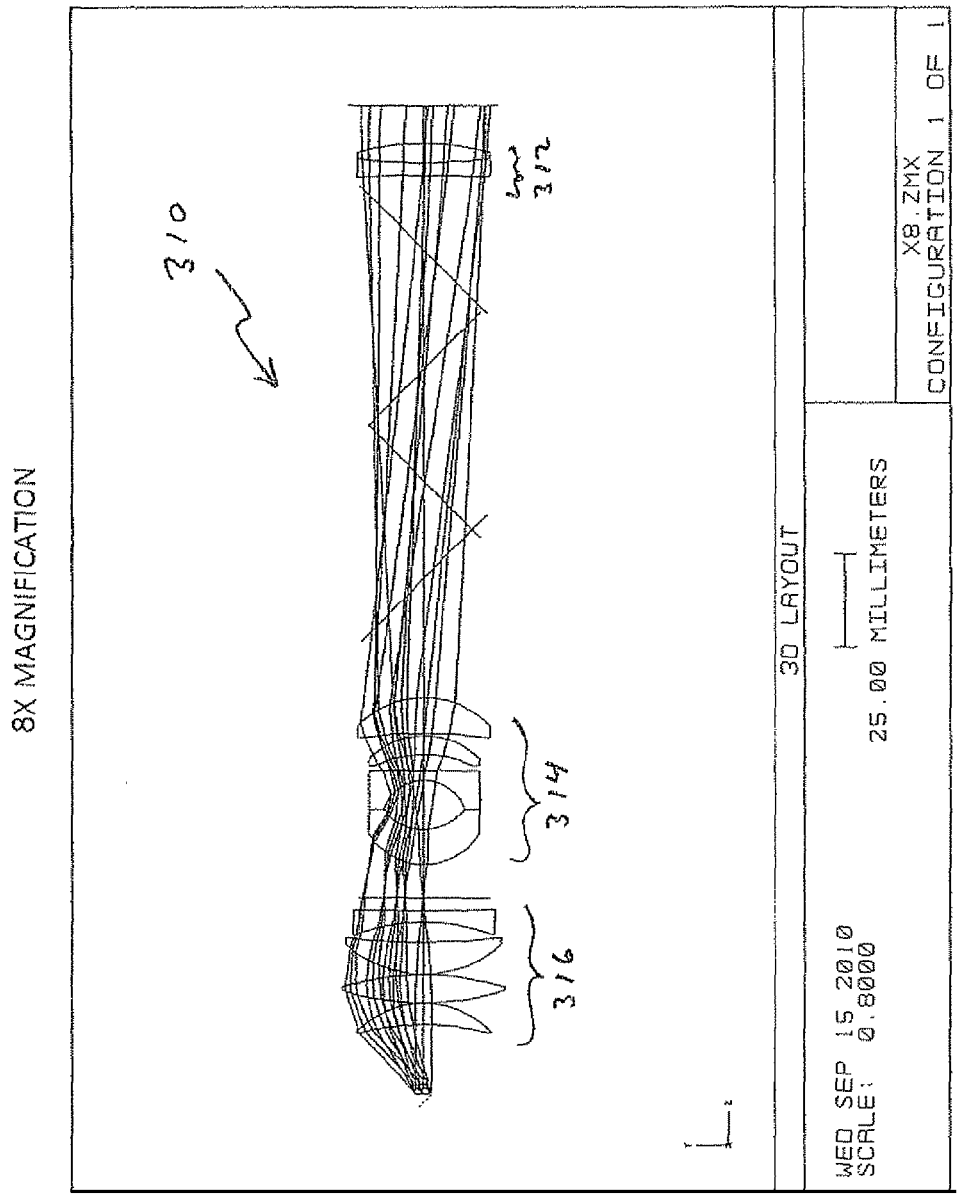
Figure 24:
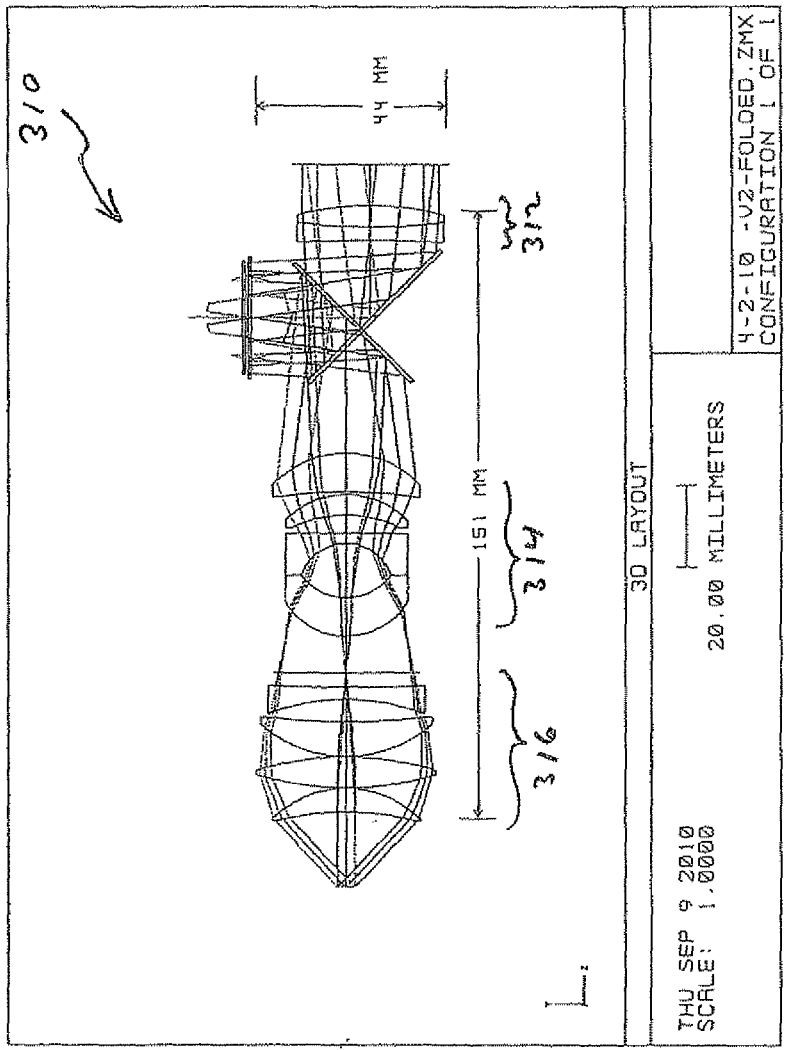
Figure 26:
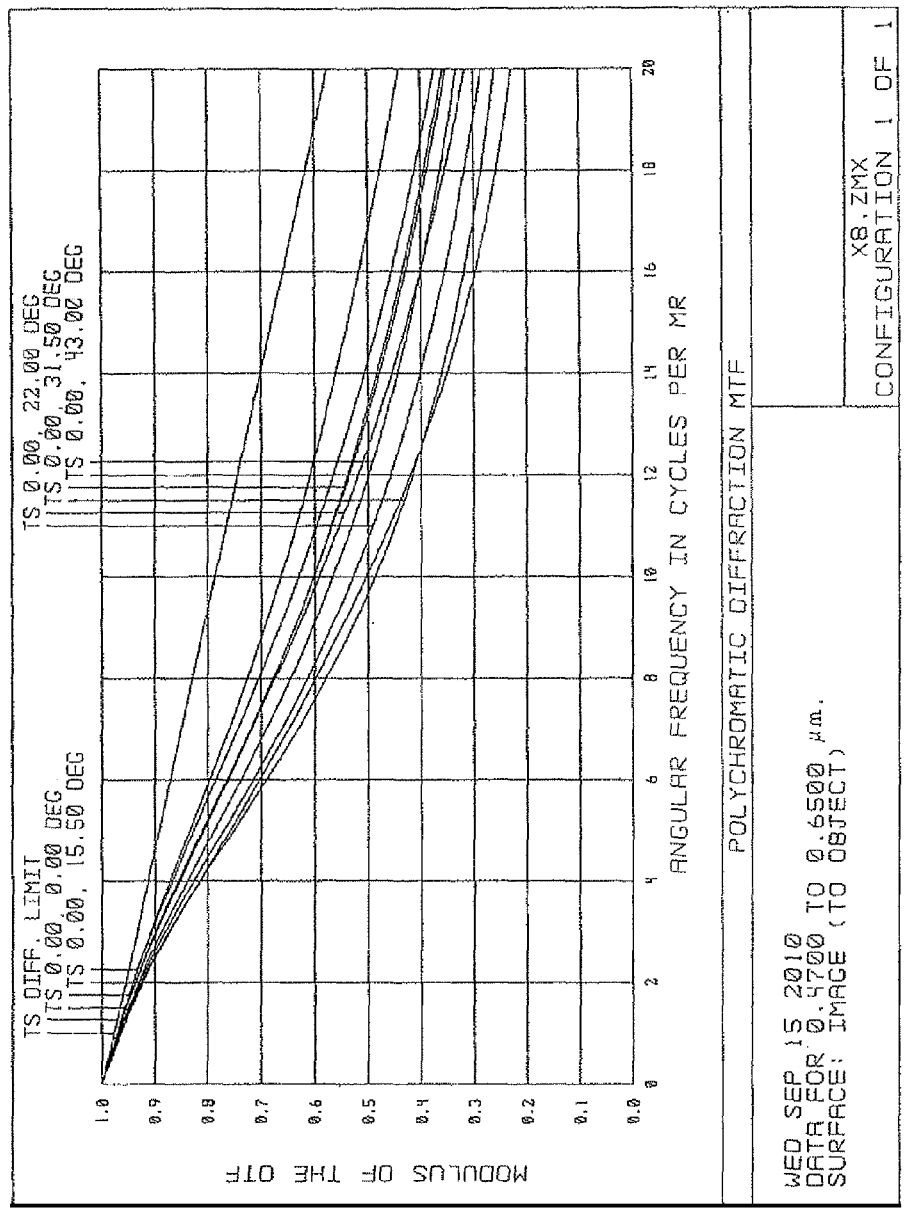

FIGS. 23-26 illustrate a monocular/binocular 310 with 8× magnification. FIG. 23 is an unfolded ray tracing diagram that shows the placement of objective lens group 312, power corrector lens group 314 and eyepiece lens group 316 within monocular/binocular 310. FIG. 24 shows lens groups 312, 314 and 316 in their folded configuration. FIG. 25 is a table of optical properties of the lenses of monocular/binocular 310. FIG. 26 shows modular transfer functions of monocular/binocular 310.

Figure 27:
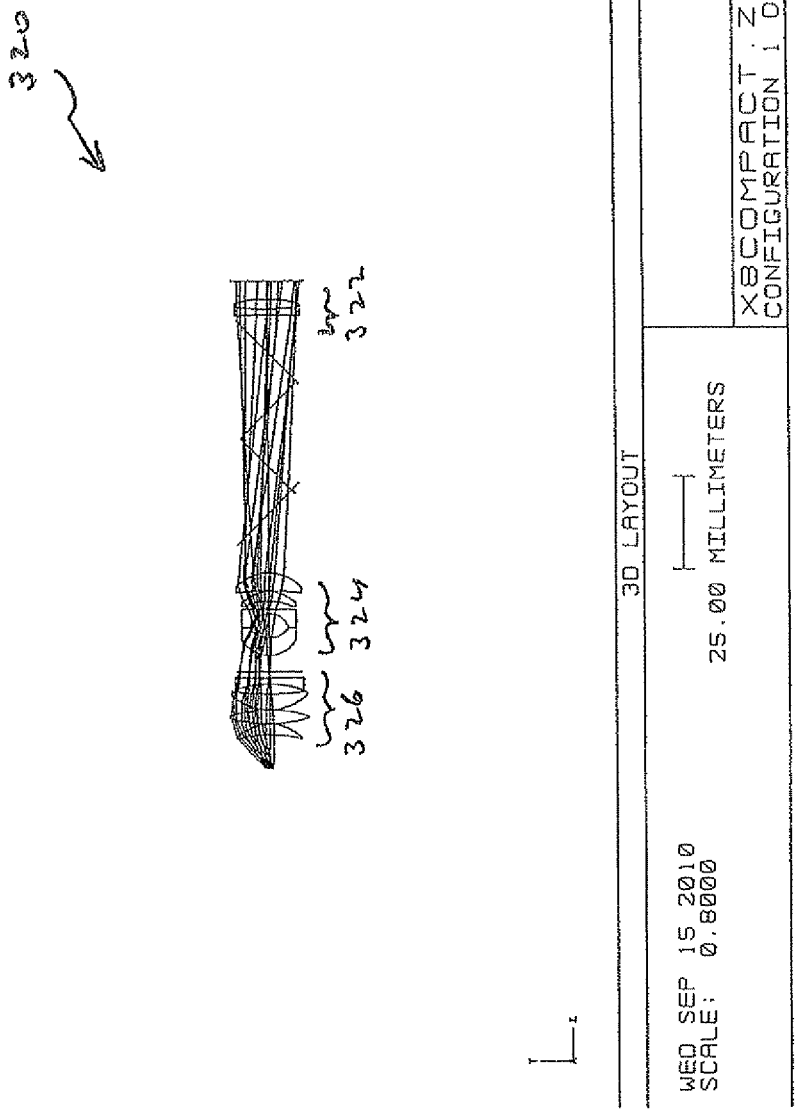
Figure 28:
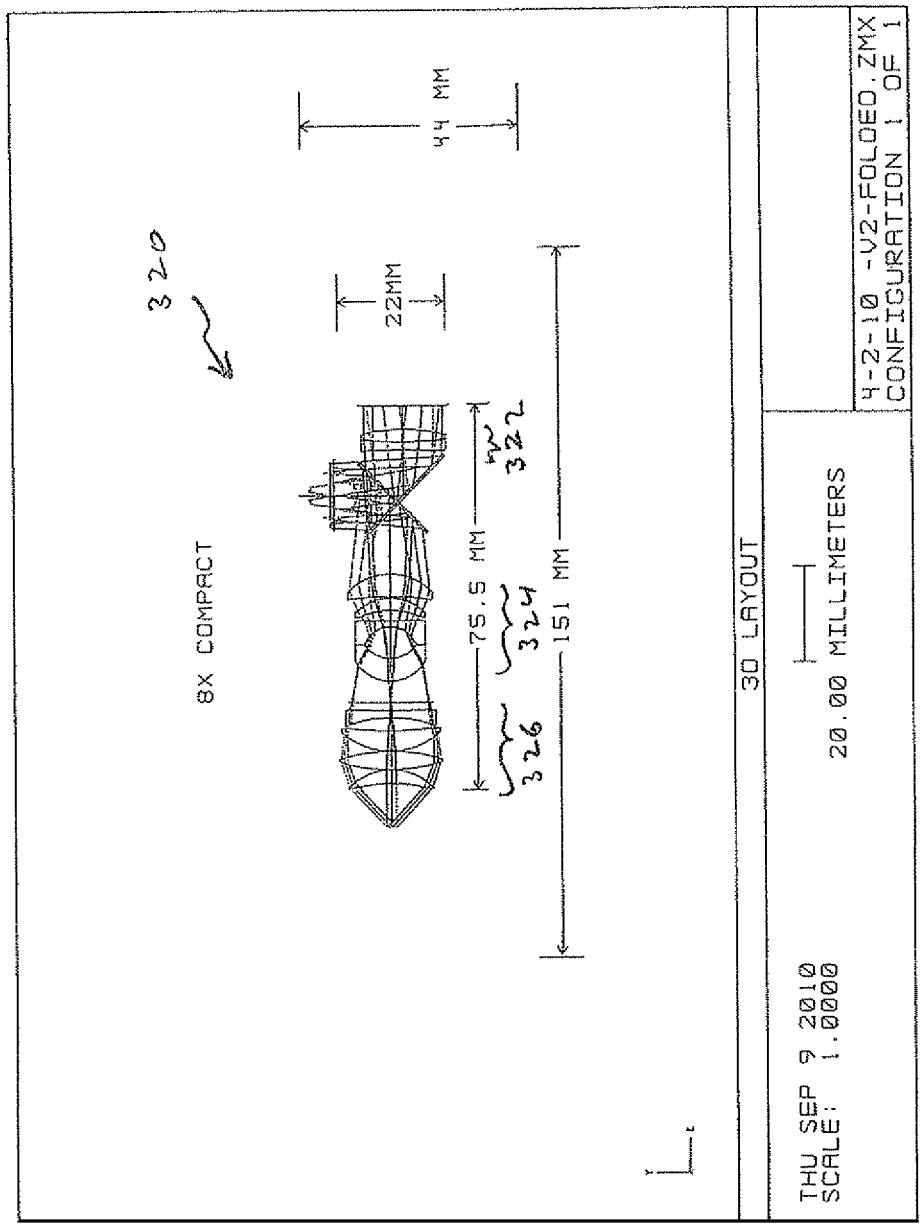
Figure 30:
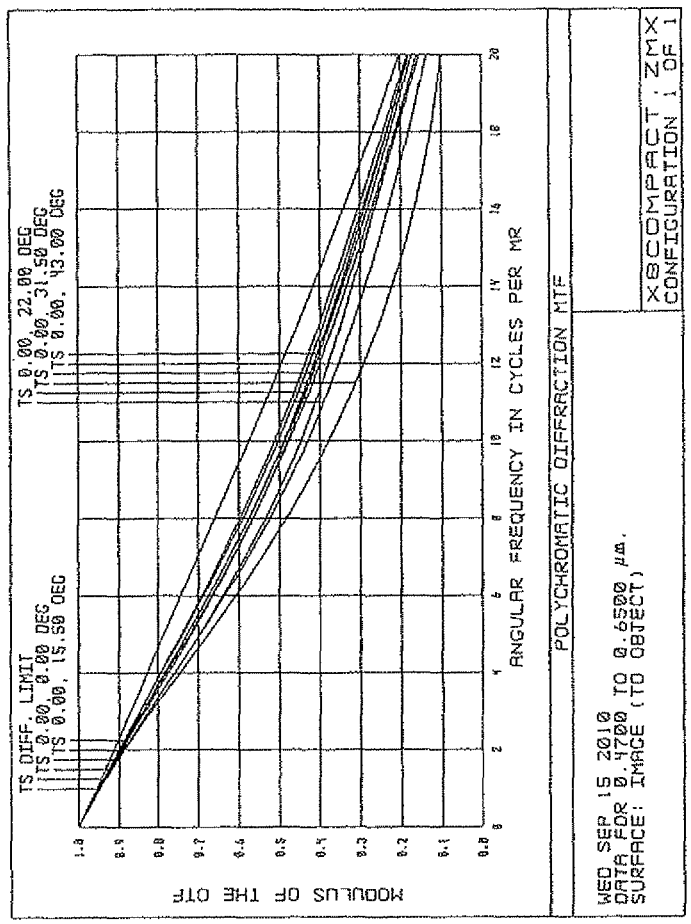

FIGS. 27-30 illustrate a monocular/binocular 320 that is similar to monocular/binocular 310 but scaled down by a factor of two. The design of monocular/binocular 320 preserves the wide FOV of monocular/binocular 310 while halving overall size, at the expense of smaller eye relief and a smaller exit pupil diameter. The other monocular/binoculars described herein may be scaled down or scaled up similarly. FIG. 27 is an unfolded ray tracing diagram that shows the placement of objective lens group 322, power corrector lens group 324 and eyepiece lens group 326 within monocular/binocular 320. FIG. 28 shows lens groups 322, 324 and 326 in their folded configuration. FIG. 29 is a table of optical properties of the lenses of monocular/binocular 320. FIG. 30 shows modular transfer functions of monocular/binocular 320.

Figure 31:
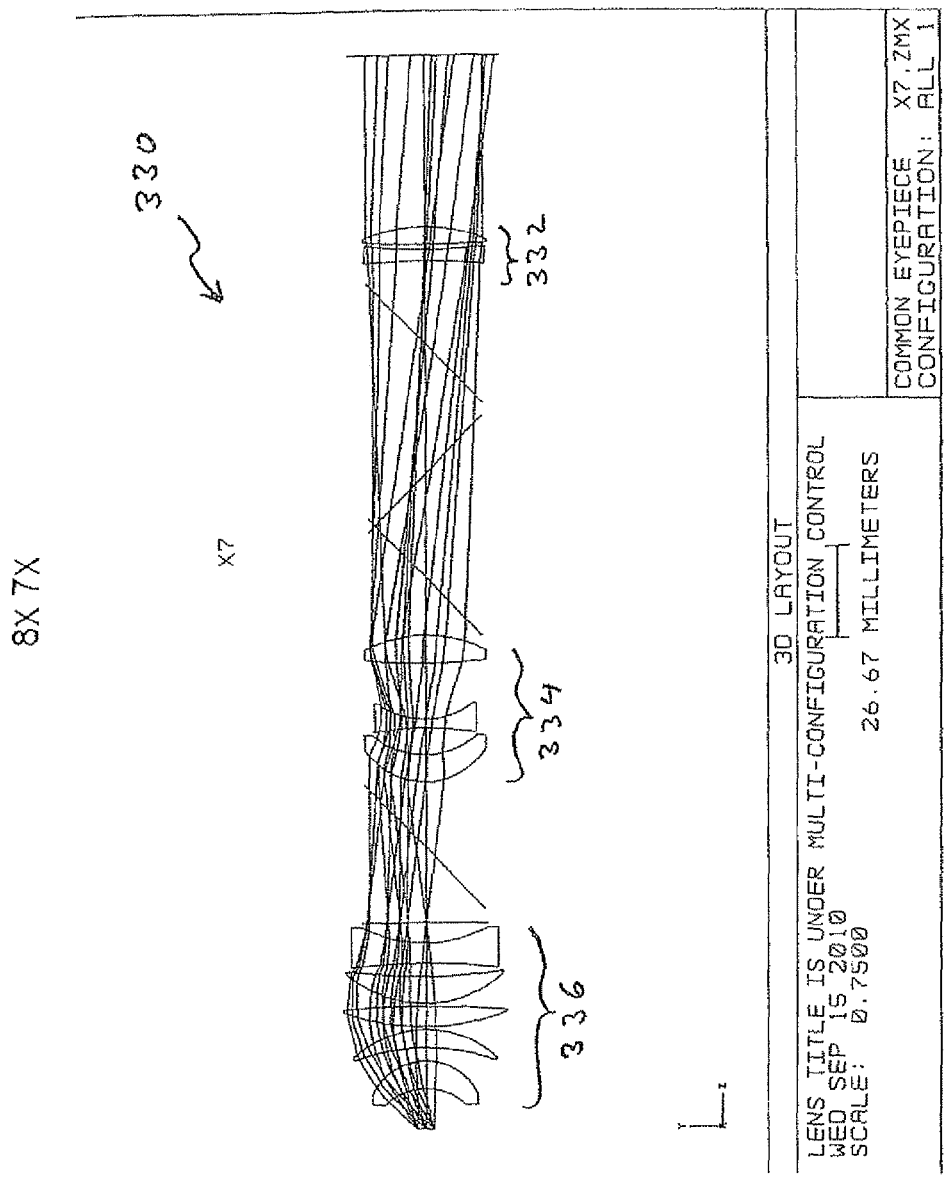
Figure 32:
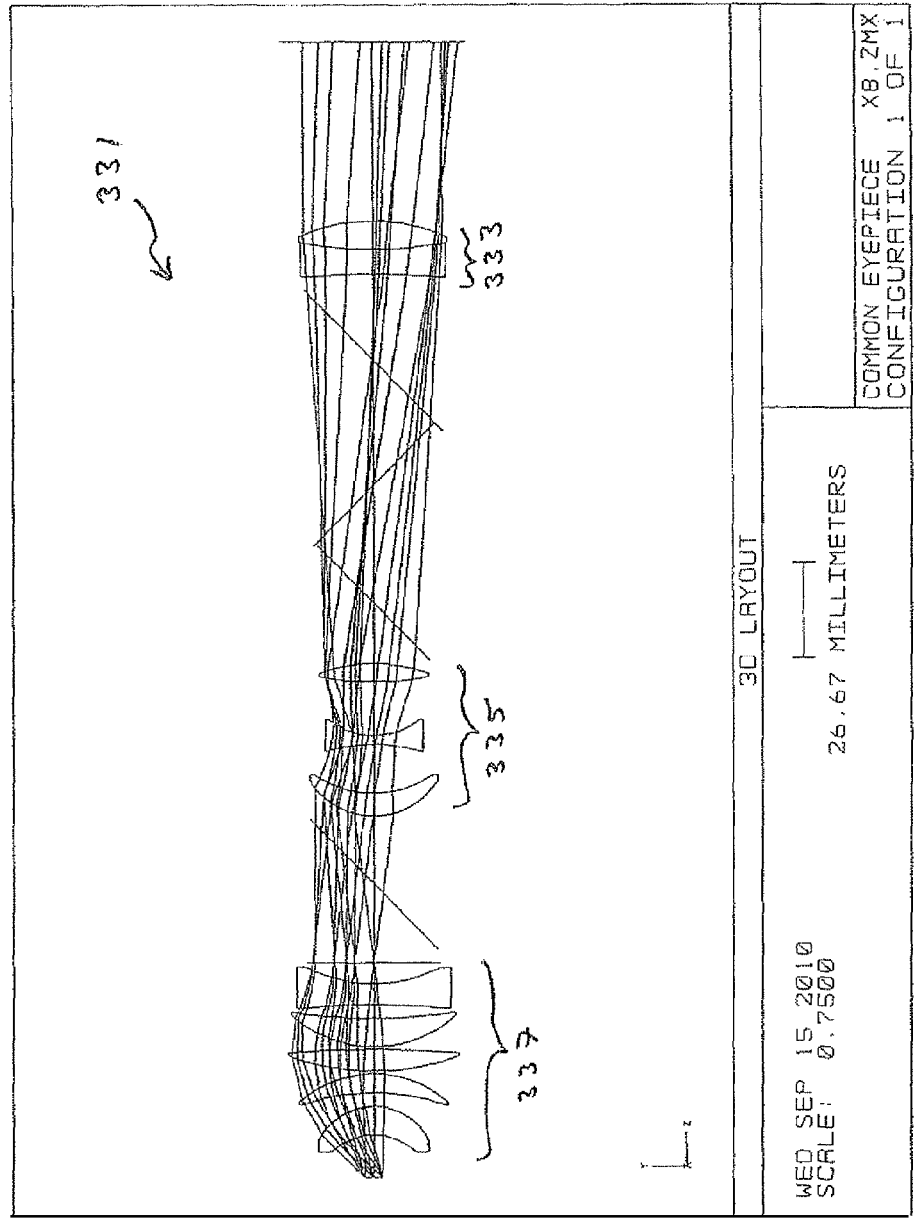
Figure 33:
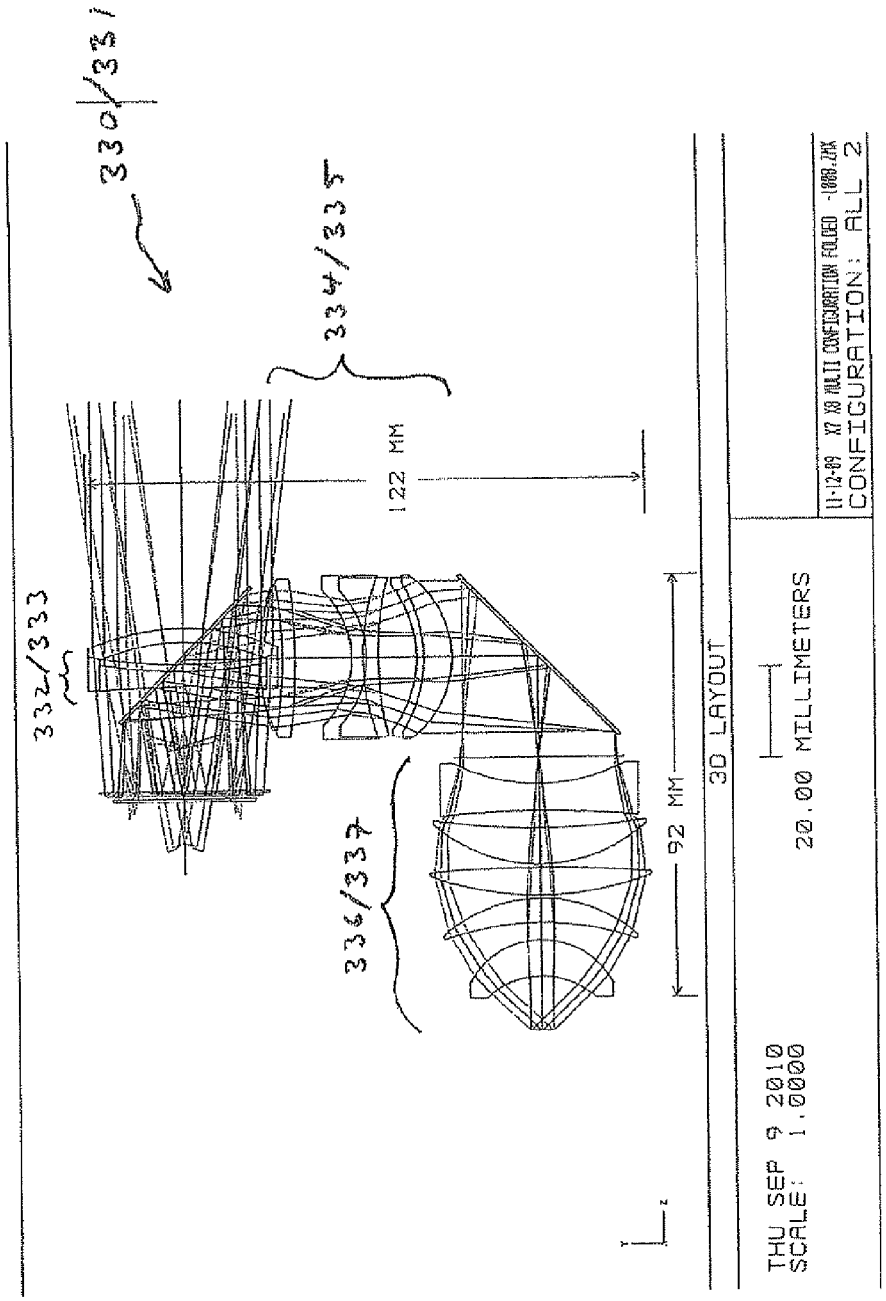
Figures 36A, 36B:
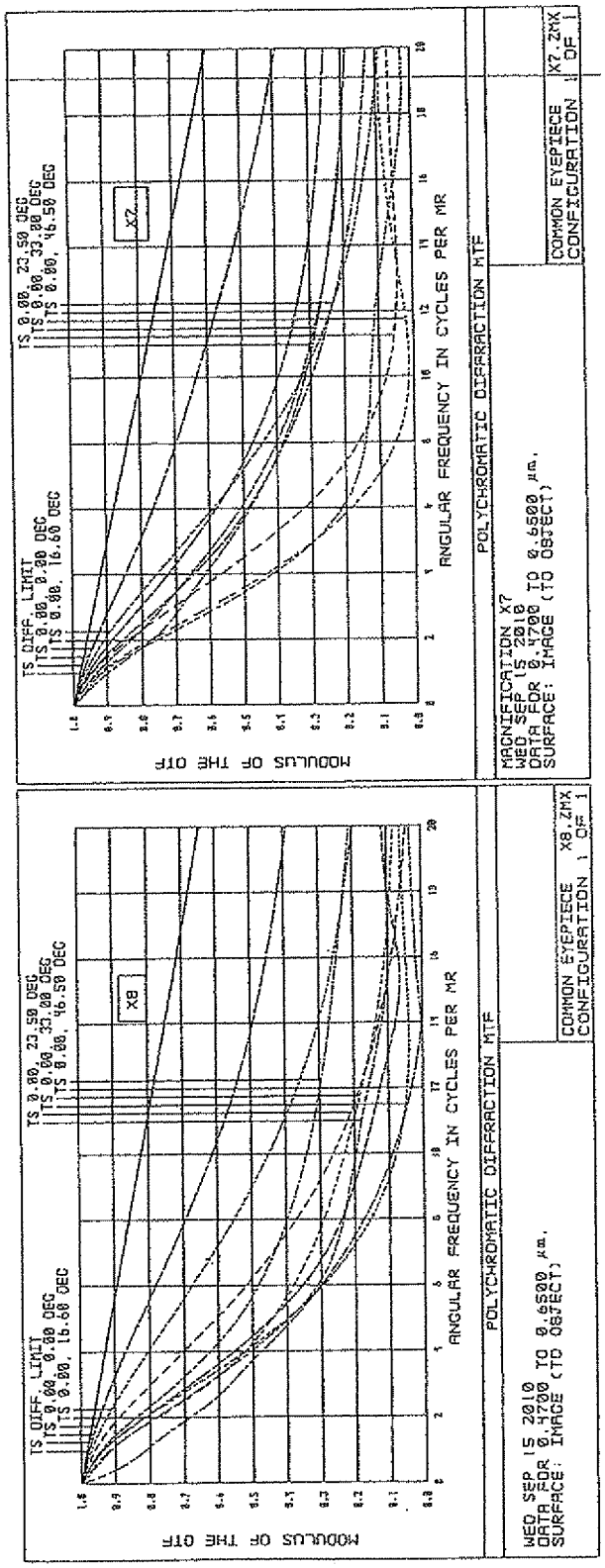

FIGS. 31-36B illustrate a monocular/binocular design with either 7× magnification (monocular/binocular 330) or 8× magnification (monocular/binocular 331). This design demonstrates that the same eyepiece and mirrors, in the same location in a given mechanical package, can be used to make telescopes of different powers by assembling the appropriate objective and power corrector for each case. FIG. 31 is an unfolded ray tracing diagram that shows the placement of objective lens group 332, power corrector lens group 334 and eyepiece lens group 336 within monocular/binocular 330. FIG. 32 is an unfolded ray tracing diagram that shows the placement of objective lens group 333, power corrector lens group 335 and eyepiece lens group 337 within monocular/binocular 331. FIG. 33 shows lens groups 312/313, 314/315 and 316/317 in their folded configuration. FIG. 34 is a table of optical properties of the lenses of monocular/binocular 330. FIG. 35 is a table of optical properties of the lenses of monocular/binocular 331. FIG. 36A shows modular transfer functions of monocular/binocular 330. FIG. 368 shows modular transfer functions of monocular/binocular 331.

Figure 37:
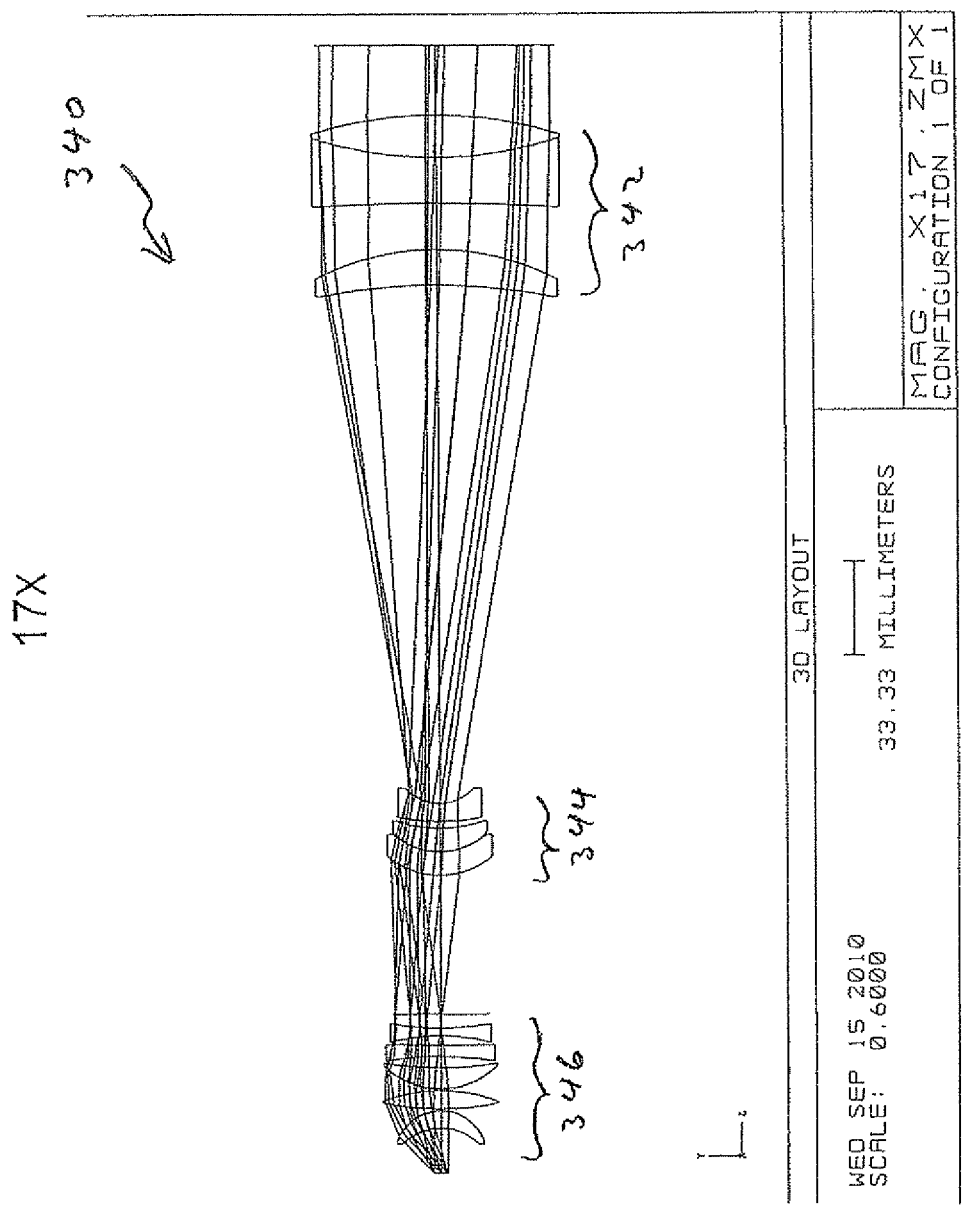
Figure 39:
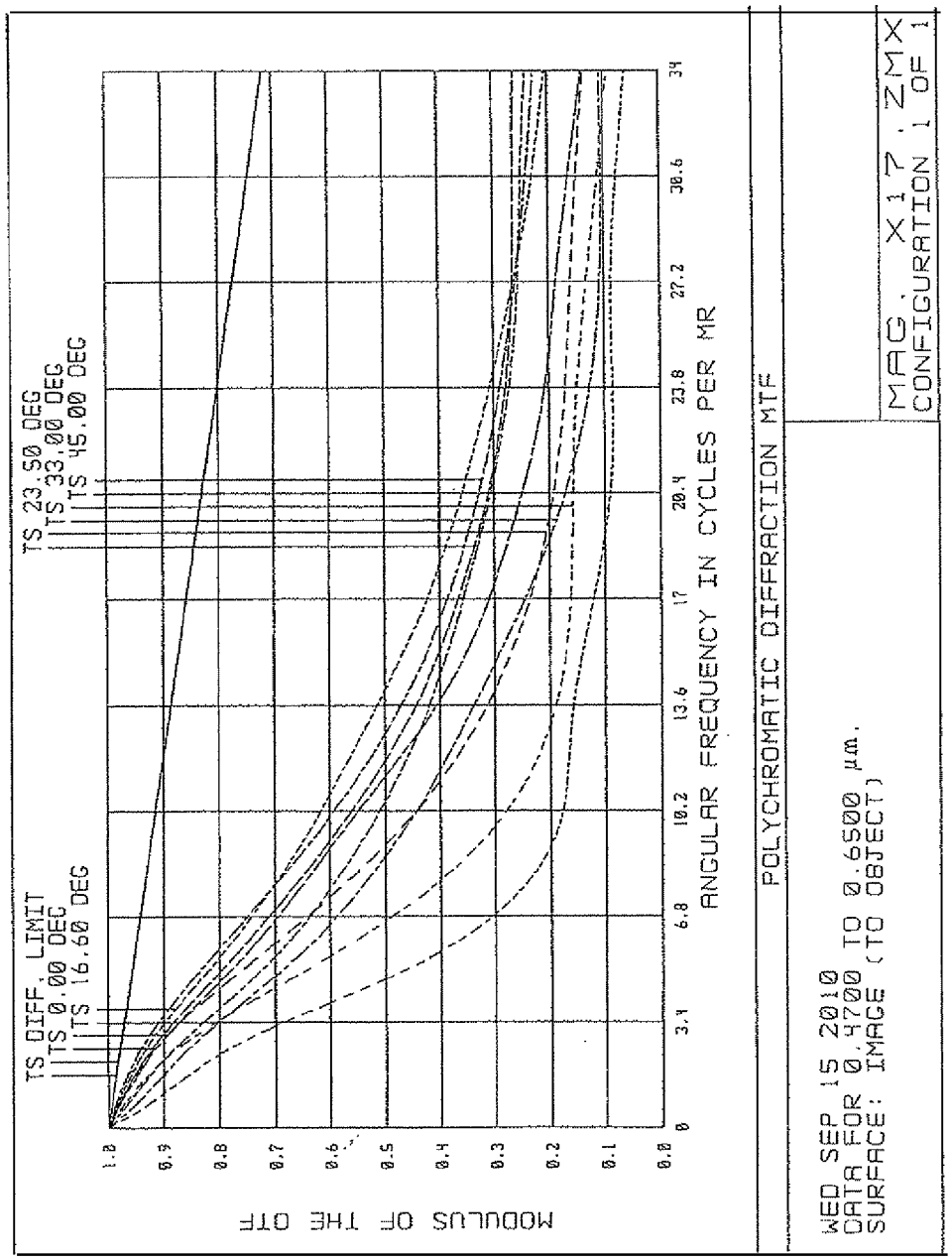

FIGS. 37-39 illustrate a monocular/binocular 340 with 17× magnification. FIG. 37 is an unfolded ray tracing diagram that shows the placement of objective lens group 342, power corrector lens group 344 and eyepiece lens group 346 within monocular/binocular 340. FIG. 38 is a table of optical properties of the lenses of monocular/binocular 340. FIG. 39 shows modular transfer functions of monocular/binocular 340.

Figure 40:
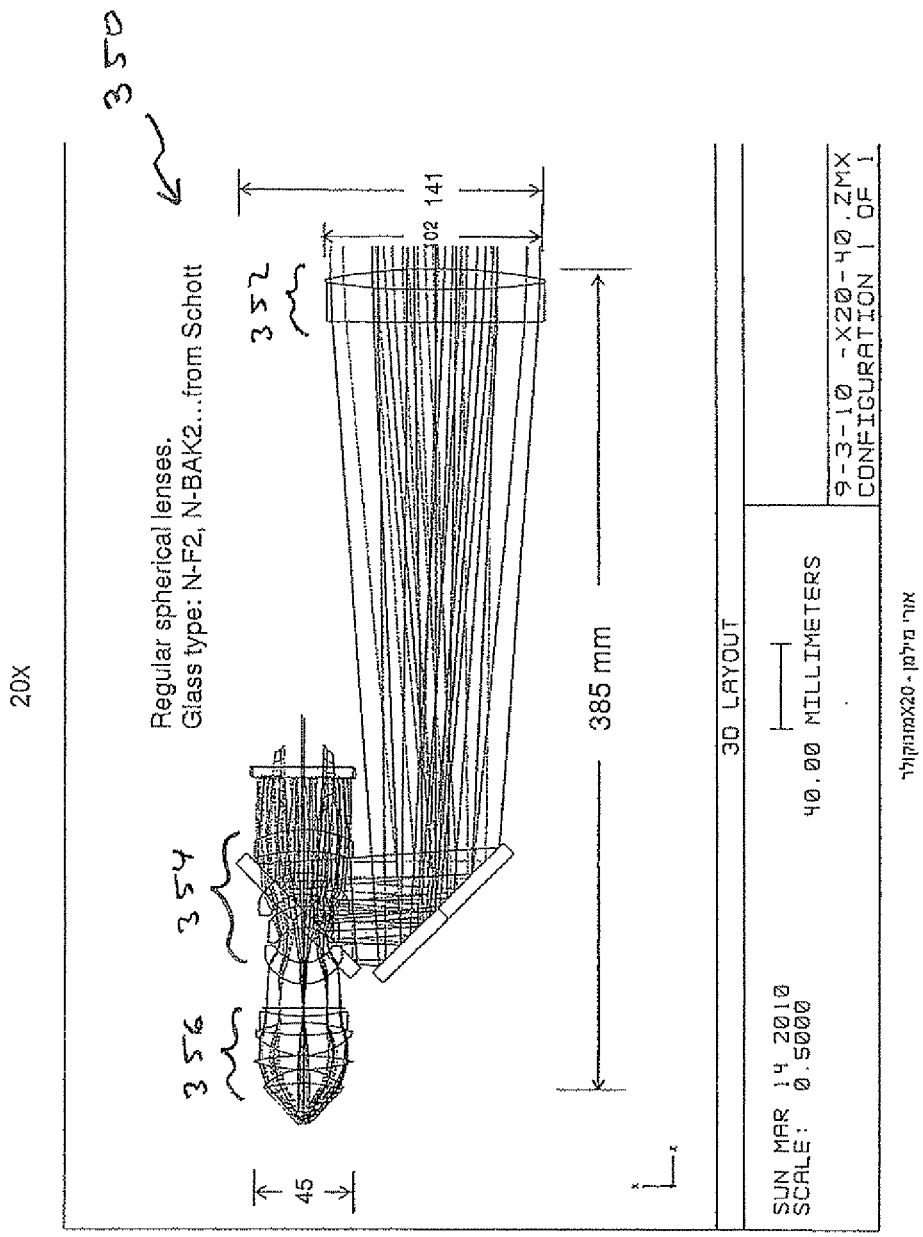
Figure 42:
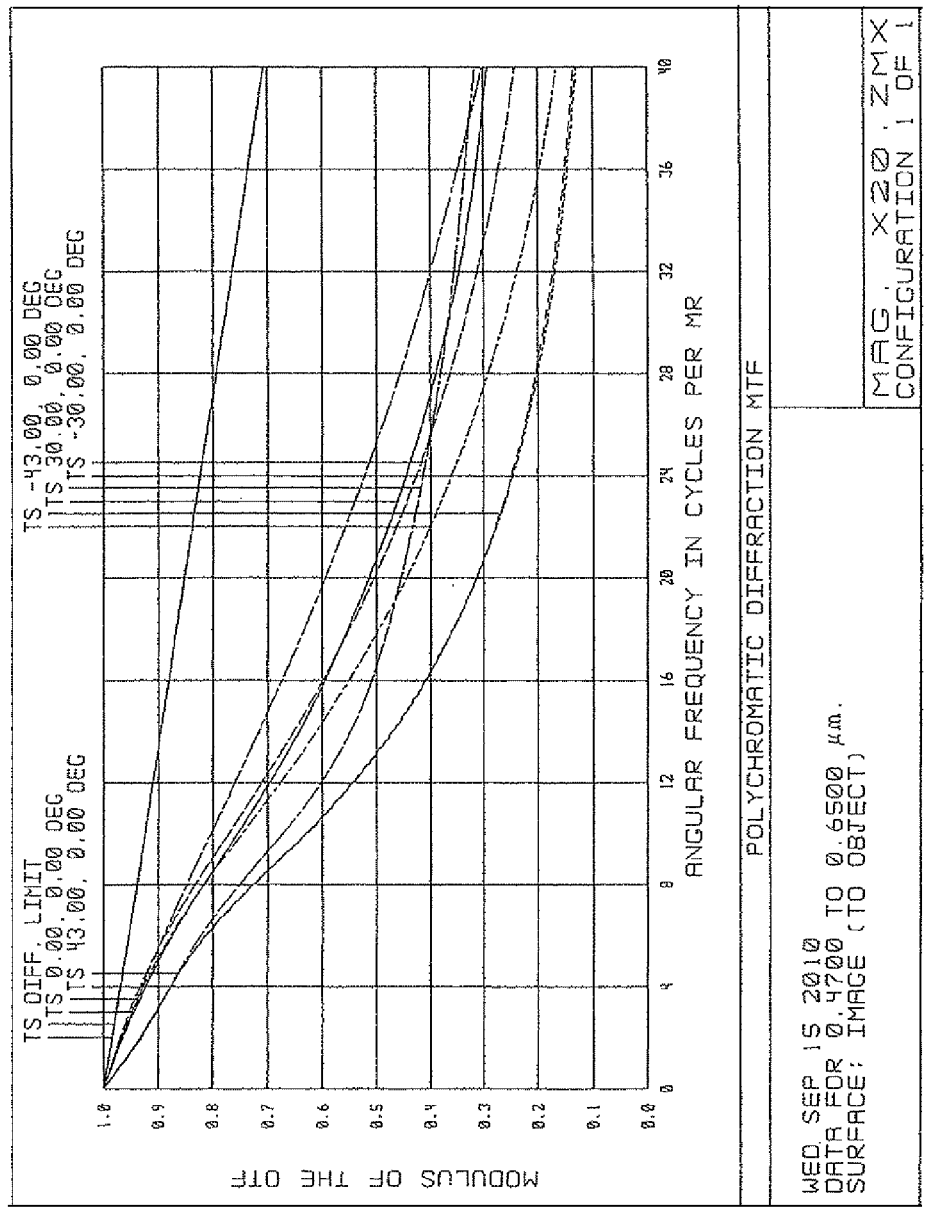

FIGS. 40-42 illustrate a monocular/binocular 350 with 20× magnification. FIG. 40 is a folded ray tracing diagram that shows the placement of objective lens group 352, power corrector lens group 354 and eyepiece lens group 356 within monocular/binocular 350. FIG. 41 is a table of optical properties of the lenses of monocular/binocular 350. FIG. 42 shows modular transfer functions of monocular/binocular 350.

Tables 3 and 4 summarize the optical properties of the embodiments of FIGS. 20-42.

TABLE 3

| Embodiment | Eyepiece focal length (mm) | Objective focal length (mm) | Power corrector focal length (mm) | Separation between objective and power corrector (mm) | Combined objective and power corrector focal length (mm) |
|---|---|---|---|---|---|
| 300 | 19 | 378.5 | 129.26 | 139.83 | 132.9734189 |
| 310 | 19 | 302.018 | 250.559 | 54.57 | 151.9523381 |
| 320 | 9.5 | 151.009 | 125.2795 | 27.285 | 75.97616907 |
| 330 | 19 | 132.829 | 132.829 | 133.378 | 133.0015719 |
| 331 | 19 | 145.496 | 145.496 | 158.288 | 151.9986145 |
| 340 | 19 | 306 | 306 | 321.42 | 326.2572447 |
| 350 | 20 | 471.541 | 471.541 | 351.295 | 399.4985743 |

TABLE 4

| Embodiment | Magnification | Apparent field of view (degrees) | Real field of view (degrees) |
|---|---|---|---|
| 300 | 7 | 93 | 17.1 |
| 310 | 8 | 86 | 13.3 |
| 320 | 8 | 86 | 13.3 |
| 330 | 7 | 93 | 17.1 |
| 331 | 8 | 93 | 17.1 |
| 340 | 17 | 93 | 7.1 |
| 350 | 20 | 86 | 5.34 |

FIGS. 43-54 compare an embodiment 410 of the present invention with a similar telescope 400 of the prior art. All the lenses in these two configurations are of the standard spherical type. Table 5 presents the basic specifications of the two configurations.

TABLE 5

| Parameter | Configuration 410 | Configuration 400 |
|---|---|---|
| Magnification | 8 | 8 |
| Apparent FOV (degrees) | 86 | 86 |
| Eyepiece focal length (mm) | 19 | 19 |
| Objective focal length (mm) | 152 (combined power corrector and objective) | 152 |
| Eye relief (mm) | 18.5 | 11.2 |
| Exit pupil diameter (mm) | 4.2 | 4.2 |
| Number of lenses | 10 | 10 |
| Image rotation using . . . | Four mirrors | Four mirrors |
| Total length (mm) | 273.5 | 275 |

Figure 49:
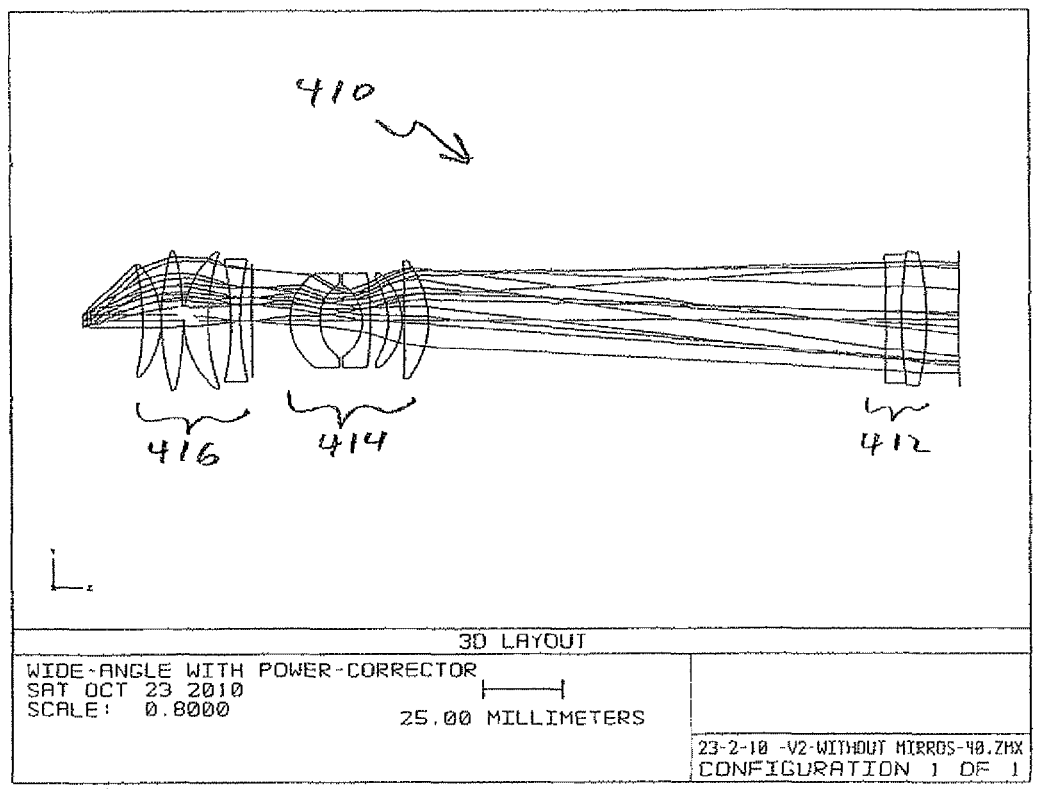

FIG. 43 is an unfolded ray tracing diagram that shows the placement of objective lens group 402 and eyepiece lens group 406 within telescope 400. FIG. 49 is an unfolded ray tracing diagram that shows the placement of objective lens group 412, power corrector lens group 414 and eyepiece lens group 416 within telescope 410. The ray trace direction in both Figures is from left to right, i.e., from the eyepiece to the objective.

FIG. 44 is a table of optical properties of the lenses of telescope 400. FIG. 50 is a table of optical properties of the lenses of telescope 410. Telescope 400, without a power corrector, requires objective lenses 402 of significantly larger diameter than objective lenses 412 of telescope 410 to achieve comparable performance. Telescope 410 with a power corrector is significantly more compact than similarly performing telescope 410 that lacks a power corrector. The diameters of the lenses of eyepiece 416 are all less than twelve times the diameter of the exit pupil. The eye relief of eyepiece 416, which is listed in FIG. 50 as the "thickness" of the exit pupil, is greater than one-quarter of the diameters of any of the lenses of eyepiece 416. None of the lenses of eyepiece 416 have diameters greater than three times the 19 millimeter focal length of eyepiece 416.

Figure 45:
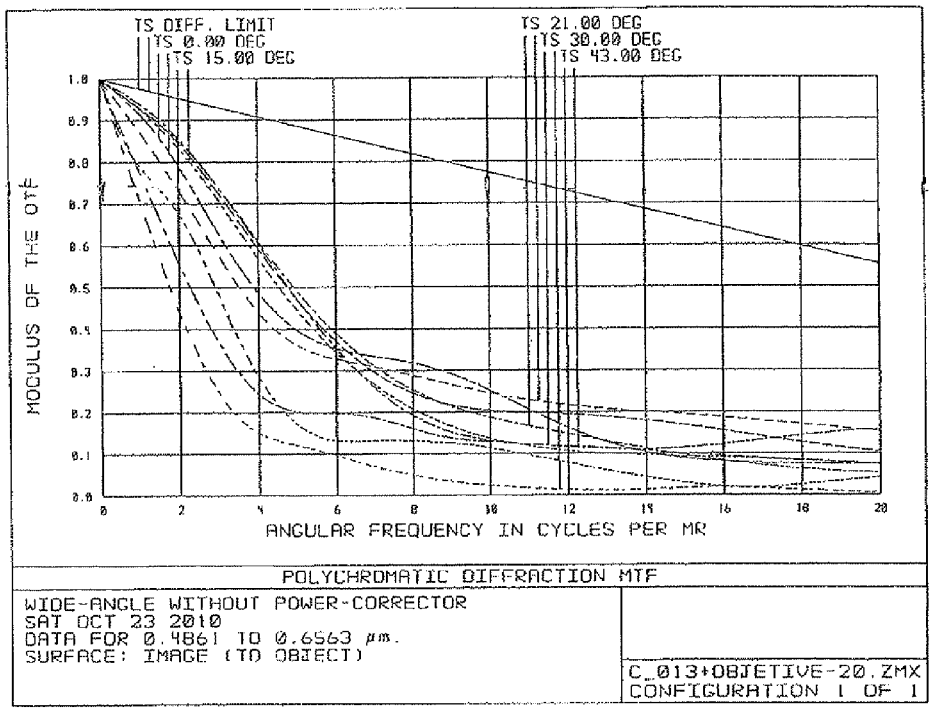
Figure 51:
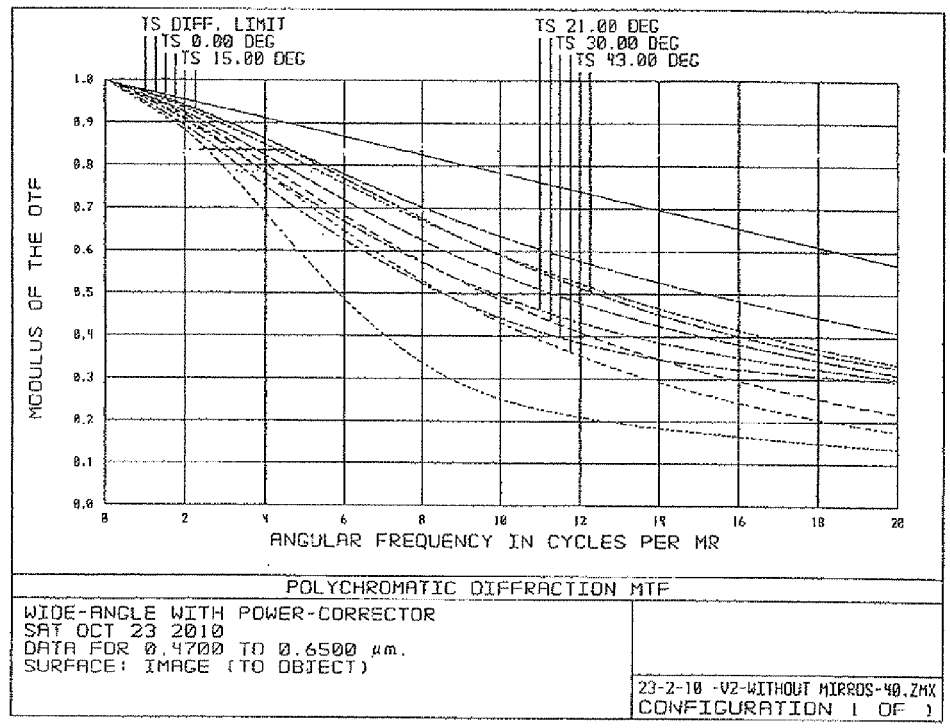

FIG. 45 shows modular transfer functions of telescope 400. FIG. 51 shows modular transfer functions of telescope 410.

Figure 46:
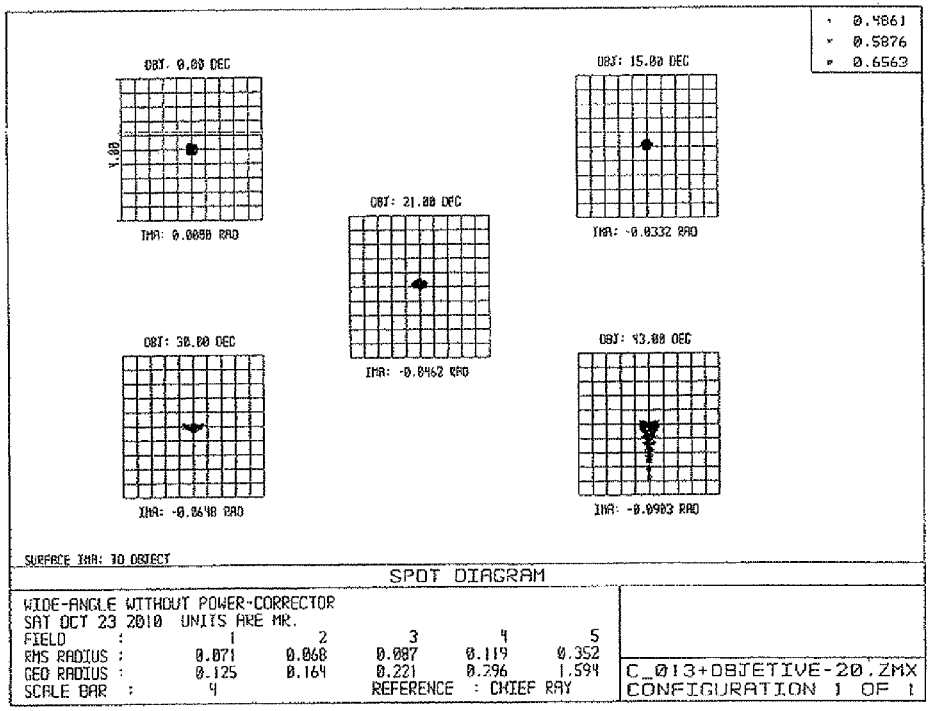
Figure 52:
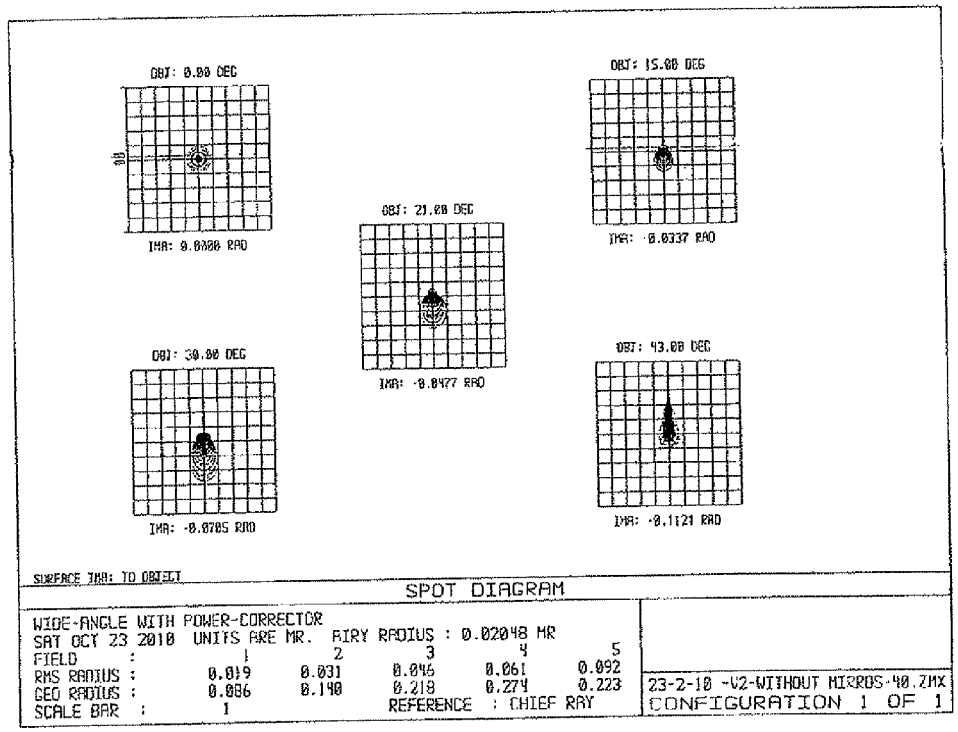

FIG. 46 shows spot diagrams for telescope 400. FIG. 52 shows spot diagrams for telescope 410. Note in particular the upper left and lower right spot diagrams. The upper left spot diagrams correspond to the centers of the exit pupils of their respective telescopes, along the optical axes of their respective telescopes. The lower right spot diagrams correspond to the edges of the exit pupils of their respective telescopes. The 0.019 milliradian RMS radius of the upper left spot diagram of FIG. 52 corresponds to a spatial resolution of 1.043 arcminutes along the optical axis of telescope 410. The 0.092 milliradian RMS radius of the lower right spot diagram of FIG. 52 corresponds to a spatial resolution of 5.049 arcminutes at the edge of the exit pupil of telescope 410. The corresponding values for telescope 400 are 3.898 arcminutes along the optical axis and 19.318 arcminutes at the edge of the exit pupil.

Figure 47:
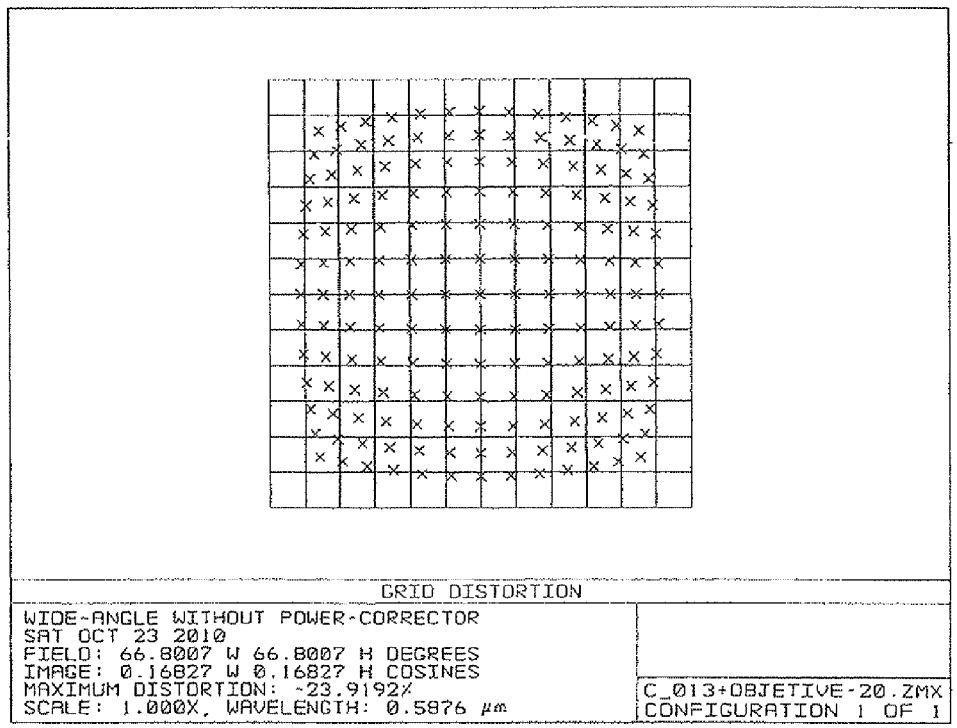
Figure 53:
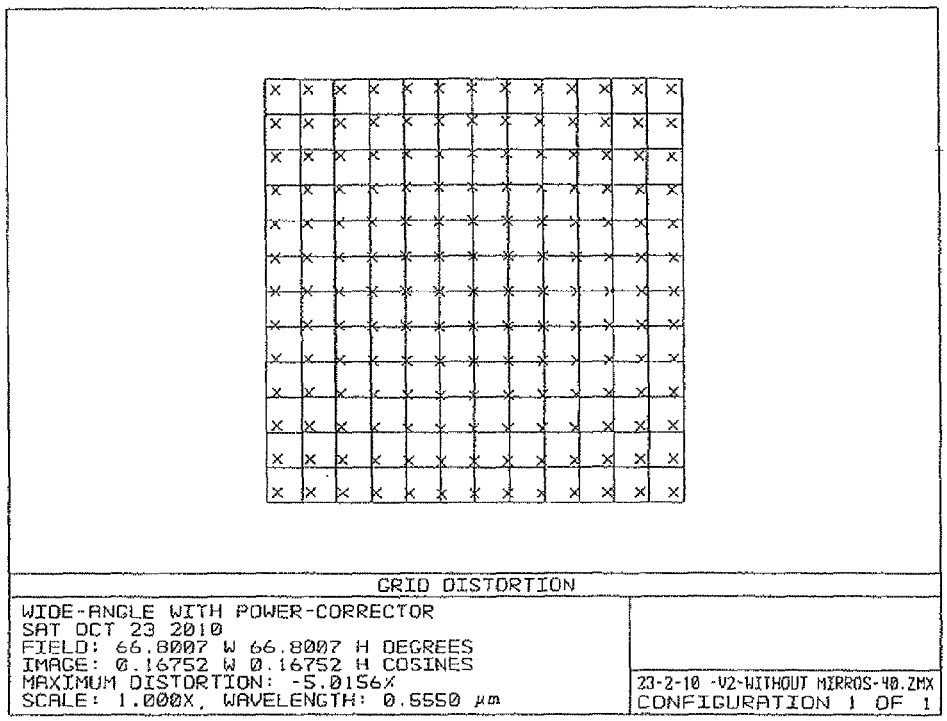

FIG. 47 is a grid distortion diagram for telescope 400. FIG. 53 is a grid distortion diagram for telescope 410.

Figure 48:
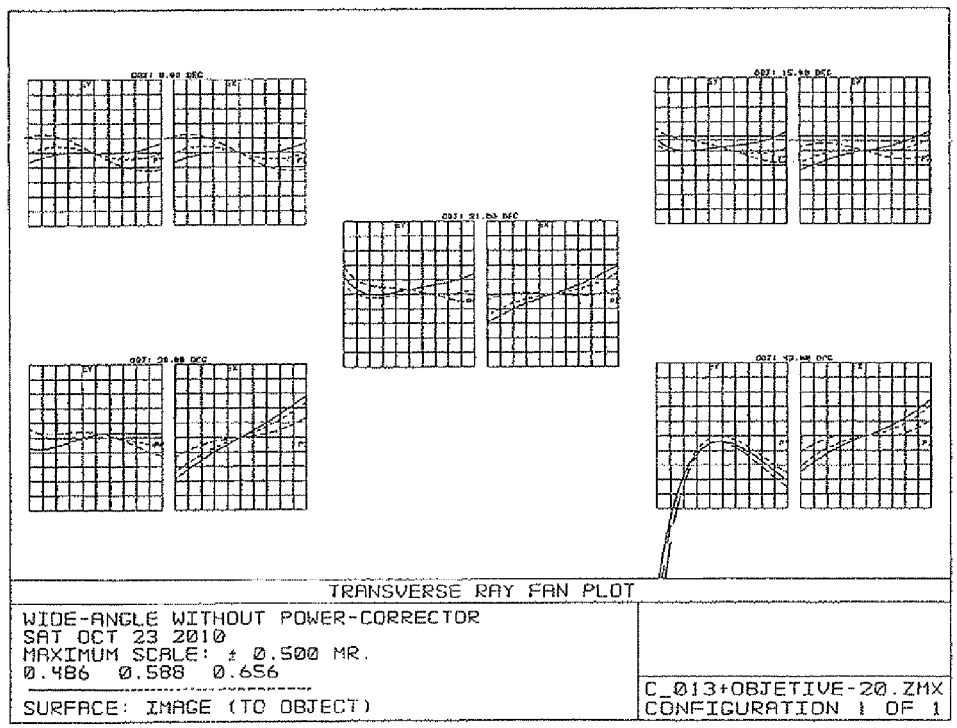
Figure 54:
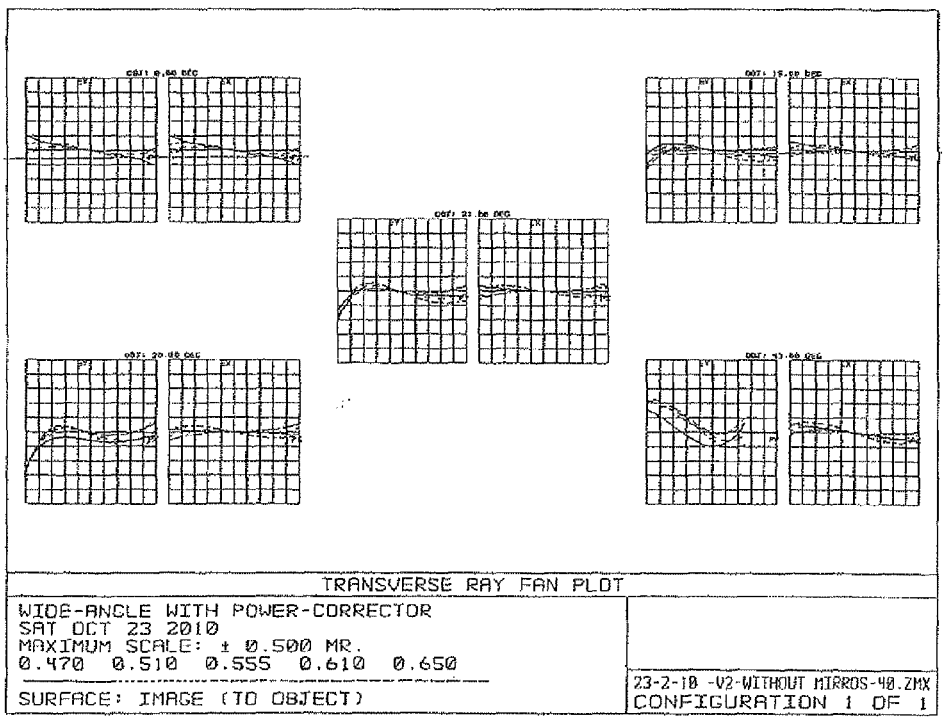

FIG. 48 shows transverse ray fan plots for telescope 400. FIG. 54 shows transverse ray fan plots for telescope 410. Comparison of the two Figures shows that telescope 410 has significantly lower spherical aberration, coma, astigmatic aberration and chromatic aberration than telescope 400.

FIGS. 55-60 show that, as recited in the first appended claim, eyepiece 416 and power corrector 414 have a combined aberration that is less than the characteristic aberration of eyepiece 416, Here the "characteristic aberration" of an eyepiece means the aberration of a prior art telescope that includes the eyepiece to be characterized and an objective that has the same focal length as the combined focal length of the power corrector and the objective of the telescope whose eyepiece is to be characterized (in this case, the combined focal length of power corrector 414 and objective 412, 152 mm) and that gives the prior art telescope the same apparent field of view and the same magnification as the telescope whose eyepiece is to be characterized. Similarly, the "combined aberration" of the eyepiece and the power corrector is the aberration of the telescope, that includes a power corrector, whose eyepiece is to be characterized. FIGS. 55-60 illustrate just such a prior art telescope 420 that characterizes eyepiece 416.

Table 6 compares the optical properties of telescopes 410 and 420 that are relevant to the characterization of eyepiece 416.

TABLE 6

| Parameter | Telescope 410 | Telescope 420 |
|---|---|---|
| Eyepiece focal length (mm) | 19 | 19 |
| Power corrector focal length (mm) | 194.4 | |
| Objective focal length (mm) | 310 | 152 |
| Input focal length (mm) | 152 | 152 |
| Objective diameter (mm) | 44 | 44 |
| Apparent field of view (degrees) | 86 | 86 |
| Magnification | 8x | 8x |

FIG. 55 is an unfolded ray tracing diagram that shows the placement of objective lens group 422 and eyepiece lens group 416 within telescope 420. As in FIGS. 43 and 49, the ray trace direction is from left to right.

FIG. 56 is a table of optical properties of the lenses of telescope 420. Note that for characterizing purposes the lenses of objective lens group 422 have the same diameter as the lenses of objective lens group 412.

Figure 57:
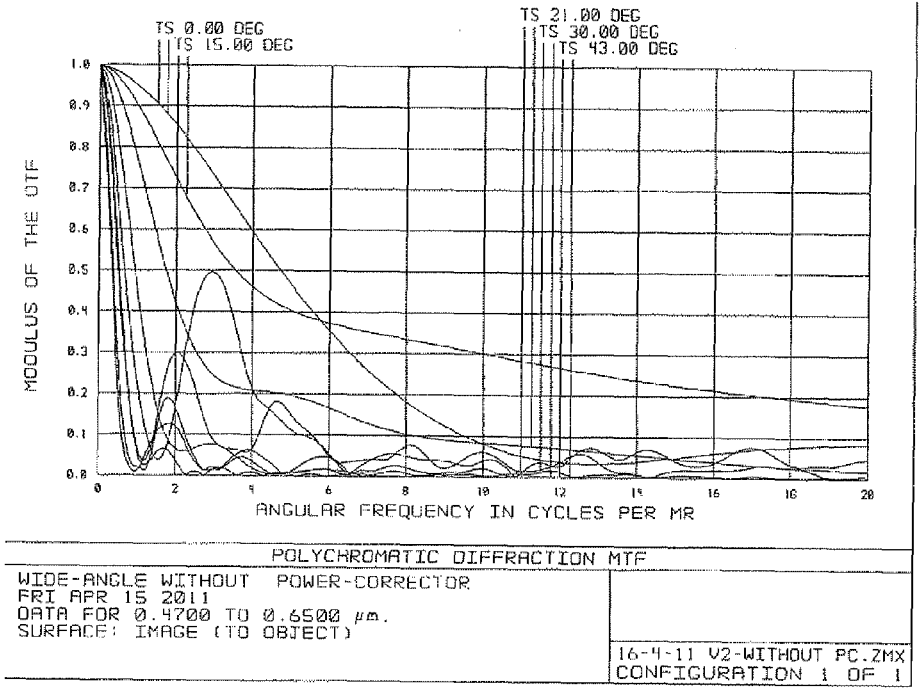
Figure 58:
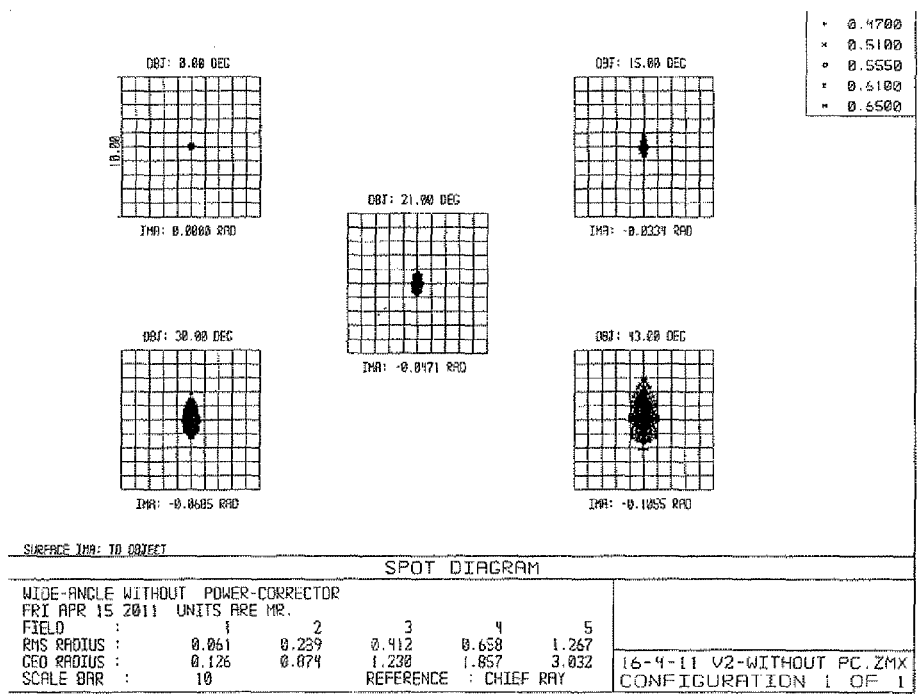
Figure 59:
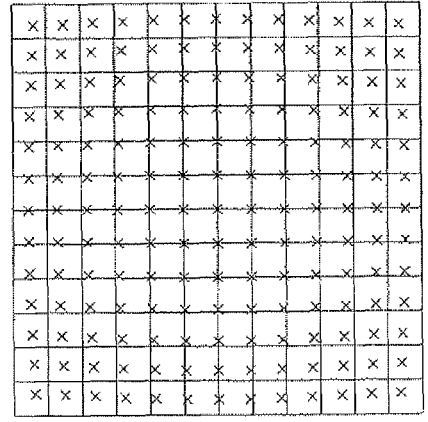
Figure 60:
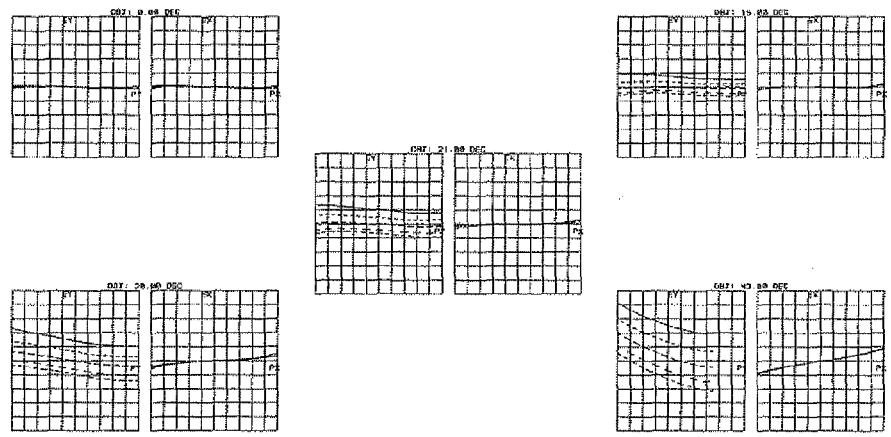

FIG. 57 shows modular transfer functions of telescope 420. FIG. 58 shows spot diagrams for telescope 420. FIG. 59 is a grid distortion diagram for telescope 420. This grid distortion is the characteristic distortion of the eyepiece. FIG. 60 shows transverse ray plots for telescope 420. A comparison of FIGS. 51-54 with FIGS. 57-60 shows that the combined aberration of eyepiece 416 and power corrector 414 is significantly lower than the characteristic aberration of eyepiece 416. In particular, the 0.061 milliradian RMS radius of the upper left spot diagram of FIG. 58 corresponds to a spatial resolution of 3.349 arcminutes along the optical axis of telescope 420, the 1.267 milliradian RMS radius of the lower right spot diagram of FIG. 58 corresponds to a spatial resolution of 1731.5 arcminutes (29 degrees!) at the edge of the exit pupil of telescope 420, and the grid distortion shown in FIG. 59 is clearly greater than the grid distortion (maximum absolute value 5.0156%) shown in FIG. 53. A comparison of FIGS. 54 and 60 shows that telescope 410 has significantly lower spherical aberration, coma, astigmatic aberration and chromatic aberration than telescope 420.

Similarly, in the other telescopes presented herein that include both an eyepiece and a power corrector, the combined aberration of the power corrector and the eyepiece is lower than the characteristic aberration of the eyepiece alone.

Figure 63:
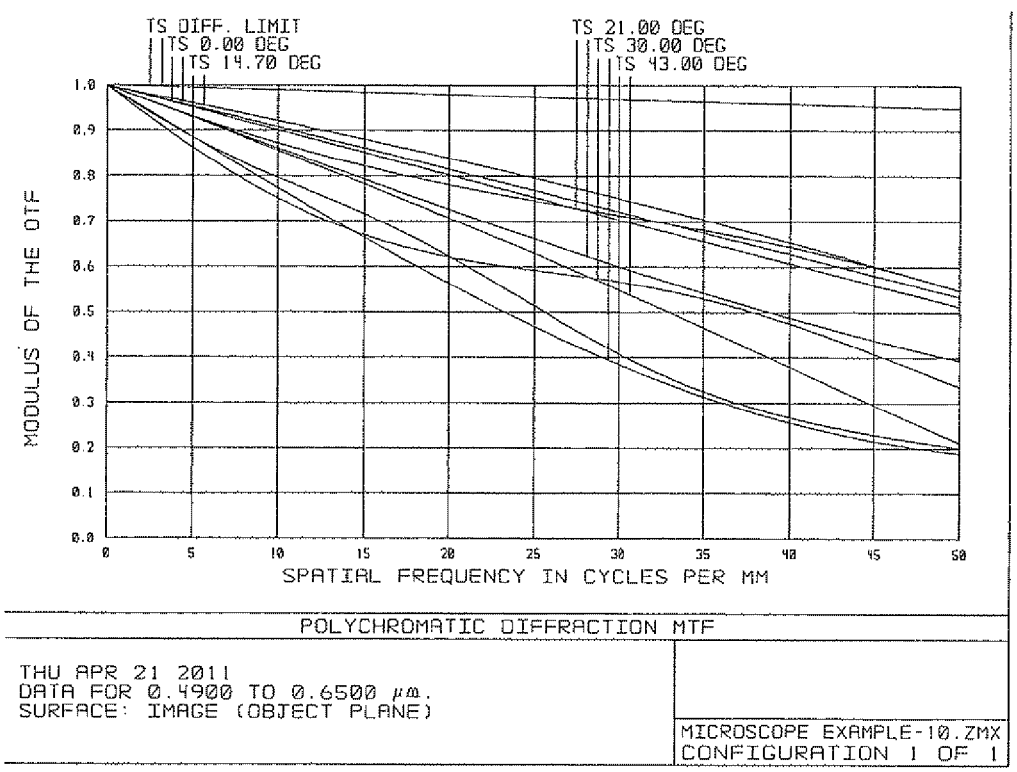

FIGS. 61-63 present a microscope 500 of the present invention. FIG. 61 is a ray tracing diagram that shows the placement of objective lens group 502, power corrector 504 and eyepiece 506 within microscope 500. FIG. 62 is a table of optical properties of the lenses of microscope 500. FIG. 63 shows modular transfer functions of microscope 500.

The following table lists some of the parameters of microscope 500.

TABLE 7

| Parameter | Value |
| --- | --- |
| Exit pupil diameter | 4.2 mm |
| Apparent field of view | 86 degrees |
| Eyepiece focal length | 19.1 mm |
| Power corrector focal length | 67.1 mm |
| Objective focal length | 19.4 mm |
| Input focal length | 135.8 mm |
| Separation between power corrector and objective | 76.914 mm |
| Separation between power corrector and eyepiece | 26.5 mm |
| Intermediate image diameter | 34.5 mm |
| Total magnification | 45.3 |

The total magnification in Table 7 is obtained as follows:

Eyepiece magnification=250 mm÷19 mm=13.1 (250 mm is the conventionally accepted value of the "near point" distance of the human eye, i.e., the closest distance at which the human eye can focus.)

Combined objective and eyepiece magnification=67.1 mm÷19.4 mm=3.46

Total magnification=13.1×3.46=45.3

Typical intermediate image diameters of comparable prior art microscopes are between 21 mm and 25 mm. 26.5 mm is considered a very large intermediate image diameter according to the prior art.

Only the basic optical components of a microscope of the present invention are illustrated in FIG. 61. The microscope may also include other components such as optical filters, polarizers and beamsplitters. The beamsplitters may be placed in the optical path between the objective and the eyepiece and/or between lenses of the power corrector It is to be understood that the phraseology and terminology employed herein is for the purpose of description and should not be regarded as limiting. For instance, the phrase "group of lenses" should be understood to mean a group of different optical elements such as regular lenses, GRIN lenses, diffractive optical elements etc. The surfaces of the optical elements can be refractive, diffractive, reflective, spherical or aspherical. The optical elements consist of different materials such as different glasses or plastics with different refractive indices which can be variable along the optical axis or radially. The pupils of the described optical systems can be independent or part of another optical system. Apart from the optical elements that are described above other optical elements such as prisms, mirrors, lenses and reticles can be added to embodiments of the present invention.

Embodiments of the present invention can also be used in the reverse mode in which optical beams with very large field of view can be converted into optical beams with very narrow field of view.

Though the embodiments described above comprise afocal systems, other embodiments can be also designed in other structures such as finite\Infinite conjugate, Infinite\finite conjugate, finite\finite conjugate etc.

There are numerous applications for which embodiments of the present invention enable realizing optical systems with very large field of view such as telescopes, microscopes, beam expanders, beam reducers etc.

The optical systems of FIGS. 14-17, 19, 20, 23, 27, 31, 32, 37, 40 and 49 were designed by selecting, in advance, the numbers of lenses to be included in each of the objective, the eyepiece and the power corrector, by defining in advance the respective focal lengths of the objective, the eyepiece and the power corrector, by defining the system requirements of the optical systems, by selecting the separation between the objective and the power corrector and the separation between the power corrector and the eyepiece to provide the desired magnification and by then using a standard optical system design software package such as ZEMAX™ (which is available from Radiant ZEMAX, LLC of Bellevue Wash. USA) to optimize the values of the free parameters of the lenses. If the optimization fails to provide values of the free parameters that satisfy the system requirements, one or more lenses are added to the objective and/or the power corrector and/or the eyepiece and the optimization is repeated. In general, system requirements include one or more of magnification, apparent field of view, real field of view, entrance and exit pupil diameter and location, aperture stop diameter and location, eye relief, spectral range, resolution, maximum allowed monochromatic aberration (piston, tilt, defocus, spherical aberration, coma and/or astigmatism, field curvature, distortion), maximum allowed chromatic aberration (axial chromatic aberration and/or lateral chromatic aberration), close focus distance, maximum allowed system optical path length, maximum allowed system volume and maximum allowed system weight. Note that these system requirements are not all mutually independent. For example, the magnification, the apparent field of view and the real field of view are coupled; the resolution, the exit pupil diameter and location, the eye relief and the aperture stop diameter and location are coupled; the entrance pupil location and diameter, the exit pupil location and diameter and some forms of monochromatic aberration such as coma are coupled; and the resolution and the monochromatic aberration are coupled.

In the case of the optical systems of FIGS. 14-17 and 19, the system requirements were magnification, apparent field of view, exit pupil diameter, eye relief, resolution, maximum system optical path length and maximum system weight. (As discussed above, the diameter and location of the aperture stop is coupled to the exit pupil diameter and to the eye relief; the optical systems of FIGS. 14-17 and 19 are afocal so that the close focus distance is infinite.) The free parameters whose values were optimized were the diameters of the lenses, the thicknesses of the lenses, the separations of the lenses within each group of lenses, the radii of curvature of the front and back lens surfaces and the indices of refraction of the lenses. Note that all the parameters were optimized jointly, so that, for example, the lenses of the objective, the eyepiece and the power corrector all cooperate to correct the respective aberrations of the objective, the eyepiece and the power corrector. Such joint optimization enables the achieving of the increased real fields of view as listed in FIG. 15a while meeting system requirements, such as resolution, that determine the spherical aberration of the system.

The allowed values of index of refraction in the optimizations of the optical systems of FIGS. 14-17 and 19 did not vary continuously but instead were discrete values selected from a table of optical glasses. The Abbe numbers in Tables 1 and 2 are the Abbe numbers of the corresponding glasses. In the optimizations of the optical systems of FIGS. 14-17 and 19, the Abbe numbers of the lenses were not among the free parameters. If maximum chromatic aberration had been one of the system requirements then the Abbe numbers of the lenses would have been one of the free parameters whose values were optimized.

The focal lengths that were defined in advance for the objectives, the eyepieces and the power correctors of the optical systems of FIGS. 14-17 and 19 are as in the following table. (The focal length listed for the "objective" of FIG. 19 actually is for relay 140.)

TABLE 8

| Separation between power corrector and eyepiece (mm) | Separation between objective and power corrector (mm) | Combined objective and power corrector focal length (mm) | Power corrector focal length (mm) | Eyepiece focal length (mm) | Objective focal length (mm) | FIG. # |
|---|---|---|---|---|---|---|
| 44 | 143.6 | 133 | 126 | 19 | 334 | 14 |
| 13.3 | 80.9 | 152 | 226 | 19 | 298 | 15 |
| 13.3 | 80.9 | 152 | 226 | 19 | 298 | 16 |
| 49 | 332.3 | 133 | 88 | 19 | 722 | 17 |
| 9 | 18.8 | 45 | 70 | 19 | 92 | 19 |

The "separation" in table 8 and in the formula below is measured between the rear principle plane of the power corrector and the front principle plane of the objective. The combined objective and power corrector focal length, which is the input focal length of the optical system, was computed using the following relationship:

$$\frac{1}{F} = \frac{1}{F_o} + \frac{1}{F_{pc}} - \frac{S}{F_o F_{pc}}$$

where $F_c$ is the focal length of the objective, $F_{pc}$ is the focal length of the power corrector, S is the separation between the objective and the power corrector and F is the combined focal length. The system requirements for FIGS. 14-17 included the magnification and the apparent field of view as listed in the following table:

TABLE 9

| Real field of view | Apparent field of view | Magnification | FIG. # |
|---|---|---|---|
| 17.1° | 93° | 7 | 14 |
| 13.3° | 86° | 8 | 15 |
| 13.3° | 86° | 8 | 16 |
| 17.1° | 93° | 7 | 17 |

The real field of view is a function of the magnification and the apparent field of view, as follows:

$$\tan \omega' = \Gamma \tan \omega$$

where ω is twice the real field of view, ω' is twice the apparent field of view and Γ is the magnification.

In FIGS. 14-17 and 19 the power corrector has a positive focal length. In a telephoto configuration similar to that of FIGS. 4 and 5 the power corrector would have a negative focal length.

The method described above for designing optical systems enables the design of visual optical system (i.e., optical system intended for use by human observers rather than for focusing light on e.g. photographic film or on electronic sensors) that have optical properties superior to those of conventional visual optical systems. For example, in order to achieve an apparent field of view greater than 85 degrees, the prior art eyepieces of FIGS. 1 and 2 must include lenses with diameters larger than 50 millimeters, which is an inconveniently large size for hand-held visual optical systems such as binoculars. The method described above allows the diameters of the lenses of the eyepiece (or, more generally, the dimensions of the optical components of the eyepiece that are transverse to the optical path of the optical system) to be no greater than 50 millimeters while the exit pupil diameter is as great as 4, 8, 12 or even 16 millimeters, the apparent field of view is as great as 90, 95, 100, 105, 110, 115 or even 120 degrees and the eyepiece focal length is as great as 18, 24, 30, 30, 36 or even 42 millimeters.

While the invention has been described with respect to a limited number of embodiments, it will be appreciated that many variations, modifications and other applications of the invention may be made. Therefore, the claimed invention as recited in the claims that follow is not limited to the embodiments described herein.

What is claimed is:

1. An optical device, having an optical axis and comprising:
   an objective having a first focal length, which is positive, and comprising a first group of one or more first lenses;
   an eyepiece having a second focal length, which is positive, and comprising a second group of one or more second lenses having a characteristic aberration;
   a power corrector having a third focal length and comprising a third group of one or more third lenses located on the optical axis between the objective and the eyepiece;
   the optical device having an input focal length defined jointly by the first and third focal lengths;
   the optical device having a magnification equal to a ratio of said input focal length to said second focal length;
   the eyepiece and the power corrector together having a combined aberration less than the characteristic aberration of the eyepiece; and
   the eye relief being at least 12 mm.

2. The optical device according to claim 1, wherein the combined aberration comprises a combined distortion that is no greater than 5.1% over an entire field of view of the optical device and is less than a characteristic distortion of the eyepiece.

3. The optical device according to claim 1, wherein the combined aberration yields a spatial resolution at an exit pupil of the optical device that is finer than 2 arcmin on the optical axis and finer than 6 arcmin at an edge of the exit pupil.

4. The optical device according to claim 1, wherein the power corrector has a positive optical power.

5. The optical device according to claim 4, wherein the objective and the eyepiece have respective positive optical powers.

6. The optical device according to claim 5, wherein the third focal length is less than the second focal length.

7. An optical device having an optical axis and comprising
   an objective having a first focal length, which is positive, and comprising a first group of one or more first lenses;
   an eyepiece having a second focal length, which is positive, and comprising a second group of one or more second lenses having a characteristic aberration; a power corrector having a third focal length and comprising a third group of one or more third lenses located on the optical axis between the objective and the eyepiece;
   the optical device having an input focal length defined jointly by the first and third focal lengths;
   the optical device having a magnification equal to a ratio of said input focal length to said second focal length;
   the eyepiece and the power corrector together having a combined aberration less than the characteristic aberration of the eyepiece; and
   the power corrector has a negative optical power.

8. The optical device according to claim 1, and comprising an image erector, which comprises at least first and second reflective surfaces, wherein the power corrector comprises at least one lens that is located on the optical axis between the first and second reflective surfaces.

9. The optical device according to claim 8, wherein the first and second reflective surfaces comprise mirrors.

10. The optical device according to claim 1, and comprising an aperture stop located between the objective and the eyepiece.

11. The optical device according to claim 1, wherein the first lenses are arranged in a telephoto structure.

12. The optical device according to claim 1, wherein at least one of a set of lenses consisting of the first lenses, the second lenses and the third lenses is movable so as to zoom the magnification of the optical device.

13. The optical device according to claim 12, wherein the magnification is zoomed by varying a spacing between the third lenses in the power corrector.

14. The optical device according to claim 1, wherein the objective, eyepiece and power corrector together define an apparent field of view of at least 75°.

15. The optical device according to claim 14, wherein the objective, eyepiece and power corrector together define an exit pupil of a given pupil diameter, wherein the second lenses all have respective lens diameters that are no greater than twelve times the pupil diameter, wherein the eyepiece has an eye relief defined by a location of the exit pupil, and wherein the respective lens diameters of the second lenses are all no greater than four times the eye relief.

16. The optical device according to claim 14, wherein the second lenses all have respective lens diameters that are no greater than three times the second focal length.

17. The optical device according to claim 1 wherein an exit pupil diameter is greater than about 4 millimeters and an apparent field of view is greater than about 85 degrees, wherein no optical component of said eyepiece has a dimension transverse to an optical path of the optical system that is greater than about 50 millimeters.

18. The optical device according to claim 14, wherein the apparent field of view of the optical device is at least 85°.

19. An optical device according to claim 1, wherein each one of said objective, eyepiece and power corrector has a respective pre-defined focal length.

20. The optical device according to claims 15 wherein an exit pupil diameter greater than about 4 millimeters, wherein no optical component of said eyepiece has a dimension transverse to an optical path of the optical system that is greater than about 50 millimeters.

21. The optical device according to claims 18 wherein an exit pupil diameter is greater than about 4 millimeters, wherein no optical component of said eyepiece has a dimension transverse to an optical path of the optical system that is greater than about 50 millimeters.

22. A microscope having optical axis and comprising:
an objective having a first focal length, which is positive, and comprising a first group of one or more first lenses;
an eyepiece having a second focal length, which is positive, and comprising a second group of one or more second lenses having a characteristic aberration a rower corrector having a third focal length and comprising a third group of one or more third lenses located on the optical axis between the objective and the eyepiece;
the microscope having an input focal length defined jointly by the first and third focal lengths;
the microscope having magnification equal to a ratio of said input focal length to said second focal length; and
the eyepiece and the power corrector together having a combined aberration less than the characteristic aberration of the eyepiece.

* * * * *